United States Patent
Takemoto et al.

(10) Patent No.: US 8,110,336 B2
(45) Date of Patent: Feb. 7, 2012

(54) RESIN AND CHEMICALLY AMPLIFIED RESIST COMPOSITION COMPRISING THE SAME

(75) Inventors: Ichiki Takemoto, Kawanishi (JP); Nobuo Ando, Toyonaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 327 days.

(21) Appl. No.: 12/562,943

(22) Filed: Sep. 18, 2009

(65) Prior Publication Data

US 2010/0075257 A1 Mar. 25, 2010

(30) Foreign Application Priority Data

Sep. 24, 2008 (JP) ................... 2008-243840

(51) Int. Cl.
- G03F 7/039 (2006.01)
- G03F 7/20 (2006.01)
- G03F 7/30 (2006.01)
- G03F 7/38 (2006.01)
- C08F 12/30 (2006.01)

(52) U.S. Cl. ............ 430/270.1; 430/907; 430/914; 430/326; 430/327; 430/330; 526/287; 526/243; 526/248; 526/288; 526/313

(58) Field of Classification Search .............. None
See application file for complete search history.

(56) References Cited

U.S. PATENT DOCUMENTS

| | | | |
|---|---|---|---|
| 7,202,010 B2 | 4/2007 | Yamada et al. | 430/270.1 |
| 2003/0099900 A1 | 5/2003 | Yamada et al. | 430/270.1 |
| 2009/0269696 A1* | 10/2009 | Ohsawa et al. | 430/270.1 |

FOREIGN PATENT DOCUMENTS

| | | |
|---|---|---|
| JP | 2003-107708 | 4/2003 |
| JP | 2006-058739 | 2/2006 |

OTHER PUBLICATIONS

Brainard, Robert L., et al., 2004, Shot Noise, LER and Quantum Efficiency of EUV Photoresists, SPIE, vol. 5374, 74-85.

* cited by examiner

*Primary Examiner* — Sin J. Lee
(74) *Attorney, Agent, or Firm* — Hogan Lovells US LLP

(57) ABSTRACT

A resin comprising a structural unit represented by the formula (I):

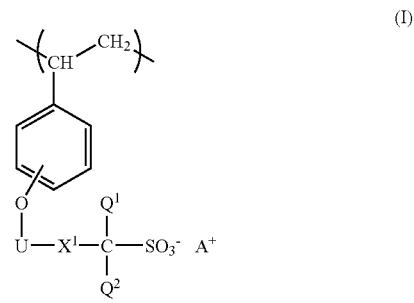

wherein $Q^1$ and $Q^2$ represent a fluorine atom etc., U represents a C1-C20 divalent hydrocarbon group in which one or more —$CH_2$— may be replaced by —O— etc., $X^1$ represents —O—CO— etc., and $A^+$ represents an organic counter ion.

14 Claims, No Drawings

RESIN AND CHEMICALLY AMPLIFIED RESIST COMPOSITION COMPRISING THE SAME

This nonprovisional application claims priority under 35 U.S.C. §119(a) on Patent Application No. 2008-243840 filed in JAPAN on Sep. 24, 2008, the entire contents of which are hereby incorporated by reference.

FIELD OF THE INVENTION

The present invention relates to a resin and a chemically amplified resist composition comprising the same.

BACKGROUND OF THE INVENTION

A chemically amplified resist composition used for semiconductor microfabrication employing a lithography process.

As future light sources, extreme ultraviolet light source (EUV) having a wave length of about 13 nm and X-ray have been proposed, and electron beam lithography is also expected as future lithography because it does not need an expensive resist mask.

In semiconductor microfabrication, especially using EUV lithography and electron beam lithography, it is also desirable to form patterns having high resolution and good pattern profile, and it is expected for a chemically amplified resist composition to give such patterns suitable for EUV lithography and electron beam lithography.

SUMMARY OF THE INVENTION

The present invention is to provide a novel resin and a chemically amplified resist composition comprising the same.

The present invention relates to the followings:

<1> A resin comprising a structural unit represented by the formula (I):

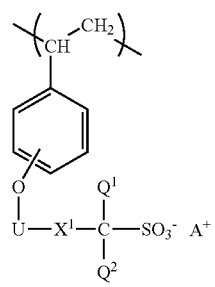

wherein $Q^1$ and $Q^2$ each independently represent a fluorine atom or a C1-C6 perfluoroalkyl group, U represents a C1-C20 divalent hydrocarbon group in which one or more —CH$_2$— may be replaced by —O—, —NH—, —S—, —NR$^c$—, —CO— or —CO—O—, R$^c$ represents a C1-C6 alkyl group, X$^1$ represents —O—CO—, —CO—O—, —CO—OCH$_2$—, —CH$_2$—O—CO—, —O—CH$_2$—, —CH$_2$—O—, —NR$^d$—CO— or —CO—NR$^d$—, R$^d$ represents a hydrogen atom or a C1-C6 alkyl group, and A' represents an organic counter ion;

<2> The resin according to <1>, wherein the structural unit represented by the formula (I) is a structural unit represented by the formula (I'):

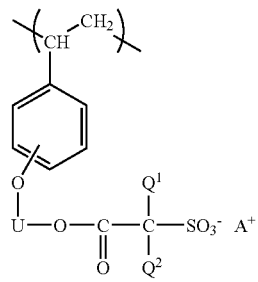

wherein $Q^1$, $Q^2$, U and A$^+$ are the same meanings as defined above;

<3> The resin according to <1> or <2>, wherein $Q^1$ and $Q^2$ are fluorine atoms;

<4> The resin according to any one of <1> to <3>, wherein A$^+$ is a cation represented by the formula (IIIa):

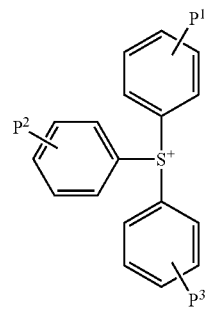

wherein $P^1$, $P^2$ and $P^2$ each independently represent a hydrogen atom, a halogen atom, a hydroxyl group, a cyano group, a C1-C12 alkyl group or a C1-C12 alkoxy group, a cation represented by the formula (IIIb):

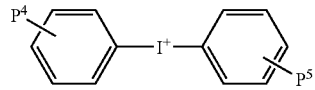

wherein $P^4$ and $P^5$ each independently represent a hydrogen atom, a halogen atom, a hydroxyl group, a cyano group, a C1-C12 alkyl group or a C1-C12 alkoxy group, or a cation represented by the formula (IIIc):

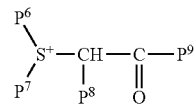

wherein $P^6$ and $P^7$ each independently represent a C1-C12 alkyl group or a C3-C12 cycloalkyl group, or $P^6$ and $P^7$ are bonded to form a C3-C12 divalent acyclic hydrocarbon group which forms a ring together with the adjacent S$^+$, $P^8$ represents a hydrogen atom, $P^9$ represents a C1-C12 alkyl group, a C3-C12 cycloalkyl group or a C6-C10 aromatic group which may have one or more substituents, or $P^8$ and $P^9$ are bonded to form a C3-C12 divalent acyclic hydrocarbon group which forms a 2-oxocycloalkyl group together with the adjacent —CHCO—, and one or more —CH$_2$— in the C3-C12 divalent acyclic hydrocarbon group may be replaced by —CO—, —O— or —S—;

<5> The resin according to any one of <1> to <4>, wherein the resin contains a structural unit represented by the formula (II):

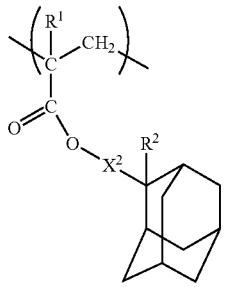

(II)

wherein $R^1$ represents a hydrogen atom or a methyl group, $R^2$ represents a C1-C6 alkyl group, $X^2$ represents a single bond or $—(CH_2)_k—CO—O—$, and k represents an integer of 1 to 6, in addition to the structural unit represented by the formula (I);

<6> The resin according to <5>, wherein the structural unit represented by the formula (II) is a structural unit represented by the formula (II'):

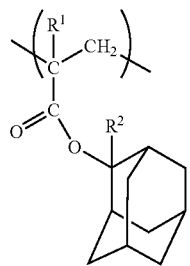

(II')

wherein $R^1$ and $R^2$ are the same meanings as defined above;

<7> The resin according to any one of <1> to <6>, wherein the resin contains a structural unit represented by the formula (VI):

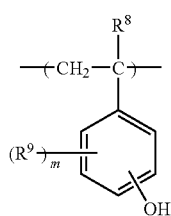

(VI)

wherein $R^8$ represents a hydrogen atom or a C1-C6 alkyl group which may have one or more halogen atoms, $R^9$ is independently in each occurrence a halogen atom, a hydroxyl group, a cyano group, a C1-C12 alkyl group, a C1-C12 hydroxyl-substituted alkyl group, a C1-C12 alkoxy group, a C6-C12 aryl group, a C7-C12 aralkyl group, a glycidyloxy group, a C2-C4 acyl group, a C2-C4 acyloxy group, an acryloyloxy group or a methacryloyloxy group, m represents an integer of 0 to 4, in addition to the structural unit represented by the formula (I);

<8> The resin according to any one of <1> to <7>, wherein the resin contains a structural unit represented by the formula (VII):

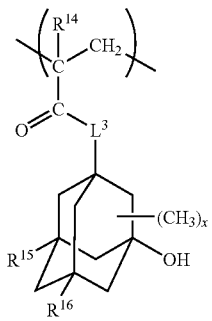

(VII)

wherein $R^{14}$ represents a hydrogen atom or a methyl group, $R^{15}$ and $R^{16}$ each independently represents a hydrogen atom, a methyl group or a hydroxyl group, $L^3$ represents $—O—$ or $—O—(CH_2)_y—CO—O—$, y represents an integer of 1 to 6, and x represents an integer of 0 to 10, in addition to the structural unit represented by the formula (I);

<9> The resin according to any one of <1> to <8>, wherein the resin contains a structural unit represented by the formula (VIII-1), (VIII-2) or (VIII-3):

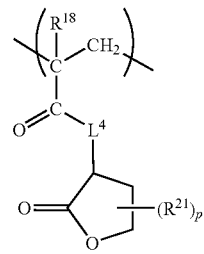

(VIII-1)

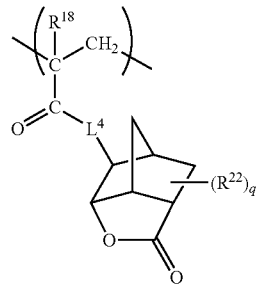

(VIII-2)

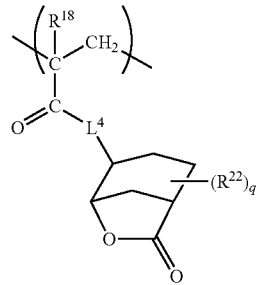

(VIII-3)

wherein $R^{18}$ represents a hydrogen atom or a methyl group, $R^{21}$ is independently in each occurrence a C1-C4 aliphatic hydrocarbon group, $L^4$ represents $—O—$ or $—O—(CH_2)_z—CO—O—$, z represents an integer of 1 to 6, $R^{22}$ is independently in each occurrence a carboxyl group, a cyano group, or a C1-C4 aliphatic hydrocarbon group, p represents an integer of 0 to 5, and q represents an integer of 0 to 3, in addition to the structural unit represented by the formula (I);

<10> A chemically amplified resist composition comprising the resin according to any one of <1> to <9> and a solvent;
<11> The chemically amplified resist composition according to <10>, wherein the composition further contains an acid generator;
<12> The chemically amplified resist composition according to <10> or <11>, wherein the composition further contains a the resin comprising a structural unit having an acid-labile group and being insoluble or poorly soluble in an aqueous alkali solution but becoming soluble in an aqueous alkali solution by the action of an acid;
<13> A process for producing a resin comprising a structural unit represented by the formula (I):

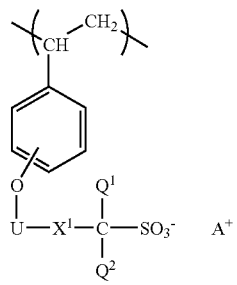

(I)

wherein $Q^1$ and $Q^2$ each independently represent a fluorine atom or a C1-C6 perfluoroalkyl group, U represents a C1-C20 divalent hydrocarbon group in which one or more —$CH_2$— may be replaced by —O—, —NH—, —S—, —$NR^c$—, —CO— or —CO—O—, $R^c$ represents a C1-C6 alkyl group, $X^1$ represents —O—CO—, —CO—O—, —CO—$OCH_2$—, —O—$CH_2$— or —$NR^d$—CO—, $R^d$ represents a hydrogen atom or a C1-C6 alkyl group, and $A^+$ represents an organic counter ion, which comprises reacting a the resin comprising a structural unit represented by the formula (IV):

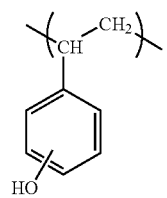

(IV)

with a salt represented by the formula (V):

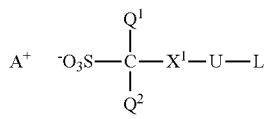

(V)

wherein $Q^1$, $Q^2$, $X^1$, U and $A^+$ are the same meanings as defined above, and L represents a halogen atom, a C1-C12 alkylsulfonyloxy group, a C6-C12 arylsulfonyloxy group or a C5-C12 heteroarylsulfonyloxy group;
<14> A process for producing a resist pattern comprising the following steps (1) to (5):
Step (1): a step of coating a chemically amplified resist composition according to any one of <10> to <12> on the substrate to obtain a resist film,
Step (2): a step of prebaking the resist film,
Step (3): a step of exposing the prebaked resist film,
Step (4): a step of conducting a post-exposure baking of the exposed resist film,
Step (5): a step of developing the resist film with an aqueous solution to obtain a resist pattern.

DESCRIPTION OF PREFERRED EMBODIMENTS

The present resin comprises a structural unit represented by the formula (I):

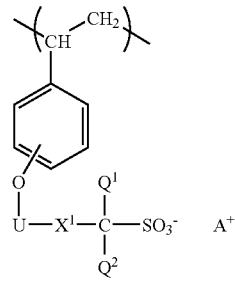

(I)

(hereinafter, simply referred to as the resin (I)).
In the formula (I), $A^+$ represents an organic counter ion.
Examples of the organic counter cation include a cat ion represented by the formula (IIIa):

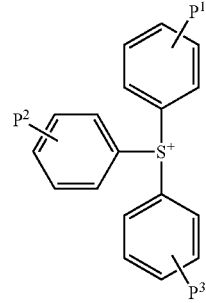

(IIIa)

wherein $P^1$, $P^2$ and $P^3$ each independently represent a hydrogen atom, a halogen atom, a hydroxyl group, a cyano group, a C1-C12 alkyl group or a C1-C12 alkoxy group (hereinafter, simply referred to as the cation (IIIa)),
a cation represented by the formula (IIIb):

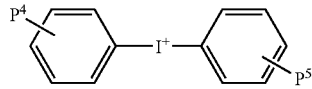

(IIIb)

wherein $P^4$ and $P^5$ each independently represent a hydrogen atom, a halogen atom, a hydroxyl group, a cyano group, a C1-C12 alkyl group or a C1-C12 alkoxy group (hereinafter, simply referred to as the cation (IIIb)), and a cation represented by the formula (IIIc):

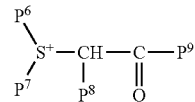

(IIIc)

wherein $P^6$ and $P^7$ each independently represent a C1-C12 alkyl group or a C3-C12 cycloalkyl group, or $P^6$ and $P^7$ are bonded to form a C3-C12 divalent acyclic hydrocarbon group which forms a ring together with the adjacent $S^+$, $P^8$ represents a hydrogen atom, $P^9$ represents a C1-C12 alkyl group, a C3-C12 cycloalkyl group or a C6-C10 aromatic group which may have one or more substituents, or $P^8$ and $P^9$ are bonded to form a C3-C12 divalent acyclic hydrocarbon group which forms a 2-oxocycloalkyl group together with the adjacent —CHCO—, and one or more —$CH_2$— in the C3-C12 divalent acyclic hydrocarbon group may be replaced by —CO—, —O— or —S— (hereinafter, simply referred to as the cation (IIIc)).

Examples of the halogen atom in the cations (IIIa) and (IIIb) include a fluorine atom, a chlorine atom, a bromine atom and an iodine atom.

Examples of the C1-C12 alkyl group in the cations (IIIa), (IIIb) and (IIIc) include a methyl group, an ethyl group, an n-propyl group, an isopropyl group, an n-butyl group, an isobutyl group, a sec-butyl group, a tert-butyl group, an n-pentyl group, an n-hexyl group, an n-octyl group, a 2-ethylhexyl group, a nonyl group, a decyl group, an undecyl group and a dodecyl group.

Examples of the C1-C12 alkoxy group in the cations (IIIc) and (IIIb) include a methoxy group, an ethoxy group, an n-propoxy group, an isopropoxy group, an n-butoxy group, an isobutoxy group, a sec-butoxy group, a tert-butoxy group, an n-pentyloxy group, an n-hexyloxy group, an n-octyloxy group, a 2-ethylhexyloxy group, a decyloxy group, an undecyloxy group and a dodecyloxy group.

Examples of the C3-C12 cycloalkyl group in the cation (IIIc) include a cyclopropyl group, a cyclobutyl group, a cyclopentyl group, a cyclohexyl group, a cycloheptyl group, a cyclooctyl group, a cyclodecyl group, a cycloundecyl group and a cyclododecyl group. Examples of the C3-C12 divalent acyclic hydrocarbon group formed by bonding $P^6$ and $P^7$ include a trimethylene group, a tetramethylene group and a pentamethylene group. Examples of the ring group formed together with the adjacent $S^+$ and the C3-C12 divalent acyclic hydrocarbon group include a tetramethylenesulfonio group, a pentamethylenesulfonio group and oxybisethylenesulfonio group.

Examples of the C6-C10 aromatic group in the cation (IIIc) include a phenyl group and a naphthyl group. The aromatic group may have one or more substituents, and examples of the substituents include a C1-C6 alkyl group such as a methyl group, an ethyl group, an n-propyl group, an isopropyl group, an n-butyl group, an isobutyl group, a sec-butyl group, a tert-butyl group, an n-pentyl group and an n-hexyl group; a C3-C6 cycloalkyl group such as a cyclopentyl group and a cyclohexyl group; a C1-C6 alkoxy group such as a methoxy group, an ethoxy group, an n-propoxy group, an n-butoxy group, a tert-butoxy group and an n-hexyloxy group; a C6-C10 aromatic group such as a phenyl group; a C2-C12 acyloxy group such as an acetyloxy group and a 1-adamantylcarbonyloxy group; a halogen atom such as a fluorine atom, a chlorine atom, a bromine atom and an iodine atom; and a nitro group.

Examples of the C3-C12 divalent acyclic hydrocarbon group formed by bonding $P^8$ and $P^9$ include a methylene group, an ethylene group, a trimethylene group, a tetramethylene group and a pentamethylene group and examples of the 2-oxocycloalkyl group formed together with the adjacent —CHCO— and the divalent acyclic hydrocarbon group include a 2-oxocyclopentyl group and a 2-oxocyclohexyl group.

Examples of the cation (IIIa) include the followings:

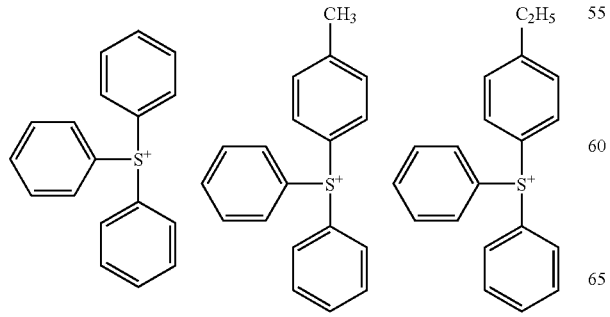

-continued

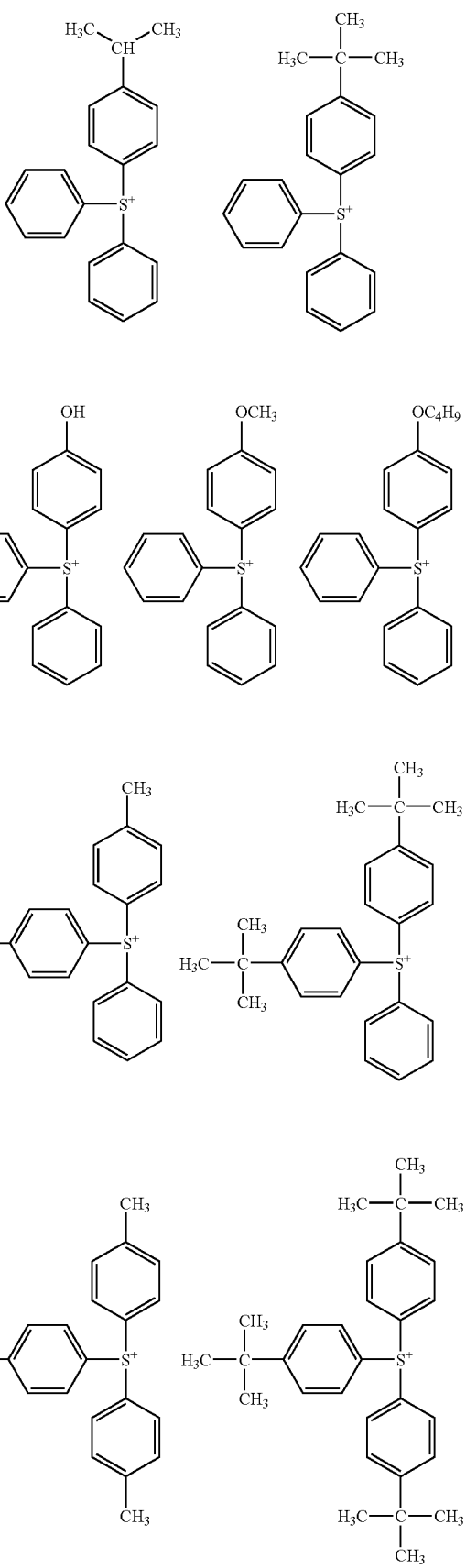

-continued
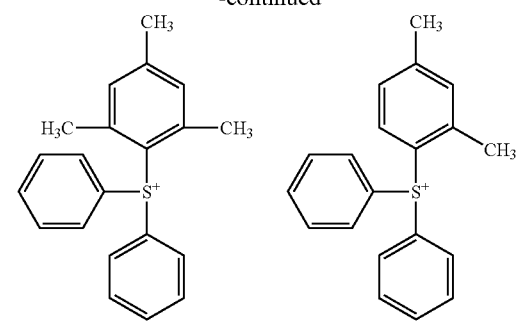
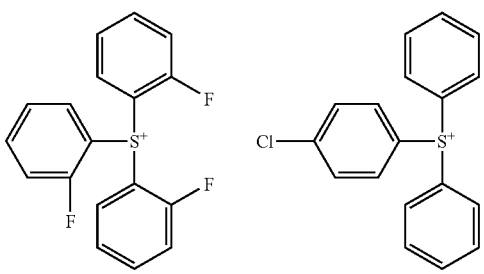
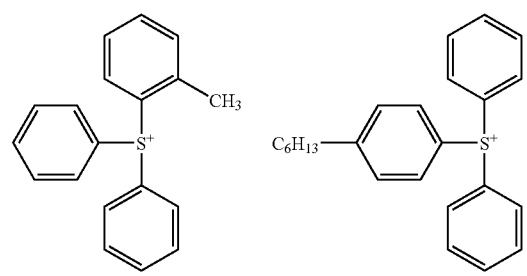
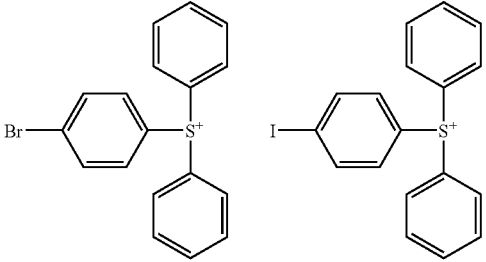
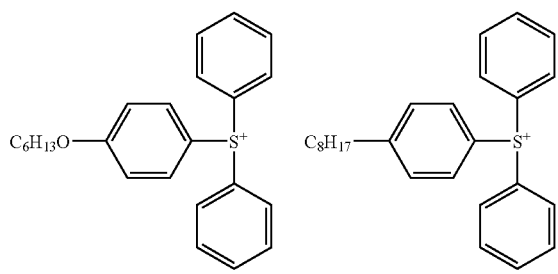
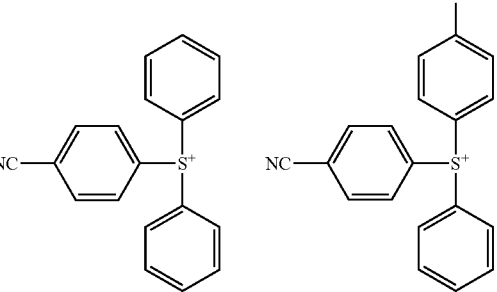
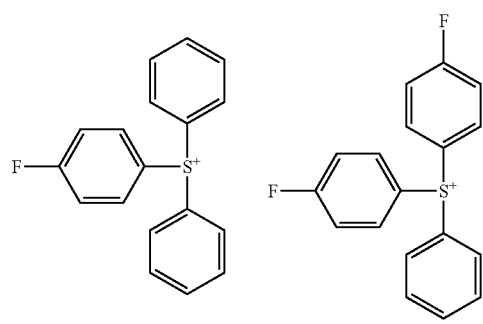
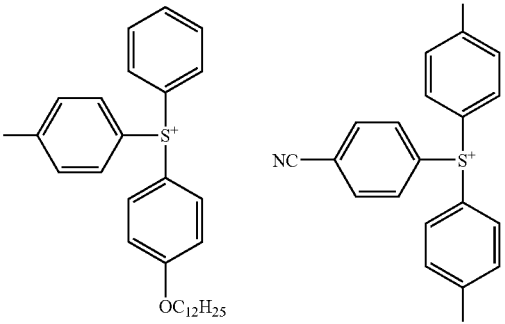
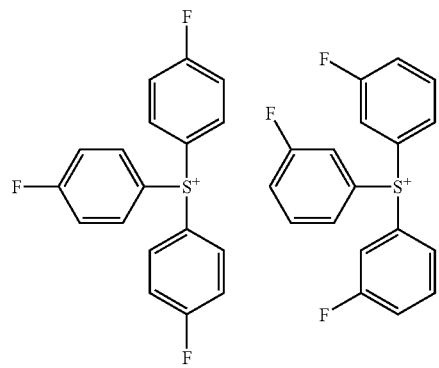
Specific examples of the cation (IIIb) include the following:
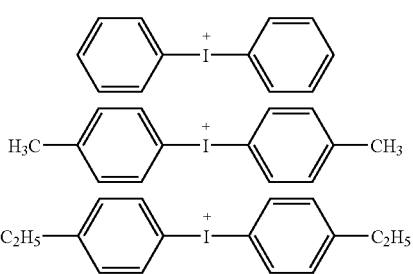

-continued
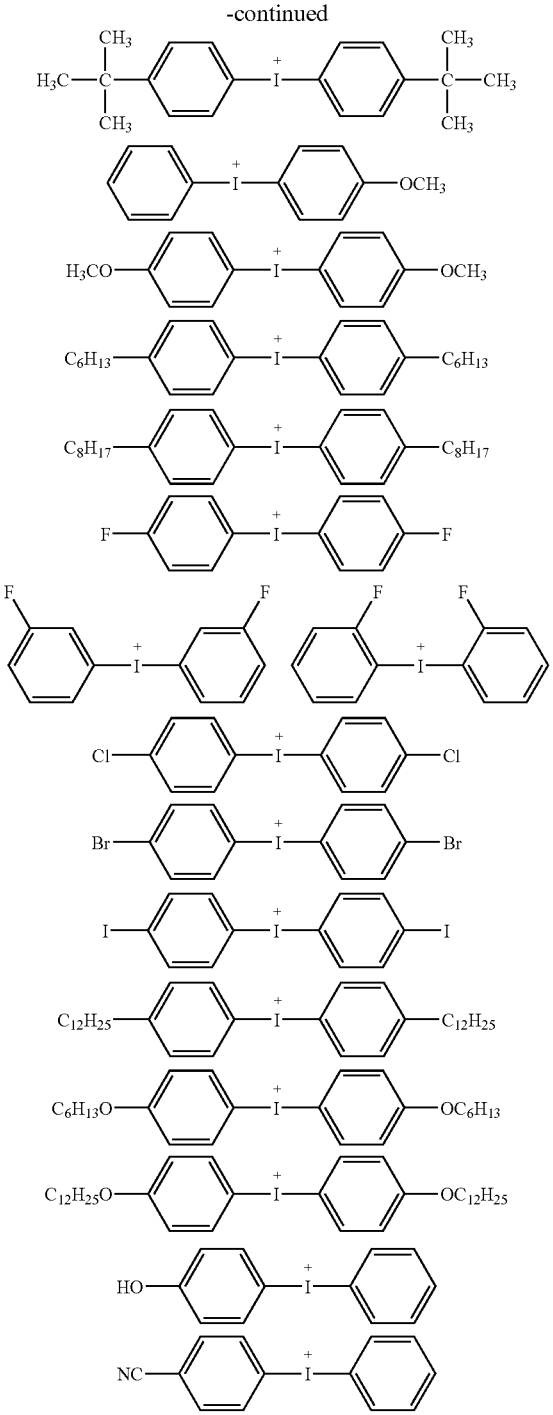
Specific examples of the cation (IIIc) include the following:
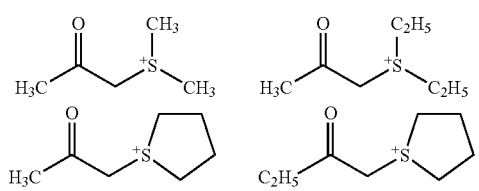
-continued
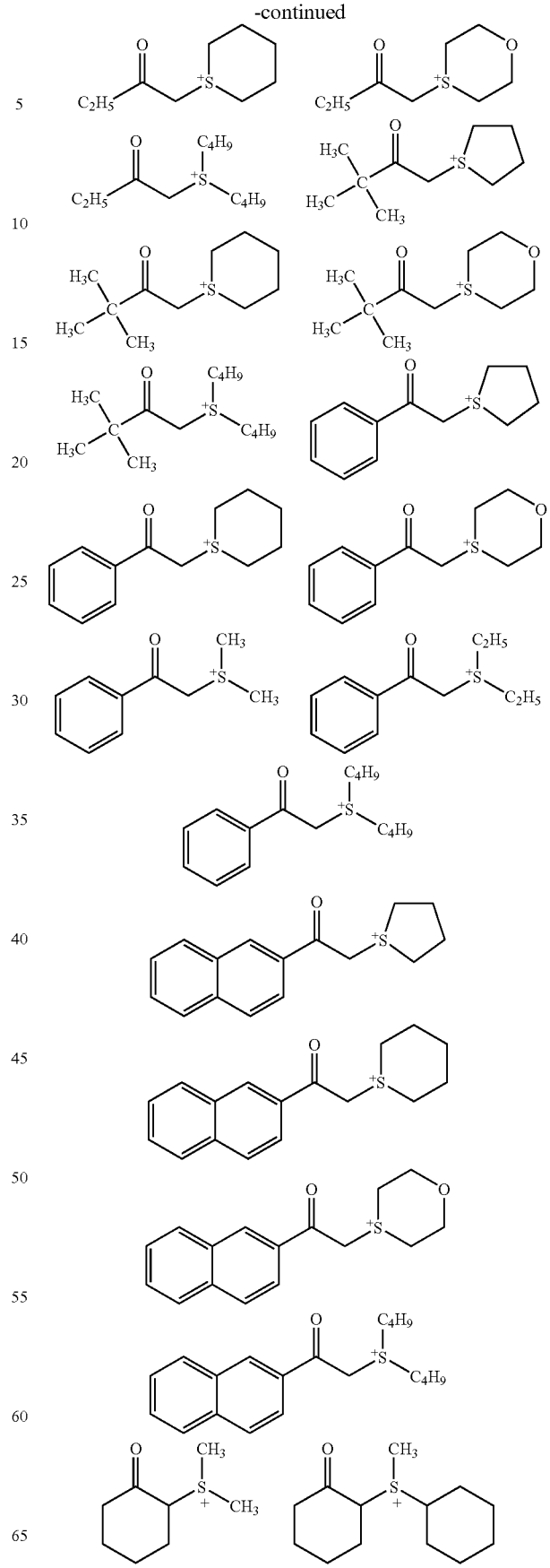

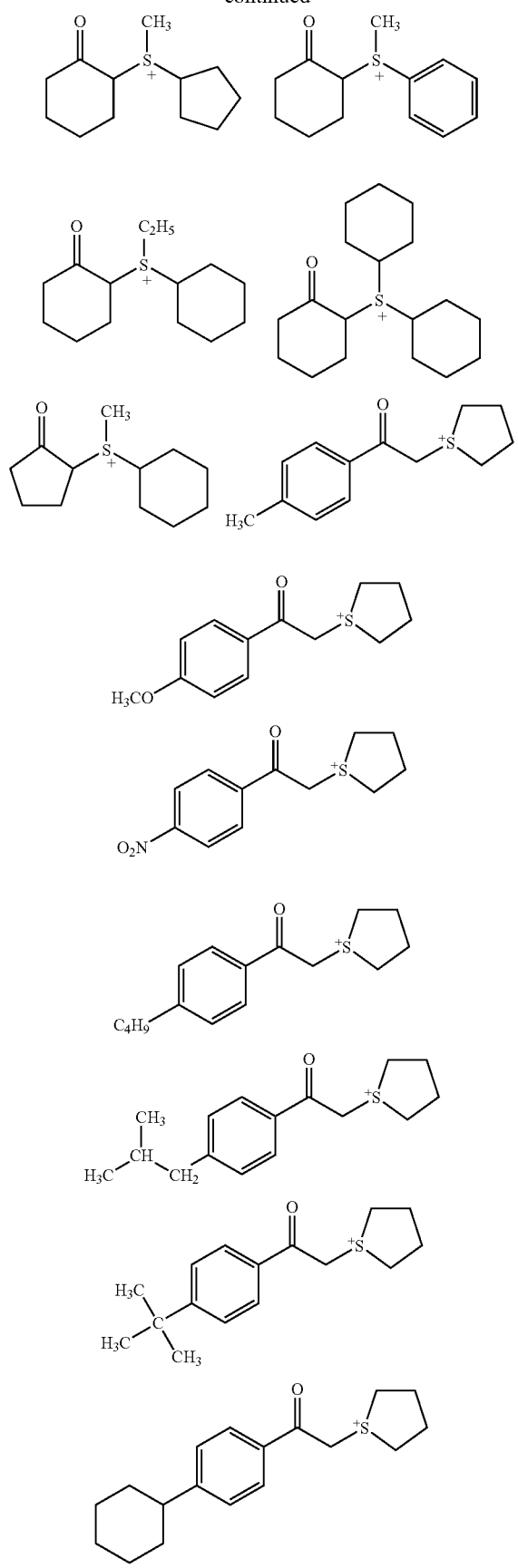
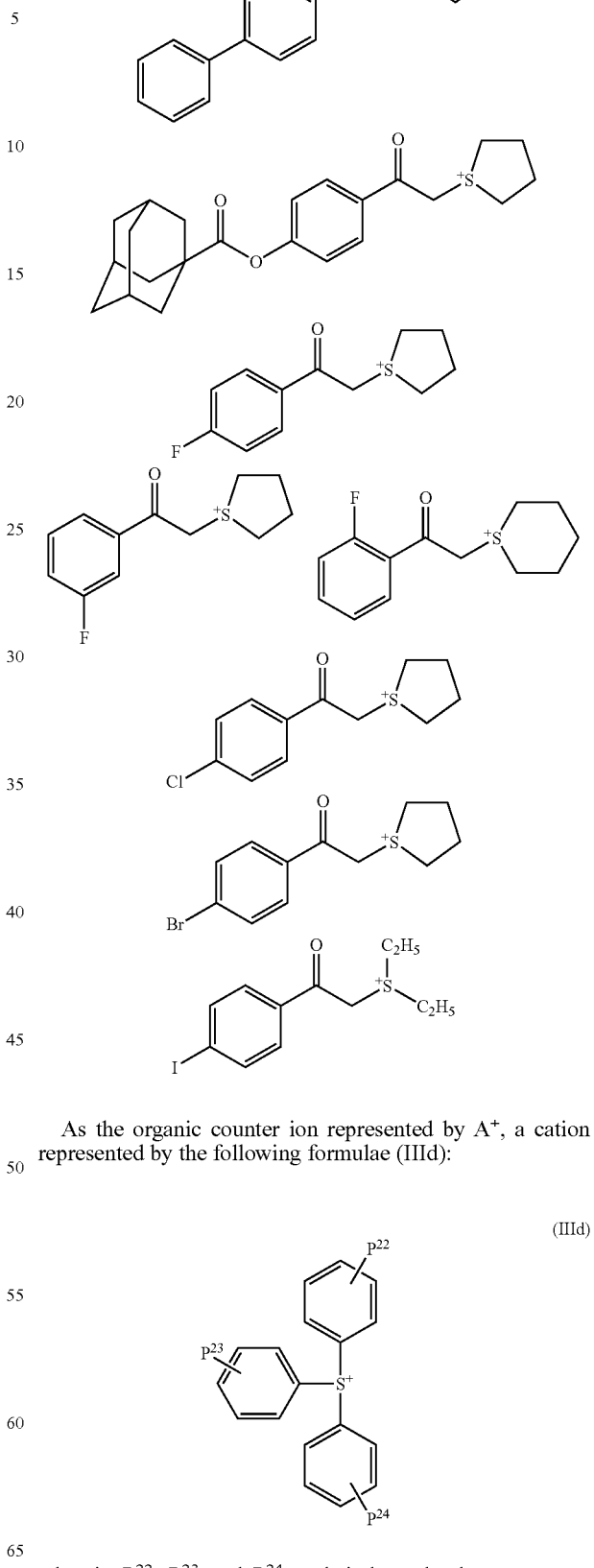
As the organic counter ion represented by $A^+$, a cation represented by the following formulae (IIId):
(IIId)
wherein $P^{22}$, $P^{23}$ and $P^{24}$ each independently represent a hydrogen atom, a halogen atom, a hydroxyl group, a cyano group, a C1-C4 alkyl group or a C1-C4 alkoxy group, is preferable from the viewpoint of easy production thereof.

In the formula (I), $Q^1$ and $Q^2$ each independently represent a fluorine atom or a C1-C6 perfluoroalkyl group. Examples of the C1-C6 perfluoroalkyl group include a trifluoromethyl group, a pentafluoroethyl group, a heptafluoropropyl group, a nonafluorobutyl group, an undecafluoropentyl group and a tridecafluorohexyl group, and a trifluoromethyl group is preferable. $Q^1$ and $Q^2$ each independently is preferably a fluorine atom or a trifluoromethyl group, and $Q^1$ and $Q^2$ are more preferably fluorine atoms.

In the formula (I), U represents a C1-C20 divalent hydrocarbon group in which one or more —$CH_2$— may be replaced by —O—, —NH—, —S—, —$NR^c$—, —CO— or —CO—O—, and $R^c$ represents a C1-C6 alkyl group. Examples of the C1-C6 alkyl group include a methyl group, an ethyl group, an n-propyl group, an isopropyl group, an n-butyl group, a tert-butyl group and an n-hexyl group.

Examples of the C1-C20 divalent hydrocarbon group in which one or more —$CH_2$— may be replaced by —O—, —NH—, —S—, —$NR^c$—, —CO— or —CO—O— include a C1-C20 alkylene group such as a methylene group, an ethylene group, a trimethylene group, a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group and icosamethylene group; an ethylenecarbonylethyl group; and the following groups:

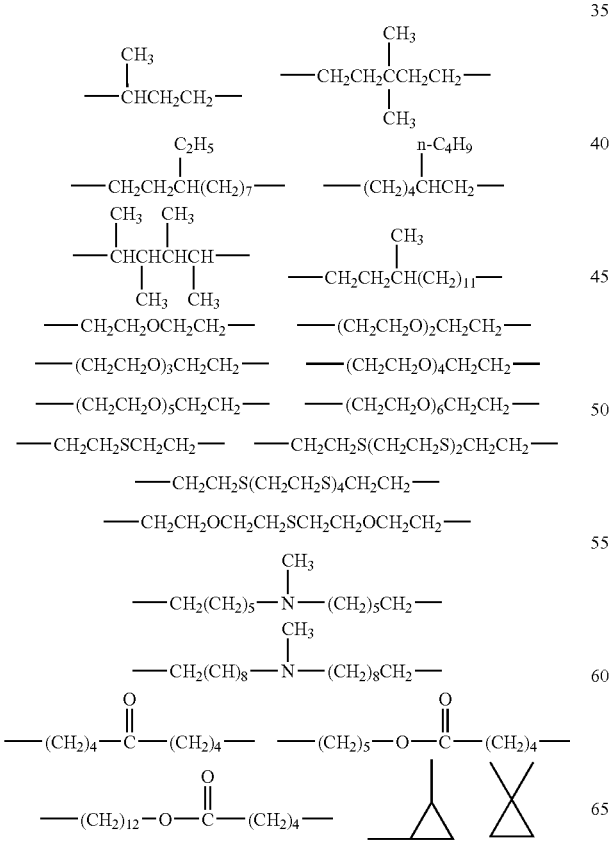

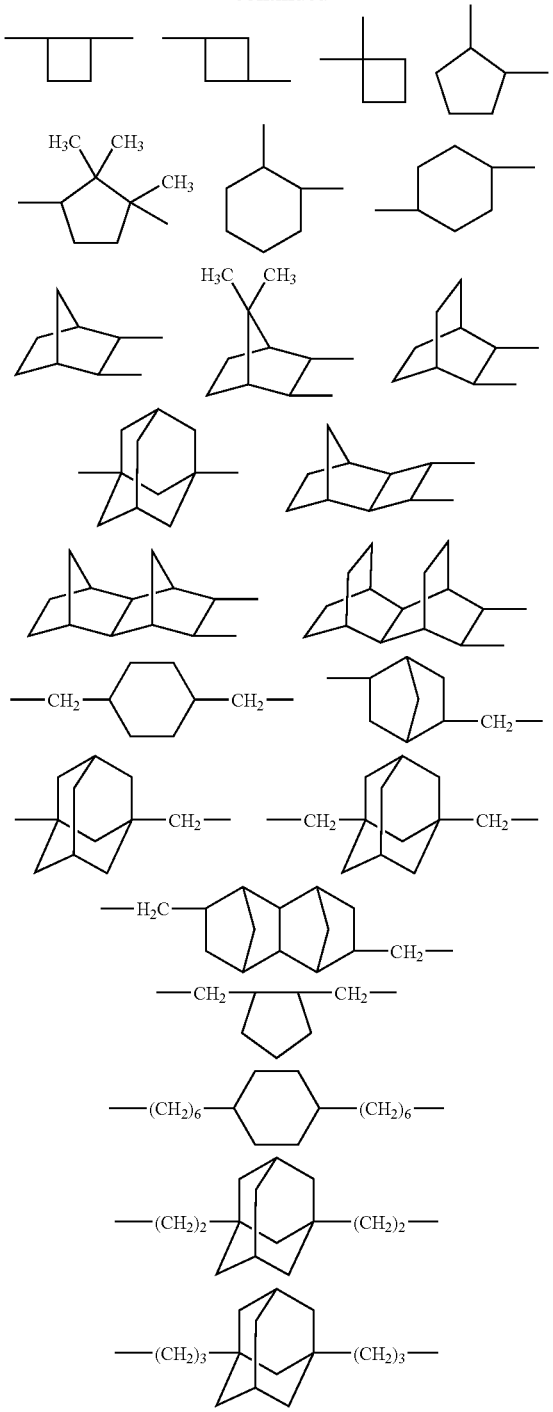

The C1-C20 alkylene group in which one or more —$CH_2$— may be replaced by —O— is preferable.

In the formula (I), $X^1$ represents —O—CO—, —CO—O—, —CO—O$CH_2$—, —$CH_2$—O—CO—, —O—$CH_2$—, —$CH_2$—O—, —$NR^d$—CO— or —CO—$NR^d$—, and $R^d$ represents a hydrogen atom or a C1-C6 alkyl group. Examples of the C1-C6 alkyl group include the same as described above. $X^1$ is preferably —O—CO—.

As the structural unit represented by the formula (I), a structural unit represented by the formula (I'):

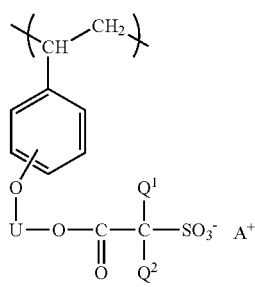

(I')

wherein $Q^1$, $Q^2$, U and $A^+$ are the same meanings as defined above, is preferable.

The group represented by the following formula:

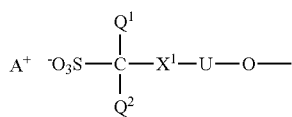

in the formulae (I) and (I') is preferably bonded at p-position.

The ratio of the structural unit represented by the formula (I) in the resin (I) is usually 1 to 100 mol % and preferably 5 to 100 mol % based on the total molar of all of the structural units.

The resin (I) can be produced by a reaction of a resin comprising a structural unit represented by the formula (IV):

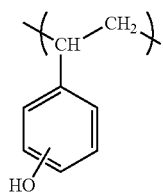

(IV)

(hereinafter, simply referred to as the resin (IV)) with a salt represented by the formula (V):

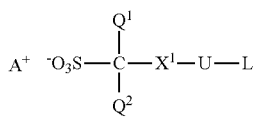

(V)

wherein $Q^1$, $Q^2$, $X^1$, U and $A^+$ are the same meanings as defined above, and L represents a halogen atom, a C1-C12 alkylsulfonyloxy group, a C6-C12 arylsulfonyloxy group or a C5-C12 heteroarylsulfonyloxy group (hereinafter, simply referred to as the salt (V)).

The resin (IV) can be produced according to known methods, and commercially available one may be used.

Examples of the halogen atom include a fluorine atom, a bromine atom, a chlorine atom and an iodine atom. Examples of the C1-C12 alkylsulfonyloxy group include a methanesulfonyloxy group, an ethanesulfonyloxy group, a propanesulfonyloxy group, a butanesulfonyloxy group, a pentanesulfonyloxy group, a hexanesulfonyloxy group, a heptanesulfonyloxy group, an octanesulfonyloxy group, a nonanesulfonyloxy group, a decanesulfonyloxy group, an undecanesulfonyloxy group and a dodecanesulfonyloxy group. Examples of the C6-C12 arylsulfonyloxy group include a benzenesulfonyloxy group, a toluenesulfonyloxy group, a p-bromobenzenesulfonyloxy group and a naphthalenesulfonyloxy group. Examples of the C5-C12 heteroarylsulfonyloxy group include a 2-pyridinesulfonyloxy group and a 2-quinolinesulfonyloxy group.

Examples of the salt (V) include triphenylsulfonium difluoro(chloromethoxycarbonyl)methanesulfonate, triphenylsulfonium difluoro(2-bromoethoxycarbonyl)methanesulfonate, triphenylsulfonium difluoro(3-iodopropoxycarbonyl)methanesulfonate, triphenylsulfonium difluoro(4-chlorobutoxycarbonyl)methanesulfonate, diphenyltolylsulfonium difluoro(5-bromopentyloxycarbonyl)methanesulfonate, triphenylsulfonium difluoro(5-fluoropentyloxycarbonyl)methanesulfonate, triphenylsulfonium difluoro(6-bromohexyloxycarbonyl)methanesulfonate, tris(tert-butylphenyl)sulfonium difluoro(6-bromohexyloxycarbonyl)methanesulfonate, triphenylsulfonium difluoro(7-chloroheptyloxycarbonyl)methanesulfonate, diphenyl(tert-butylphenyl)sulfonium difluoro(8-iodooctyloxycarbonyl)methanesulfonate, triphenylsulfonium difluoro(9-chlorononyloxycarbonyl)methanesulfonate, tris(tolyl)sulfonium difluoro(10-bromodecyloxycarbonyl)methanesulfonate, triphenylsulfonium difluoro(11-chloroundecyloxycarbonyl)methanesulfonate, triphenylsulfonium difluoro(12-bromododecyloxycarbonyl)methanesulfonate, diphenyltolylsulfonium difluoro(12-bromododecyloxycarbonyl)methanesulfonate, triphenylsulfonium difluoro(13-bromotridecyloxycarbonyl)methanesulfonate, tris(tert-butylphenyl)sulfonium difluoro(14-chlorotetradecyloxycarbonyl)methanesulfonate, triphenylsulfonium difluoro(15-iodopentadecyloxycarbonyl)methanesulfonate, triphenylsulfonium difluoro(16-bromohexadecyaoxycarbonyl)methanesulfonate, diphenyltolylsulfonium difluoro(17-chloroheptadecyloxycarbonyl)methanesulfonate, triphenylsulfonium difluoro(18-bromooctadecyloxycarbonyl)methanesulfonate, triphenylsulfonium difluoro(19-iodononadecyloxycarbonyl)methanesulfonate, triphenylsulfonium difluoro(20-bromoicosyloxycarbonyl)methanesulfonate, triphenylsulfonium difluoro[6-(methanesulfonyloxy)hexyloxycarbonyl]methanesulfonate, triphenylsulfonium difluoro[8-(p-toluenesulfonyloxy)octyloxycarbonyl]methanesulfonate, tris(tert-butylphenyl)sulfonium difluoro[9-(p-bromobenzenesulfonyloxy)nonyloxycarbonyl]methanesulfonate, triphenylsulfonium difluoro[10-(naphthalenesulfonyloxy)decyloxycarbonyl]methanesulfonate, triphenylsulfonium difluoro[12-(2-pyridinesulfonyloxy)dodecyloxycarbonyl]methanesulfonate, diphenyltolylsulfonium difluoro[13-(2-quinolinesulfonyloxy)tridecyloxycarbonyl]methanesulfonate, triphenylsulfonium bis(trifluoromethyl)(6-bromohexyloxycarbonyl)methanesulfonate, triphenylsulfonium bis(nonafluorobutyl)(4-chlorobutoxycarbonyl)methanesulfonate, triphenylsulfonium bis(perfluorohexyl)(6-bromohexyloxycarbonyl)methanesulfonate, triphenylsulfonium (8-bromooctyloxycarbonyl)pentafluoroethanesulfonate, triphenylsulfonium difluoro(4-bromo-2,2-dimethylbutoxycarbonyl)methanesulfonate, triphenylsulfonium difluoro[2-{2-(2-chloroethoxy)ethoxy}ethoxycarbonyl]methanesulfonate, triphenylsulfonium difluoro{2-(2-chloroethylthio)ethoxycarbonyl}methanesulfonate, diphenyltolylsulfonium difluoro[2-{N-methyl-(2-chloroethyl)amino}ethoxycarbonyl]methanesulfonate, triphenylsulfonium bis(trifluoromethyl)(5-chloro-4-oxopentyloxycarbonyl)methanesulfonate, triphenylsulfonium bis(trifluoromethyl){3-(2-chloroethoxycarbonyl)propoxycarbonyl}methanesulfonate, triphenylsulfonium bis(trifluoromethyl){(4-chloromethylhexyl)methoxycarbonyl}methanesulfonate, triphenylsulfonium bis(trifluoromethyl){(3-chloromethyladamantyl)methoxycarbonyl}methanesulfonate, triphenylsulfonium bis(trifluoromethyl)(5-chloromethylnorbornan-2-yloxycarbonyl)methane sulfonate, diphenyl(4-fluorophenyl)sulfonium difluoro(chloromethoxycarbonyl)methanesulfonate, diphenyl(3-fluorophenyl)sulfonium difluoro(2-bromoethoxycarbonyl)methanesulfonate, diphenyl(2-fluorophenyl)sulfonium difluoro(3-iodopropoxycarbonyl)methanesulfonate, diphenyl(4-fluorophenyl)sulfonium difluoro(4-chlorobutoxycarbonyl)methanesulfonate, diphenyl(4-fluorophenyl)sulfonium difluoro(5-bromopentyloxycarbonyl)methanesulfonate, bis(4-fluorophenyl)phenylsulfonium difluoro(5-fluoropentyloxycarbonyl)methanesulfonate, tris(4-fluorophenyl)sulfonium difluoro(6-bromohexyloxycarbonyl)methanesulfonate, diphenyl(4-fluorophenyl)sulfonium difluoro(6-bromohexyloxycarbonyl)methanesulfonate, (4-fluorophenyl)bis(tolyl)sulfonium difluoro(6-bromohexyloxycarbonyl)methanesulfonate, (4-fluorophenyl)diphenylsulfonium difluoro(7-chloroheptyloxycarbonyl)methanesulfonate, diphenyl(4-fluorophenyl)sulfonium difluoro(8-iodooctyloxycarbonyl)methanesulfonate, (4-fluorophenyl)bis(tert-butylphenyl)sulfonium difluoro(8-iodooctyloxycarbonyl)methanesulfonate, tris(4-fluorophenyl)sulfonium difluoro(9-chlorononyloxycarbonyl)methanesulfonate, diphenyl(4-fluorophenyl)sulfonium difluoro(10-bromodecyloxycarbonyl)methanesulfonate, tris(4-fluorophenyl)sulfonium difluoro(11-chloroundecyloxycarbonyl)methanesulfonate, tris(4-fluorophenyl)sulfonium difluoro(12-bromododecyloxycarbonyl)methanesulfonate, diphenyl(4-fluorophenyl)sulfonium difluoro(12-bromododecyloxycarbonyl)methanesulfonate, tris(4-fluorophenyl)sulfonium difluoro(12-bromododecyloxycarbonyl)methanesulfonate, diphenyl(4-fluorophenyl)sulfonium difluoro(13-bromotridecyloxycarbonyl)methanesulfonate, diphenyl(4-fluorophenyl)sulfonium difluoro(14-chlorotetradecyloxycarbonyl)methanesulfonate, diphenyl(4-fluorophenyl)sulfonium difluoro(15-iodopentadecyloxycarbonyl)methanesulfonate, diphenyl(4-fluorophenyl)sulfonium difluoro(16-bromohexadecyloxycarbonyl)methanesulfonate, diphenyl(4-fluorophenyl)sulfonium difluoro(17-chloroheptadecyloxycarbonyl)methanesulfonate, diphenyl(4-fluorophenyl)sulfonium difluoro(18-bromooctadecyloxycarbonyl)methanesulfonate, diphenyl(4-fluorophenyl)sulfonium difluoro(19-iodononadecyloxycarbonyl)methanesulfonate, diphenyl(3-fluorophenyl)sulfonium difluoro(20-bromoicosyloxycarbonyl)methanesulfonate, triphenylsulfonium diphenyl(4-chlorophenyl)sulfonium difluoro(4-chlorobutoxycarbonyl)methanesulfonate, diphenyl(4-bromophenyl)sulfonium difluoro(6-bromohexyloxycarbonyl)methanesulfonate, diphenyl(4-iodophenyl)sulfonium difluoro(8-bromooctyloxycarbonyl)methanesulfonate, diphenyliodonium difluoro(chloromethoxycarbonyl)methanesulfonate, diphenyliodonium difluoro(2-bromoethoxycarbonyl)methanesulfonate, bis(4-methylphenyl)iodonium difluoro(2-bromoethoxycarbonyl)methanesulfonate, bis(4-ethylphenyl)iodonium difluoro(3-iodopropoxycarbonyl)methanesulfonate, bis(4-tert-butylphenyl)iodonium difluoro(4-chlorobutoxycarbonyl)methanesulfonate, bis(4-methoxyphenyl)iodonium difluoro(5-bromopentyloxycarbonyl)methanesulfonate, bis(4-methoxyphenyl)iodonium difluoro(6-bromohexyloxycarbonyl)methanesulfonate, bis(4-hexylphenyl)iodonium difluoro(7-chloroheptyloxycarbonyl)methanesulfonate, bis(4-octylphenyl)iodonium difluoro(8-iodooctyloxycarbonyl)methanesulfonate, bis(4-fluorophenyl)iodonium difluoro(12-bromododecyloxycarbonyl)methanesulfonate, bis(3-fluorophenyl)iodonium difluoro(12-bromododecyloxycarbonyl)methanesulfonate, bis(2-fluorophenyl)iodonium difluoro(12-bromododecyloxycarbonyl)methanesulfonate, bis(4-chlorophenyl)iodonium bis(trifluoromethyl)(9-chlorononyloxycarbonyl)methanesulfonate, bis(4-bromophenyl)iodonium difluoro(10-bromodecyloxycarbonyl)methanesulfonate, bis(4-iodophenyl)iodonium difluoro(18-bromooctadecyloxycarbonyl)methanesulfonate, tetrahydro-2-oxopropylthiophanium difluoro(chloromethoxycarbonyl)methanesulfonate, tetrahydro-1-acetonyl-2H-thiopyranium difluoro(3-iodopropoxycarbonyl)methanesulfonate, tetrahydro-1-(2-oxobutyl)-2H-thiopyranium difluoro(4-chlorobutoxycarbonyl)methanesulfonate, 4-acetonyl-1,4-oxathianium difluoro(5-fluoropentyloxycarbonyl)methanesulfonate, tetrahydro-1-(2-oxo-2-phenylethyl)-2H-thiopyranium difluoro(5-bromopentyloxycarbonyl)methanesulfonate, dimethyl(2-oxocyclohexyl)sulfonium difluoro(6-bromohexyloxycarbonyl)methanesulfonate, methyl(2-oxocyclohexyl)cyclopentylsulfonium difluoro(8-iodooctyloxycarbonyl)methanesulfonate, diethyl(2-oxocyclohexyl)sulfonium difluoro(9-chlorononyloxycarbonyl)methanesulfonate, methyl(2-oxocyclohexyl)cyclopentylsulfonium difluoro(10-bromodecyloxycarbonyl)methanesulfonate, methyl(2-oxocyclohexyl)phenylsulfonium difluoro(11-chloroundecyloxycarbonyl)methanesulfonate, dimethyl(2-oxocyclohexyl)sulfonium difluoro(12-bromododecyloxycarbonyl)methanesulfonate, methyl(2-oxocyclohexyl)cyclohexylsulfonium difluoro(16-bromohexadecyloxycarbonyl)methanesulfonate, methyl(2-oxocyclohexyl)cyclopentylsulfonium bis(trifluoromethyl){(4-chloromethylhexyl)methoxycarbonyl}methanesulfonate, diethyl(2-oxocyclohexyl)sulfonium bis(trifluoromethyl){(3-chloromethyladamantyl)methoxycarbonyl}methanesulfonate, methyl(2-oxocyclohexyl)cyclohexylsulfonium bis(trifluoromethyl)(5-chloromethylnorbornan-2-yloxycarbonyl)methane sulfonate, methyl(2-oxocyclohexyl)phenylsulfonium difluoro(6-bromohexyloxycarbonyl)methanesulfonate, tetrahydro-1-{2-oxo-2-(4-fluorophenyl)ethyl}-2H-thiopyranium difluoro(5-bromopentyloxycarbonyl)methanesulfonate, tetrahydro-1-{2-oxo-2-(3-fluorophenyl)ethyl}-2H-thiopyranium difluoro(6-bromohexyloxycarbonyl)methanesulfonate, tetrahydro-1-{2-oxo-2-(2-fluorophenyl)ethyl}-2H-thiopyranium difluoro(7-bromoheptyloxycarbonyl)methanesulfonate, tetrahydro-1-{2-oxo-2-(4-chlorophenyl)ethyl}-2H-thiopyranium difluoro(5-bromopentyloxycarbonyl)methanesulfonate, tetrahydro-1-[(2-oxo-2-(4-bromophenyl)ethyl]-2H-thiopyranium difluoro(5-bromohexyloxycarbonyl)methanesulfonate, tetrahydro-1-{2-oxo-2-(4-iodophenyl)ethyl}-2H-thiopyranium difluoro(8-bromooctyloxycarbonyl)methanesulfonate, dimethyl(2-oxacyclohexyl)(4-fluorophenyl)sulfonium difluoro(6-bromohexyloxycarbonyl)methanesulfonate, methyl(2- oxacyclohexyl)(4-fluorophenyl)sulfonium difluoro(8-bromooctyloxycarbonyl)methanesulfonate, methyl(2-oxacyclohexyl)(3-fluorophenyl)sulfonium difluoro(10-bromodecyloxycarbonyl)methanesulfonate and methyl(2-oxacyclohexyl)(2-fluorophenyl)sulfonium difluoro(12-bromododecyloxycarbonyl)methanesulfonate.

The content of the structural unit represented by the formula (I) in the resin (I) differs depending on the used amount of the salt (V), and the content of the structural unit represented by the formula (I) in the resin (I) can be adjusted by adjusting the used amount of the salt (V).

The reaction of the resin (IV) and the salt (V) is usually conducted in an inert solvent such as acetone, methyl ethyl ketone, toluene, tetrahydrofuran, N,N-dimethylformamide and dimethyl sulfoxide. The reaction temperature is usually −30 to 200° C., and preferably 0 to 150° C.

The used amount of the salt (V) is usually 0.01 to 2 moles and preferably 0.03 to 1 mole per 1 mole of the structural unit represented by the formula (IV) in the resin (IV).

The reaction is preferably carried out in the presence of a base. Examples of the base include an organic base such as triethylamine, pyridine, sodium methoxide, sodium ethoxide and potassium tert-butoxide, and an inorganic base such as sodium hydride, potassium carbonate and sodium hydroxide. The used amount of the base is usually 0.01 to 2 moles and preferably 0.03 to 1.5 moles per 1 mole of the structural unit represented by the formula (IV) in the resin (IV).

The reaction may be carried out in the presence of a phase transfer catalyst such as tetrabutylammonium bromide.

After completion of the reaction, the resin (I) can be isolated according to known methods.

The resin (I) is preferably a resin being insoluble or poorly soluble in an aqueous alkali solution but becoming soluble in an aqueous alkali solution by the action of an acid. The resin (I) preferably contains one or more structural units having an acid-labile group in addition to the structural unit represented by the formula (I).

In the present specification, "acid-labile group" means a group cleaved by contacting with an acid to be converted to a hydrophilic group such as a hydroxyl group and a carboxyl group.

Examples of the acid-labile group include a group represented by the formula (1):

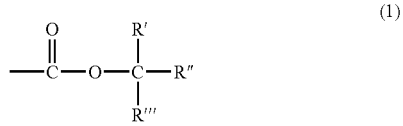

wherein R', R" and R'" each independently represents a linear or branched chain C1-C30 aliphatic hydrocarbon group or a C3-C30 alicyclic hydrocarbon group, or R' and are bonded to form a ring (hereinafter, simply referred to as the acid-labile group (1)).

Examples of the acid-labile group (1) include a 1,1-dialkylalkoxycarbonyl group such as a tert-butoxycarbonyl group; a 2-alkyl-2-adamantyloxycarbonyl group such as a 2-methyl-2-adamantyloxycarbonyl group, a 2-ethyl-2-adamantyloxycarbonyl group and a 2-isopropyl-2-adamantyloxycarbonyl group; a 1-alkylcycloalkoxycarbonyl group such as an ethylcyclohexyloxycarbonyl group; and a 1-(1-adamantyl)-1-alkylalkoxycarbonyl group.

The structural units having an acid-labile group is derived from a monomer having a carbon-carbon double bond and an acid-labile group, and preferable examples of the monomer include an acrylate having an acid-labile group and a methacrylate having an acid-labile group.

The monomer having an acid-labile group containing a C5-C20 alicyclic hydrocarbon group is preferable because excellent resolution is obtained when the resin obtained is used in the present composition. Examples of the C5-C20 alicyclic hydrocarbon group include a monocyclic saturated aliphatic hydrocarbon group having a cycloalkane ring such as a cyclopentane ring, a cyclohexane ring, a cycloheptane ring and a cyclooctane ring; a monocyclic unsaturated aliphatic hydrocarbon group having a cycloalkene ring such as a cyclopentene ring, a cyclohexene ring, a cycloheptene ring and a cyclooctene ring; a polycyclic aliphatic hydrocarbon group having a hydrogenated condensed aromatic ring such as a hydronaphthyl group; a polycyclic aliphatic hydrocarbon group having a bridged hydrocarbon ring such as an adamantane ring, a norbornene ring and a norbornene ring; and groups having the following ring:

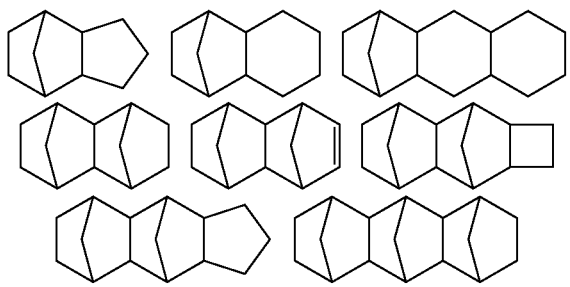

As the structural unit having an acid-labile group, a structural unit derived from a monomer represented by the formula (a-1) or (a-2):

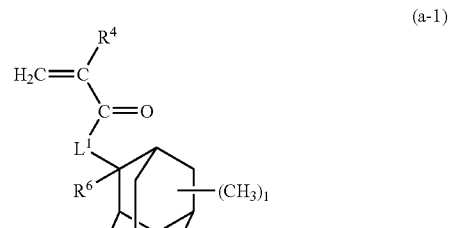

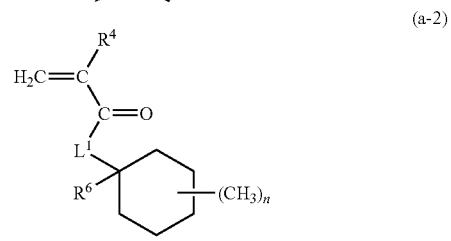

wherein $R^4$ represents a hydrogen atom or a methyl group, $R^6$ represents a linear or branched chain C1-C8 aliphatic hydrocarbon group or a cyclic C3-C10 aliphatic hydrocarbon group, $L^1$ represents —O— or —O—$(CH_2)_j$—CO—O—, j represents 1 to 7, l represents an integer of 0 to 14 and n represents an integer of 0 to 10, is preferable.

$R^4$ is preferably a methyl group. $R^6$ is preferably a linear or branched chain C1-C6 aliphatic hydrocarbon group or a cyclic C3-C8 aliphatic hydrocarbon group, and more preferably a linear or branched chain C1-C6 aliphatic hydrocarbon group or a cyclic C3-C6 aliphatic hydrocarbon group. Examples of the linear or branched chain C1-C8 aliphatic hydrocarbon group include a methyl group, an ethyl group, an isopropyl group, a tert-butyl group, a 2,2-dimethylethyl group, an n-propyl group, a 1-methylpropyl group, a 2,2-dimethylpropyl group, a 1-ethylpropyl group, an n-butyl group, a 1-methylbutyl group, a 2-methylbutyl group, a 3-methylbutyl group, a 1-n-propylbutyl group, an n-pentyl group, a 1-methylpentyl group, an n-hexyl group, a 1,4-dimethylhexyl group, an n-heptyl group, a 1-methylheptyl group and an n-octyl group. Examples of the cyclic C3-C8 aliphatic hydrocarbon group include a cycloheptyl group, a methylcycloheptyl group, a cyclohexyl group, a methylcyclohexyl group, a dimethylcyclohexyl group, a norbornyl group and a methylnorbornyl group. It is preferred that l is an integer of 0 to 3, and more preferred that l is 0 or 1. It is preferred that n is an integer of 0 to 3, and more preferred that n is 0 or 1. It is preferred that j is an integer of 1 to 4, and more preferred that j is 1.

Examples of the monomer represented by the formula (a-1) include the following:

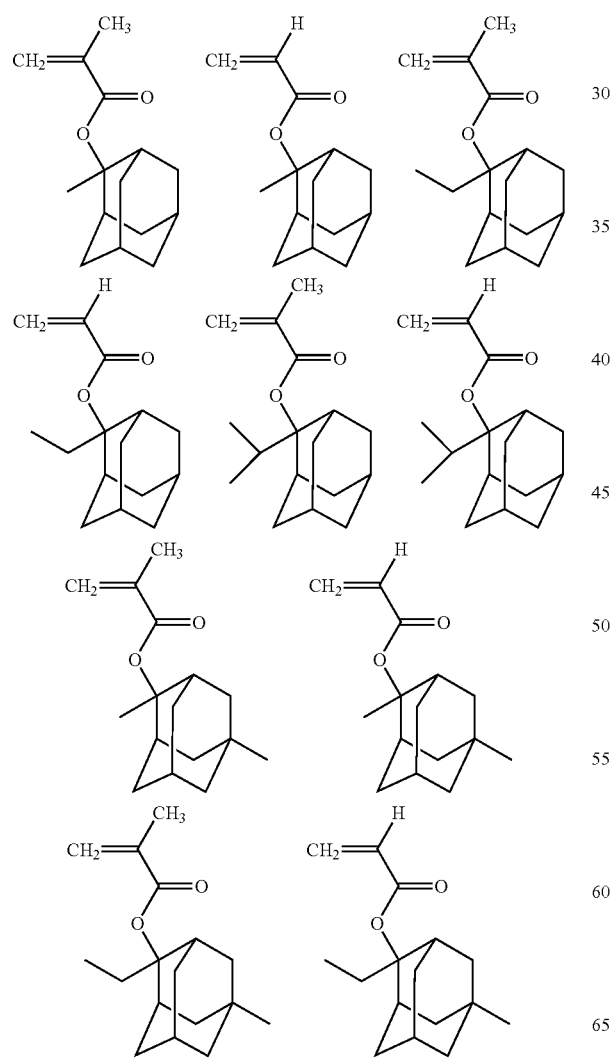

-continued

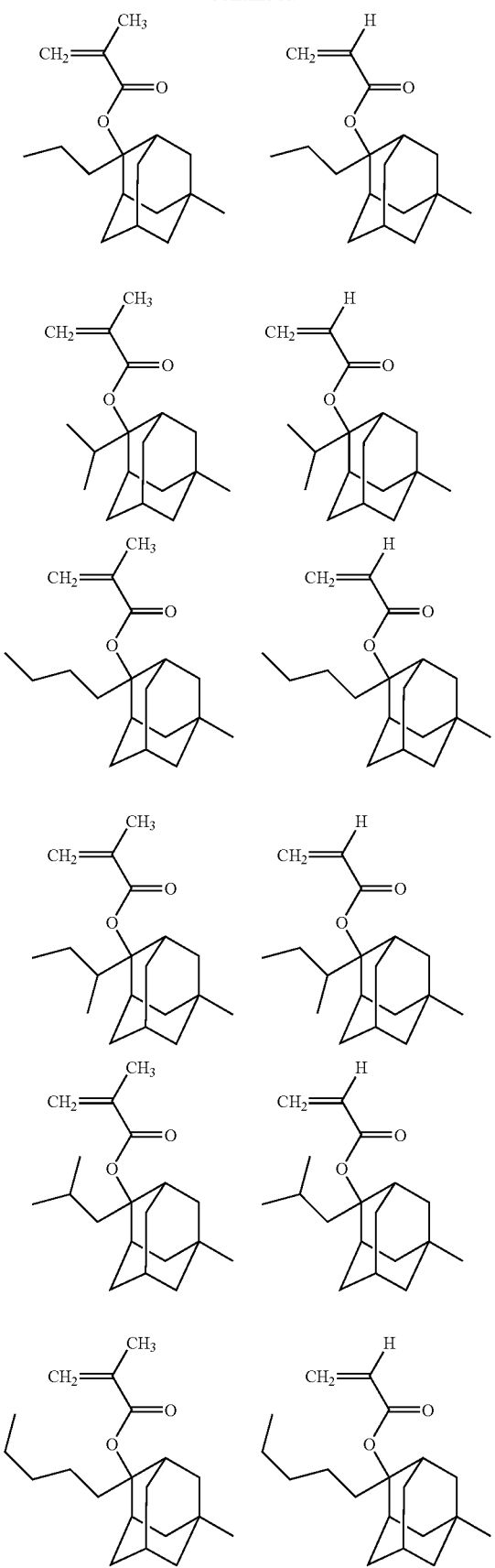

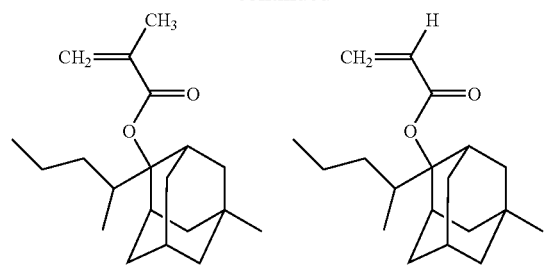
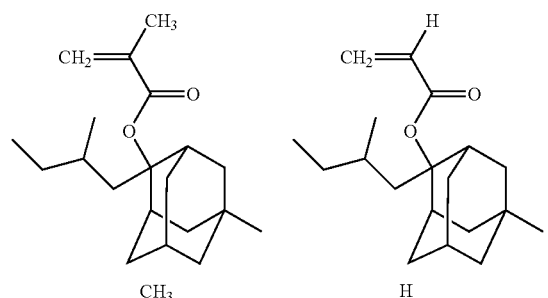
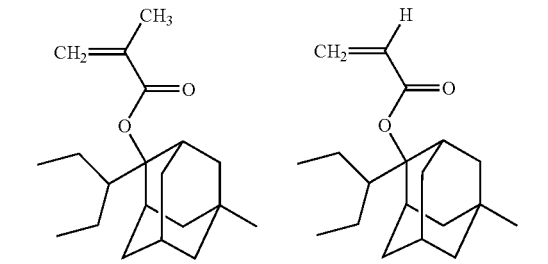
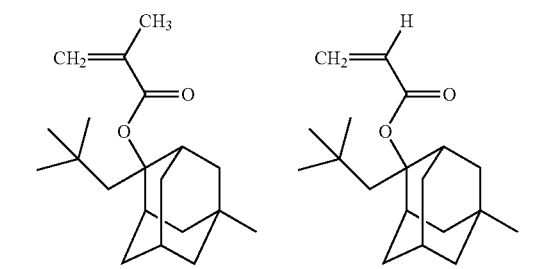
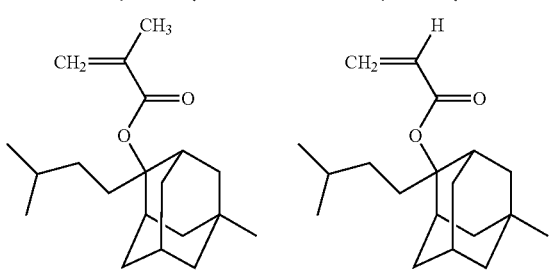
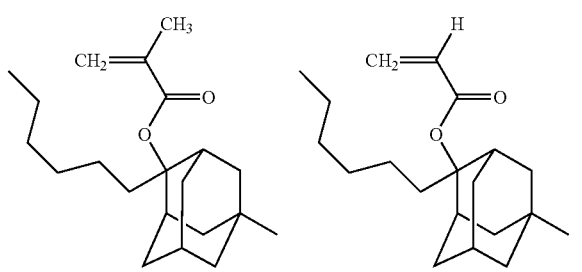
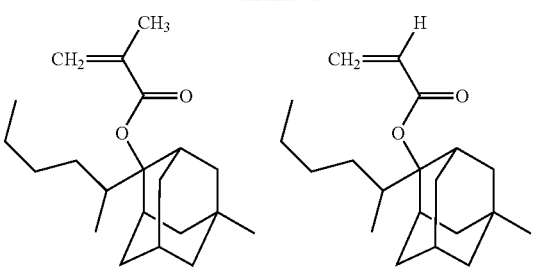
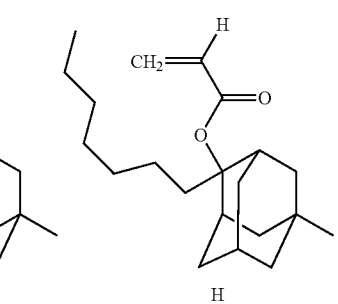
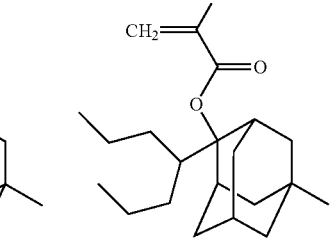
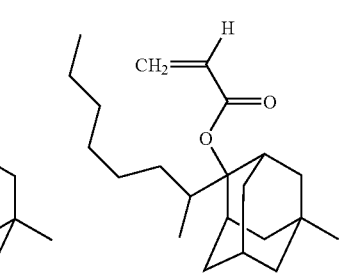
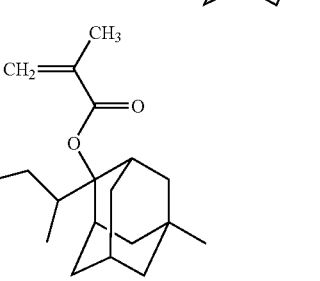
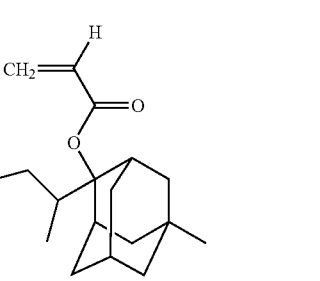

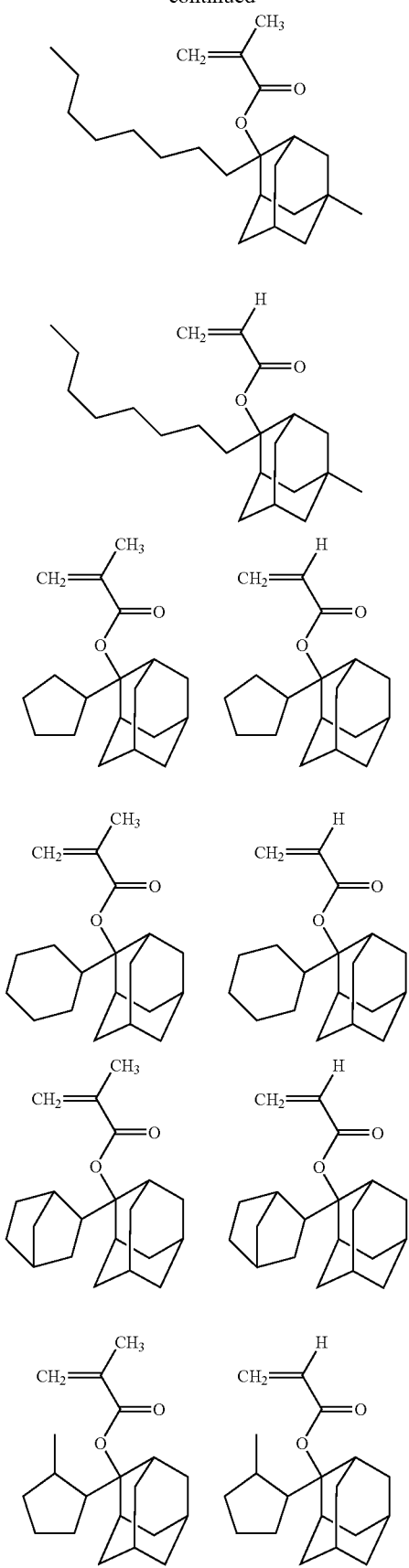
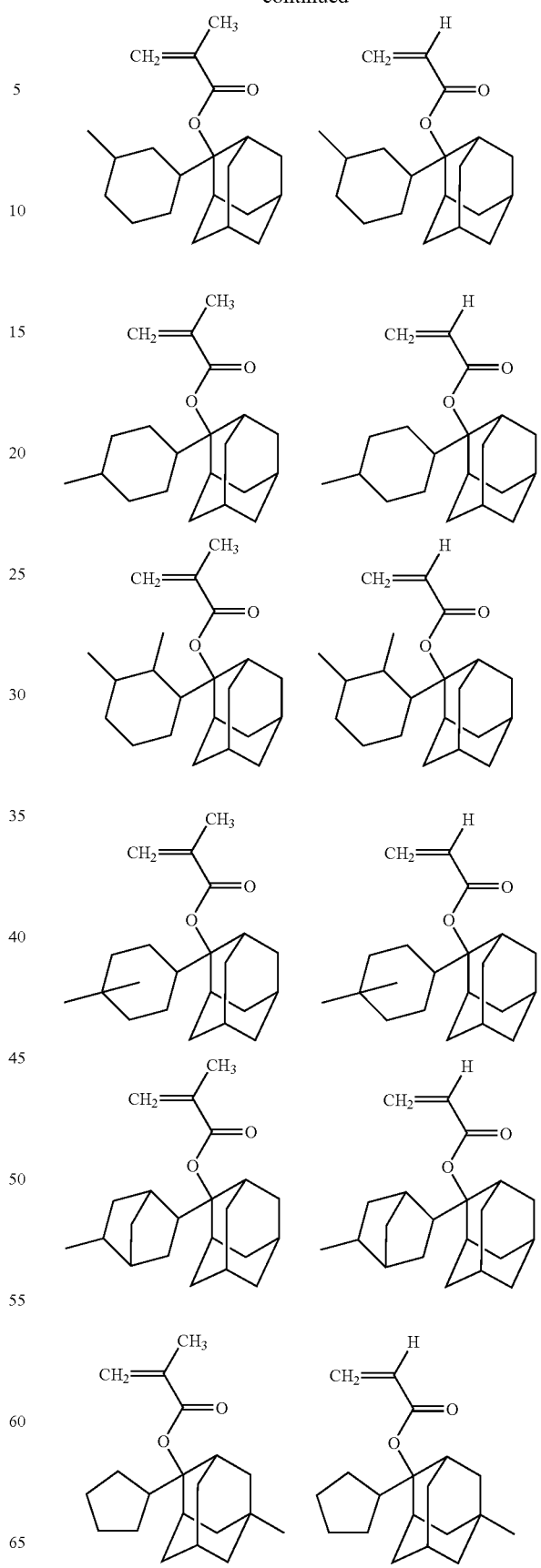

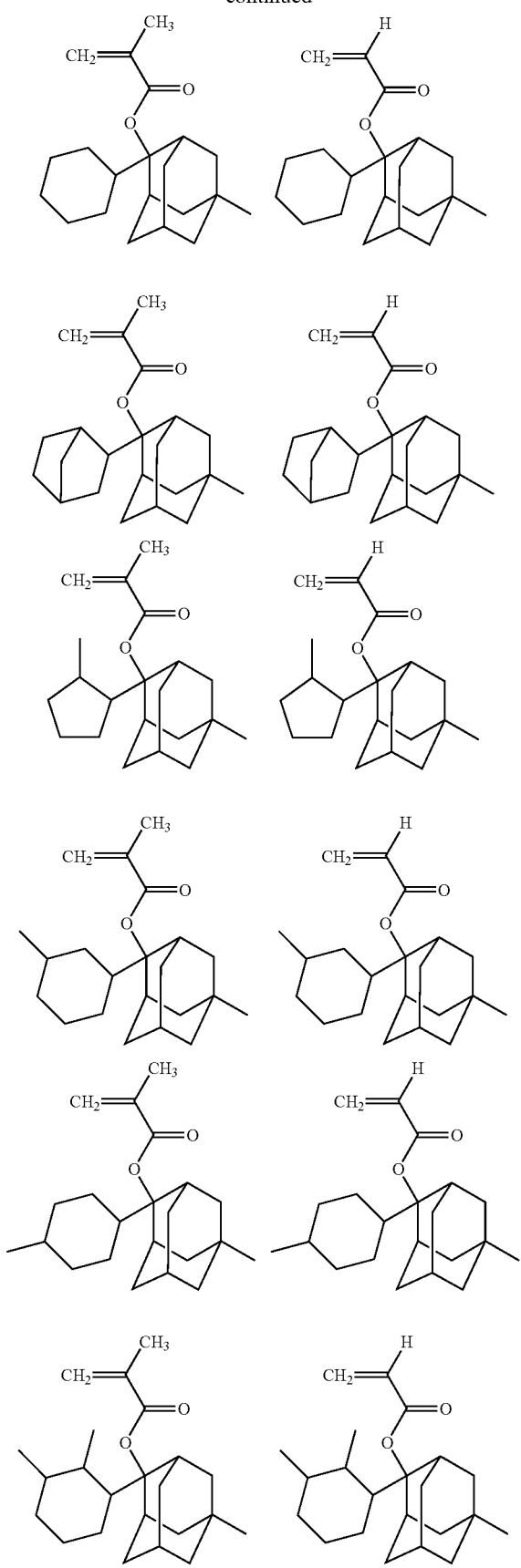
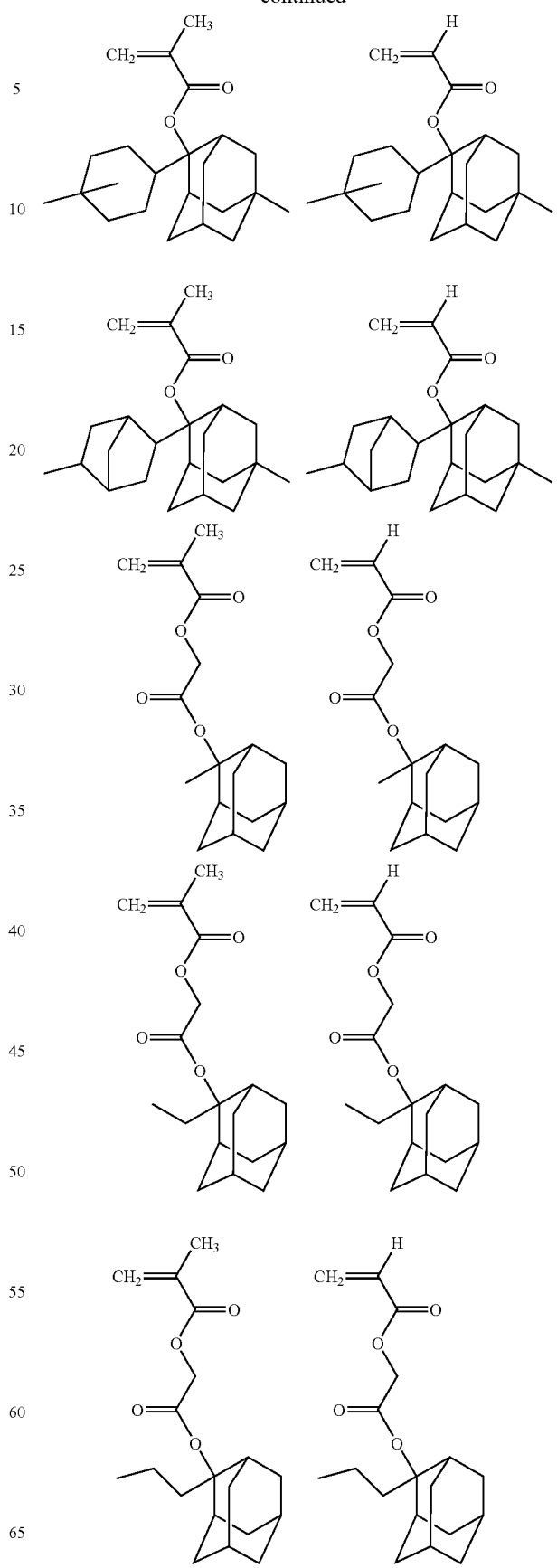

31
-continued
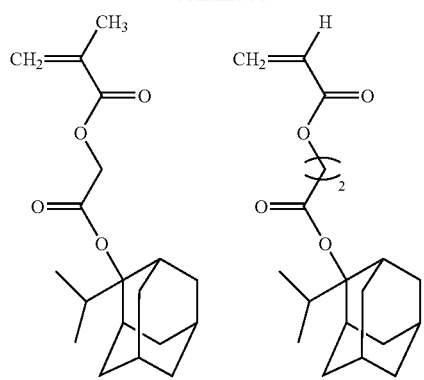
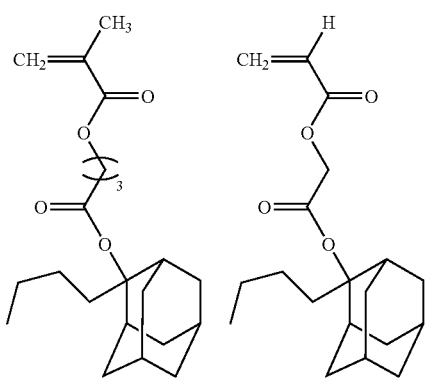
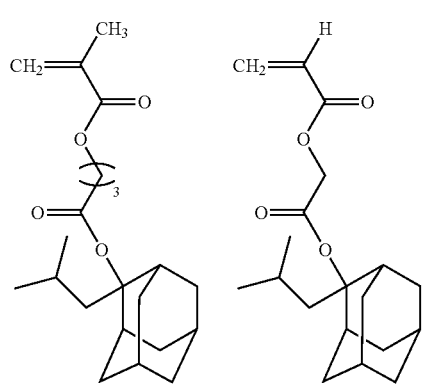
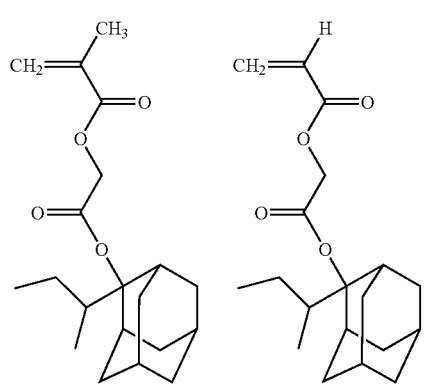
32
-continued
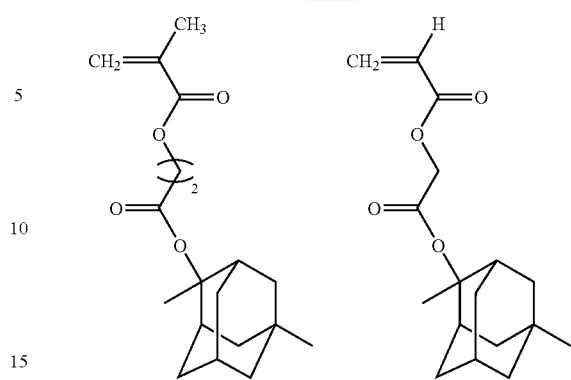
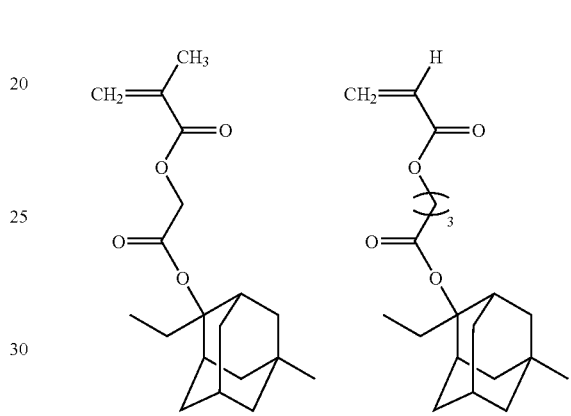
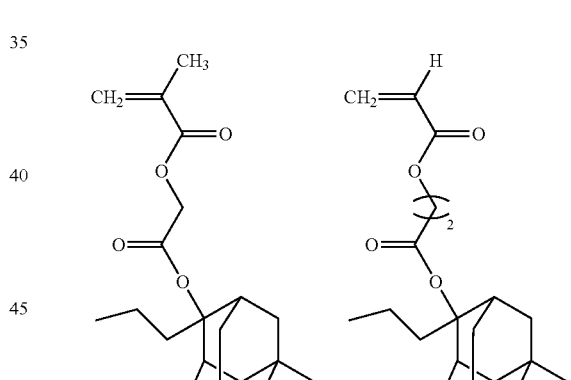
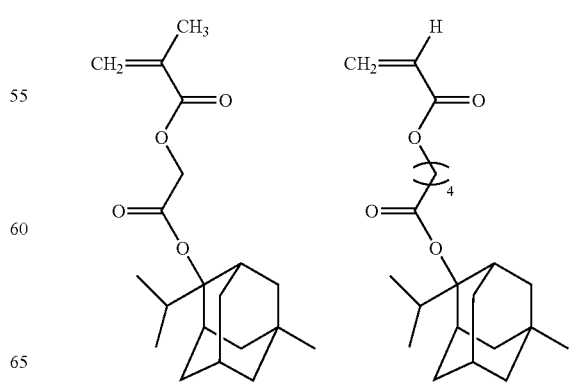

33
-continued
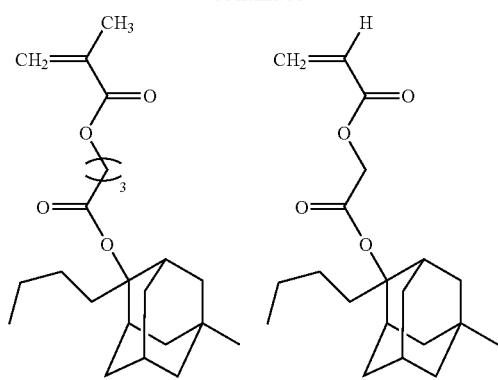
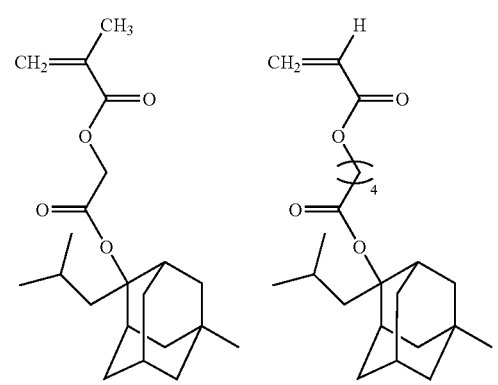
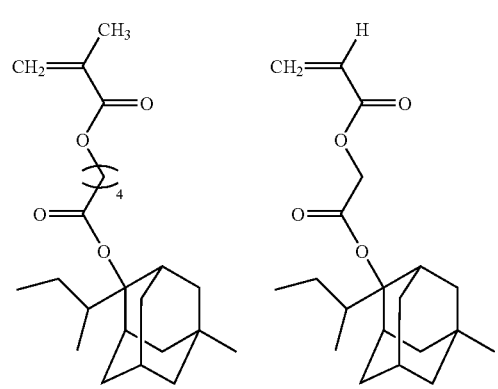
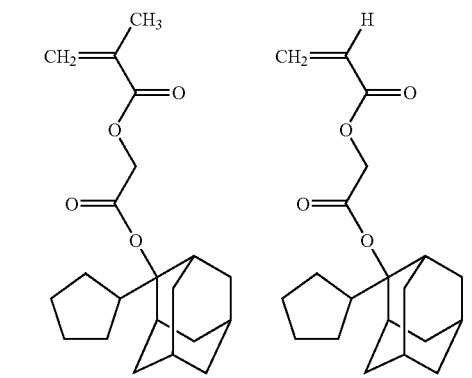
34
-continued
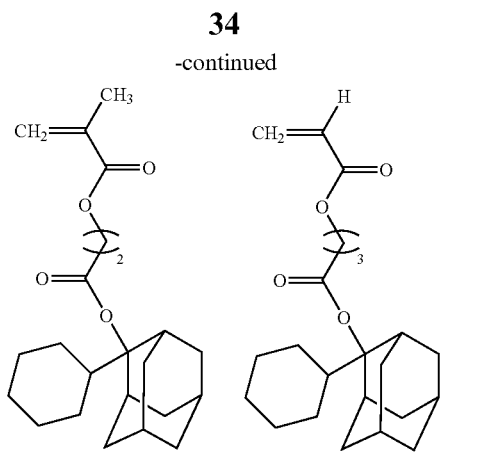
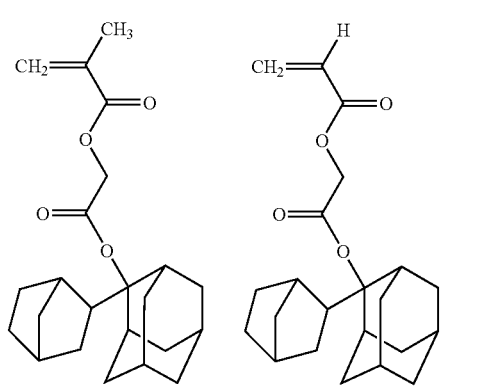
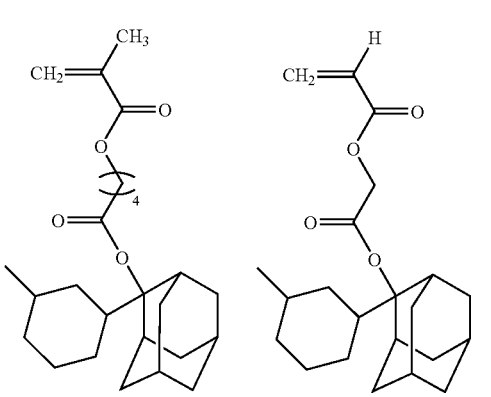
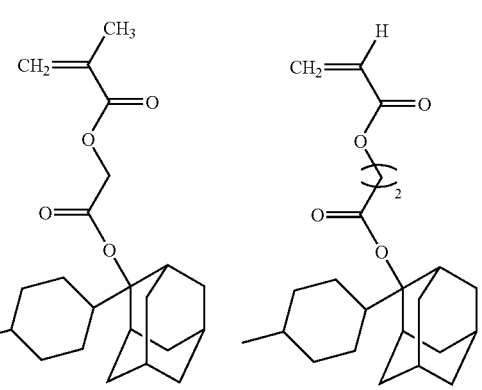

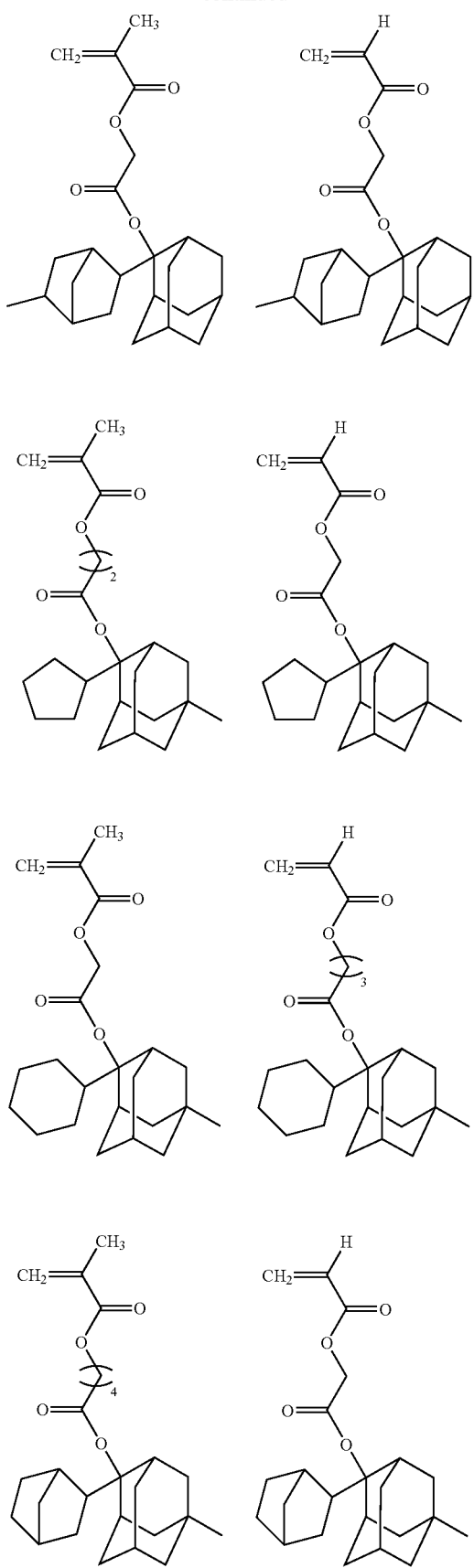

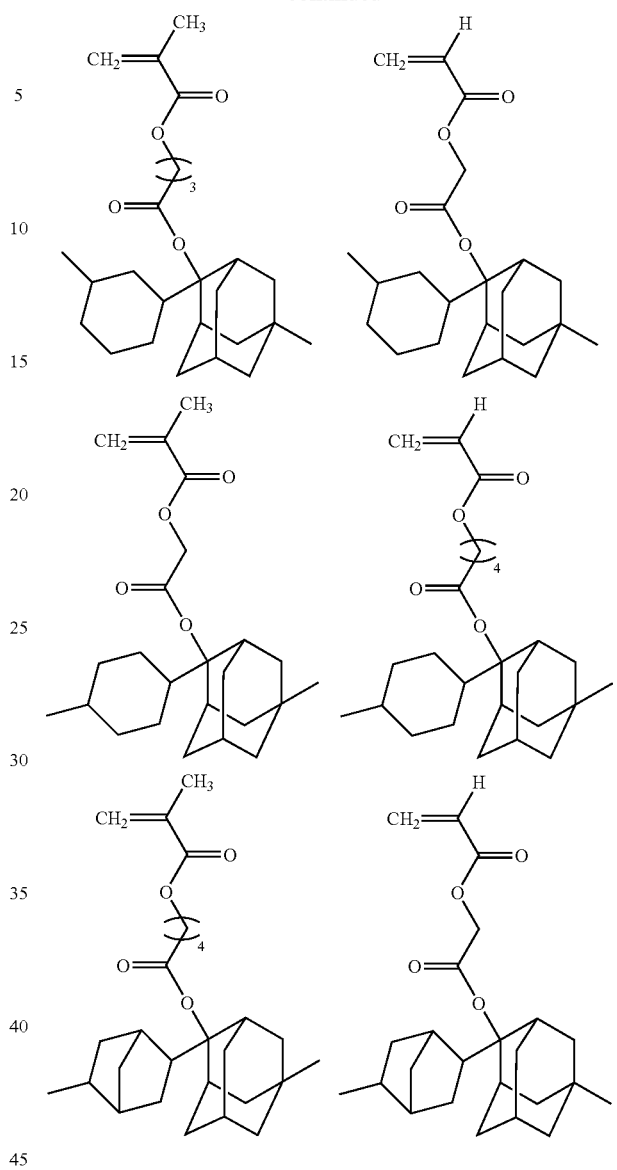

Among them, 2-methyl-2-adamantylacrylate, 2-methyl-2-adamantyl methacrylate, 2-ethyl-2-adamantyl acrylate, 2-ethyl-2-adamantyl methacrylate, 2-isopropyl-2-adamantyl acrylate and 2-isopropyl-2-adamantyl methacrylate are preferable, and 2-methyl-2-adamantyl methacrylate, 2-ethyl-2-adamantyl methacrylate and 2-isopropyl-2-adamantyl methacrylate are more preferable.

Examples of the monomer represented by the formula (a-2) include the following:

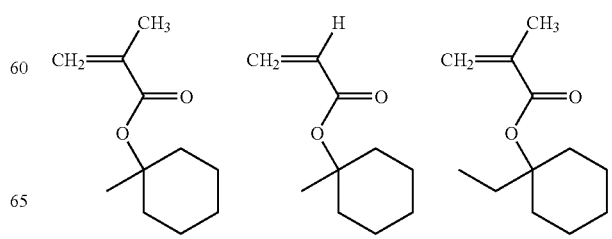

-continued

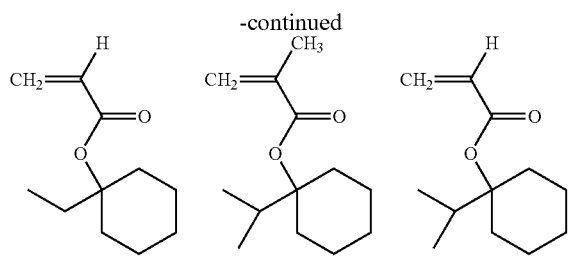

Among them, 1-ethyl-cyclohexyl acrylate and 1-ethyl-cyclohexyl methacrylate are preferable, and 1-ethyl-1-cyclohexyl methacrylate is more preferable.

Examples of the other structural unit having an acid-labile group include a structural unit derived from a monomer represented by the formula (a-4):

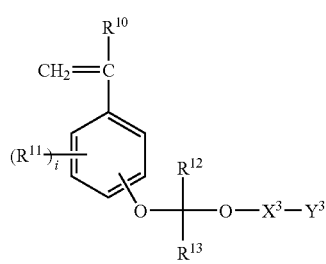

(a-4)

wherein $R^{10}$ represents a hydrogen atom, a halogen atom, a C1-C6 alkyl group which may have one or more halogen atoms, $R^{11}$ is independently in each occurrence a halogen atom, a hydroxyl group, a C1-C12 alkyl group, a C1-C12 hydroxyl-substituted alkyl group, a C1-C12 alkoxy group, a C6-C12 aryl group, a C7-C12 aralkyl group, a glycidyloxy group, a C2-C4 acyl group, a C2-C4 acyloxy group, an acryloyloxy group or a methacryloyloxy group, i represents an integer of 0 to 4, $R^{12}$ and $R^{13}$ each independently represents a hydrogen atom or a C1-C12 saturated hydrocarbon group, $X^3$ represents a single bond or a C1-C17 saturated hydrocarbon group which may be substituted and in which one or more —$CH_2$— may be replaced by —CO—, —O—, —S—, —$SO_2$— or —$NR^c$—, $R^c$ represents a hydrogen atom or a C1-C6 alkyl group, and $Y^3$ represents a linear or branched chain C1-C36 aliphatic hydrocarbon group, a C3-C36 alicyclic hydrocarbon group or a C6-C36 aromatic hydrocarbon group, and the C1-C36 aliphatic hydrocarbon group, the C3-C36 alicyclic hydrocarbon group and C6-C36 aromatic hydrocarbon group may have one or more substituents.

Examples of the halogen atom represented by $R^{10}$ include the same as described above, and examples of the C1-C6 alkyl group which may have one or more halogen atoms include a methyl group, an ethyl group, an isopropyl group, a tert-butyl group and a trifluormethyl group.

Examples of the C1-C12 alkyl group and the C1-C12 alkoxy group in $R^{11}$ include the same as described above. Examples of the C1-C12 hydroxyl-substituted alkyl group in $R^{11}$ include a hydroxymethyl group and a 1-hydroxyethyl group. Examples of the C6-C12 aryl group in $R^{11}$ include a phenyl group and a naphthyl group. Examples of the C7-C12 aralkyl group in $R^{11}$ include a benzyl group, a 1-phenylethyl group, a 2-phenylethyl group and a (1-naphthyl)methyl group. Examples of the C2-C4 acyl group in $R^{11}$ include an acetyl group and a propionyl group. Examples of the C2-C4 acyloxy group in $R^{11}$ include an acetyloxy group and a propionyloxy group.

Examples of the C1-C12 saturated hydrocarbon group in $R^{12}$ and $R^{13}$ include the C1-C12 alkyl group. Examples of the C1-C17 saturated hydrocarbon group which may be substituted and in which one or more —$CH_2$— may be replaced by —CO—, —O—, —S—, —$SO_2$— or —$NR^c$— include —$CH_2$—, —$CH_2CH_2$— and —$CH_2CH_2$—O—. Examples of the linear or branched chain C1-C36 aliphatic hydrocarbon group include a methyl group, an ethyl group, an isopropyl group and an n-hexyl group. Examples of the C3-C36 alicyclic hydrocarbon group include a cyclopentyl group, a cyclohexyl group, a norbornyl group, an adamantly group and the following:

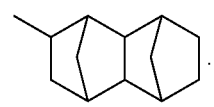

Examples of the C6-C36 aromatic hydrocarbon group include a phenyl group and a naphthyl group. Examples of the substituents of the C1-C36 aliphatic hydrocarbon group, the C3-C36 alicyclic hydrocarbon group and C6-C36 aromatic hydrocarbon group include a C1-C6 alkoxy group such as a methoxy group, and a C6-C12 aryloxy group such as a phenoxy group.

Examples of the monomer represented by the formula (a-4) include the followings.

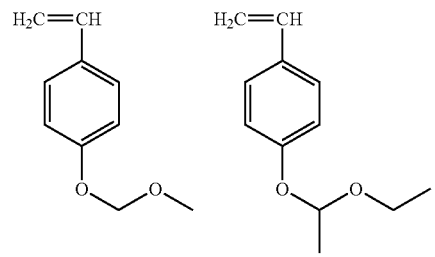

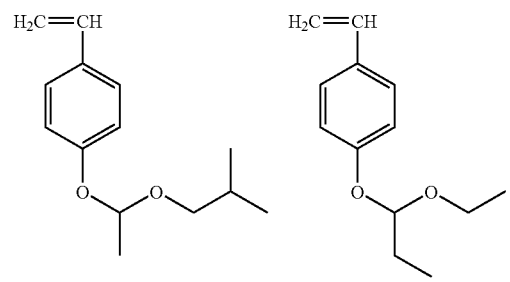

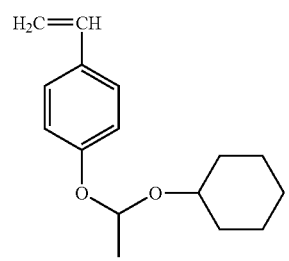

-continued
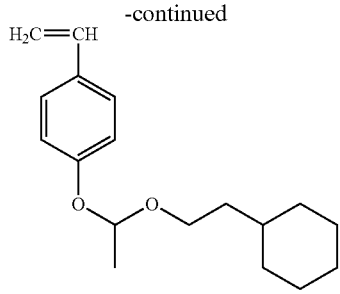
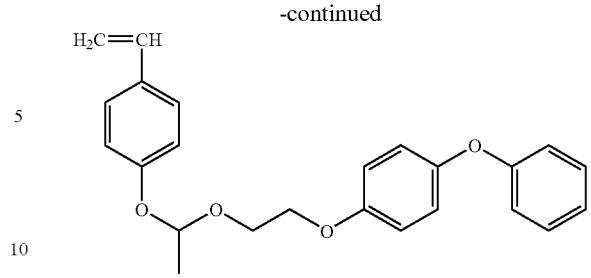
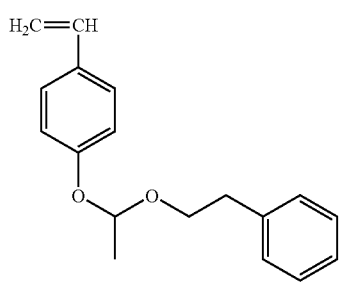
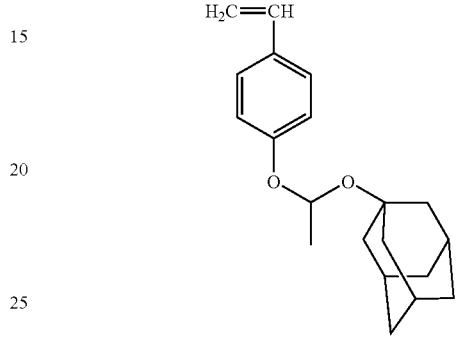
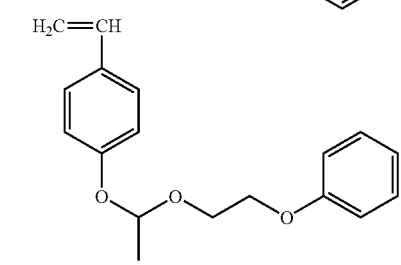
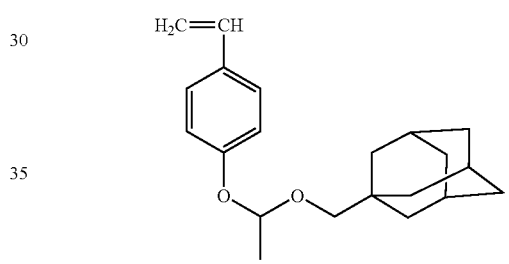
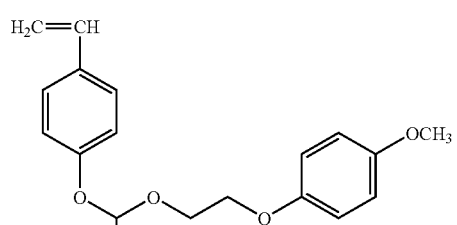
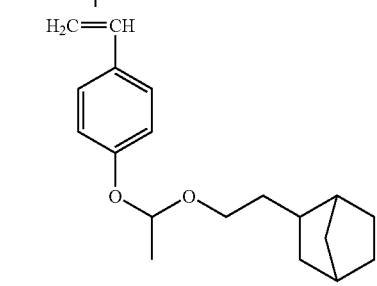
As the structural unit having an acid-labile group, a structural unit represented by the formula (II):
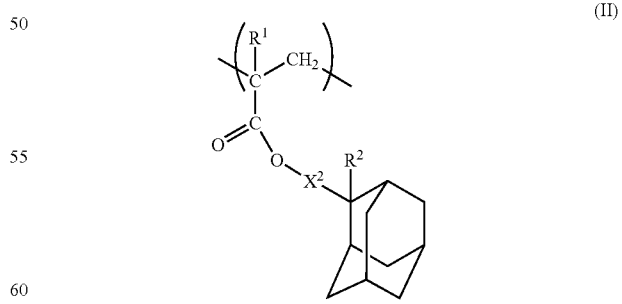
wherein $R^1$ represents a hydrogen atom or a methyl group, $R^2$ represents a C1-C6 alkyl group, $X^2$ represents a single bond or $-(CH_2)_k-CO-O-$, and k represents an integer of 1 to 6, is preferable, and a structural unit represented by the formula (II'):
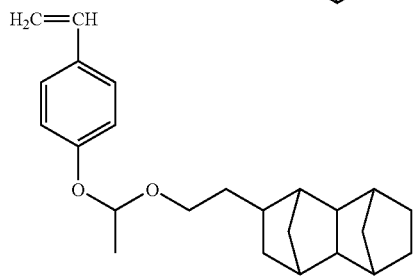

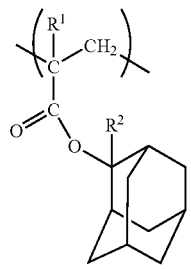

(II')

wherein $R^1$ and $R^2$ are the same meanings as defined above, is more preferable.

Examples of the C1-C6 alkyl group in $R^2$ include a methyl group, an ethyl group, an n-propyl group, an isopropyl group and an n-butyl group.

The monomer giving the structural unit represented by the formula (II) can be usually produced by reacting the corresponding hydroxyl-substituted adamantane with an acrylic halide or a methacrylic halide.

When the resin (I) contains the structural unit having an acid-labile group, the content of the structural unit having an acid-labile group in the resin (I) is usually 5 to 95 mol %, preferably 10 to 85 mol % and more preferable 15 to 70 mol % based on the total molar of all of the structural units.

The resin (I) may contain one or more structural units having an acid-stable group in addition to the structural unit represented by the formula (I). Herein, the "structural unit derived from an acid-stable monomer" means "a structural unit not dissociated by an acid generated from the acid generator".

As the structural unit having an acid-stable group, a structural unit having one or more hydroxyl groups and a structural unit having a lactone ring are preferable because a resolution and an adhesiveness of the resist film tend to be improved.

Examples of the structural unit having one or more hydroxyl groups include a structural unit represented by the formula (VI):

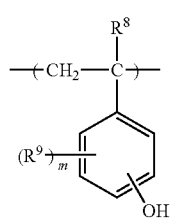

(VI)

wherein $R^8$ represents a hydrogen atom or a C1-C6 alkyl group which may have one or more halogen atoms, $R^9$ is independently in each occurrence a halogen atom, a hydroxyl group, a C1-C12 alkyl group, a C1-C12 hydroxyl-substituted alkyl group, a C1-C12 alkoxy group, a C6-C12 aryl group, a C7-C12 aralkyl group, a glycidyloxy group, a C2-C4 acyl group, a C2-C4 acyloxy group, an acryloyloxy group or a methacryloyloxy group, and m represents an integer of 0 to 4.

Examples of the C1-C6 alkyl group which may have one or more halogen atoms include a methyl group, an ethyl group, an n-propyl group, an isopropyl group, an n-butyl group, an n-pentyl group, an n-hexyl group, a perfluoromethyl group, a perfluoroethyl group, a perfluoropropyl group, a perfluoroisopropyl group, a perfluorobutyl group, a perfluoro-sec-butyl group, a perfluoro-tert-butyl group, a perfluoropentyl group and a perfluorohexyl group.

Examples of the C1-C12 alkyl group, the C1-C12 hydroxyl-substituted alkyl group, the C1-C12 alkoxy group, the C6-C12 aryl group, the C7-C12 aralkyl group, the C2-C4 acyl group and the C2-C4 acyloxy group include the same as described above.

Examples of the monomer giving the structural unit represented by the formula (VI) include the followings.

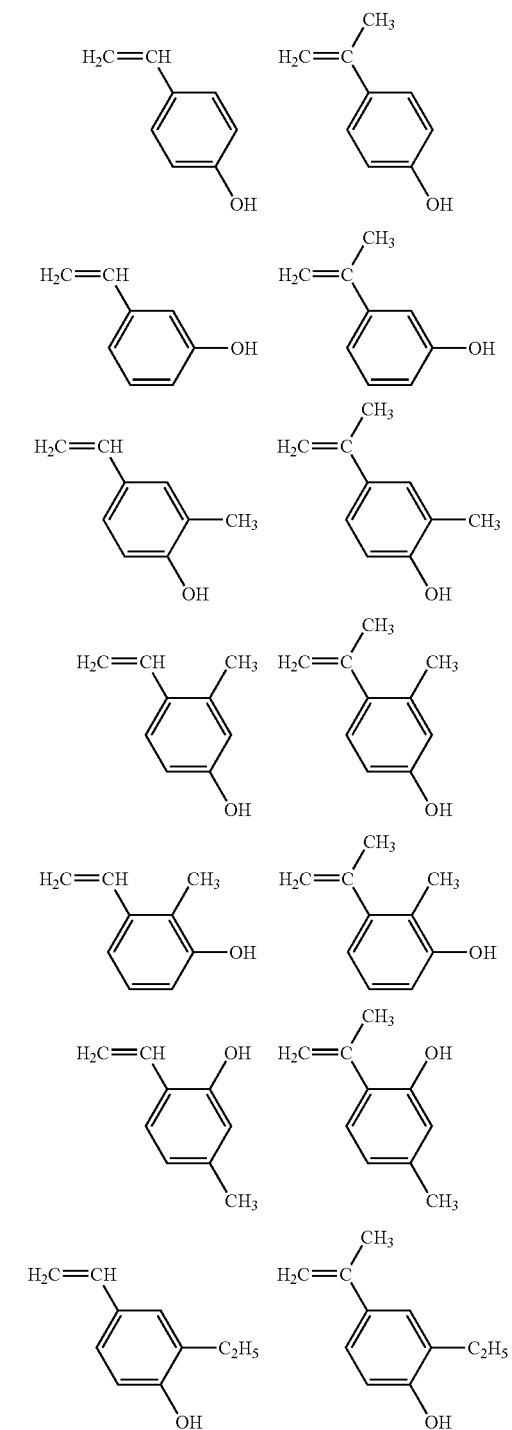

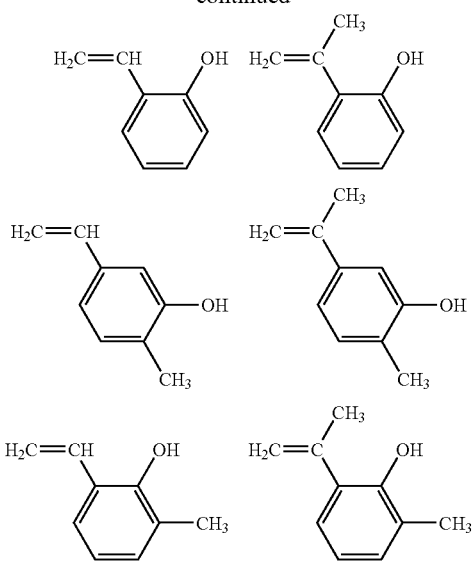

Among them, 4-hydroxystyrene and 4-hydroxy-α-methylstyrene are preferable.

The resin (I) preferably contains the structural unit represented by the formula (VI).

When the resin (I) contains the structural unit represented by the formula (VI), the content of the structural unit represented by the formula (VI) in the resin (I) is usually 1 to 99 mol %, preferably 5 to 90 mol % and more preferably 10 to 70 mol based on the total molar of all of the structural units.

Examples of the other structural unit having one or more hydroxyl groups include a structural unit represented by the formula (VII):

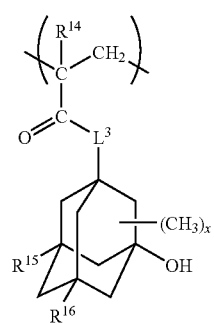

(VII)

wherein $R^{14}$ represents a hydrogen atom or a methyl group, $R^{15}$ and $R^{16}$ each independently represents a hydrogen atom, a methyl group or a hydroxyl group, $L^3$ represents —O— or —O—$(CH_2)_y$CO—O—, y represents an integer of 1 to 6, and x represents an integer of 0 to 10.

In the formula (VII), x is preferably an integer of 0 to 3, and more preferably 0 or 1.

In the formula (VII), $R^{15}$ is preferably a hydrogen atom, and $R^{16}$ is preferably a hydrogen atom or a hydroxyl group, and y is preferably 1.

Examples of the monomers giving the structural unit represented by the formula (VII) include the followings.

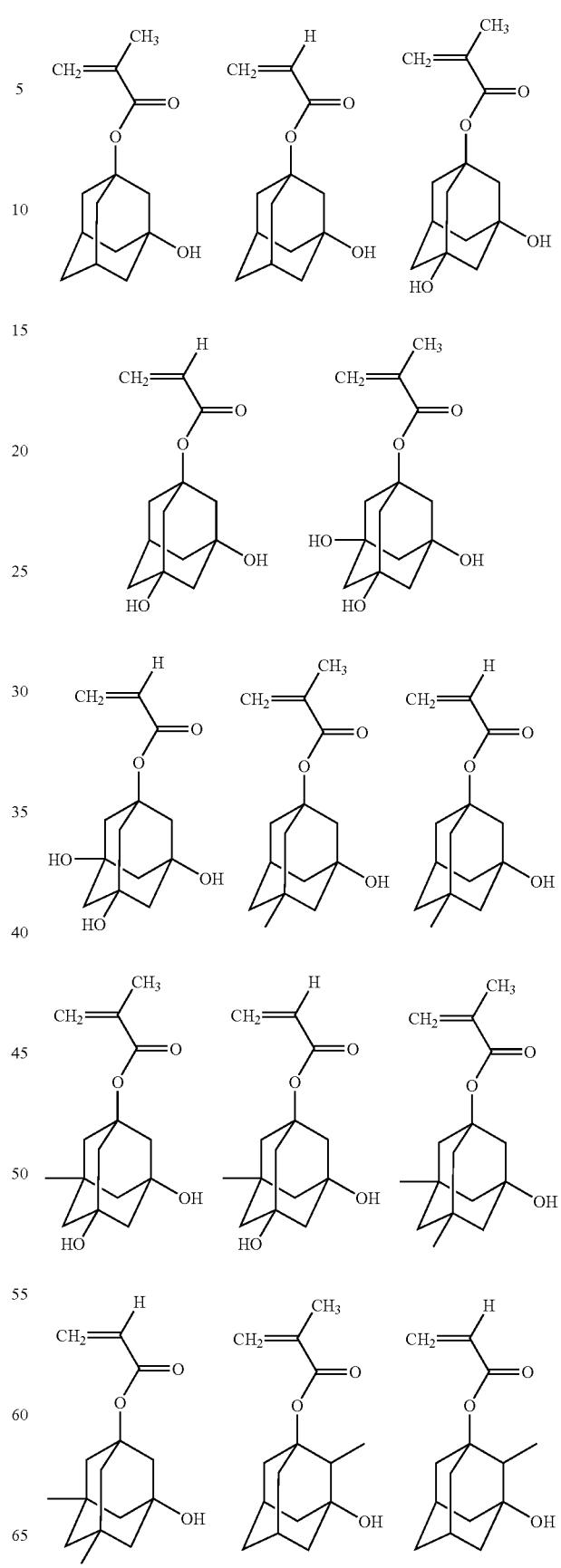

-continued
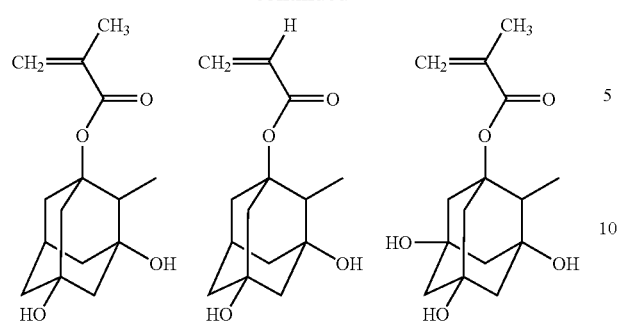
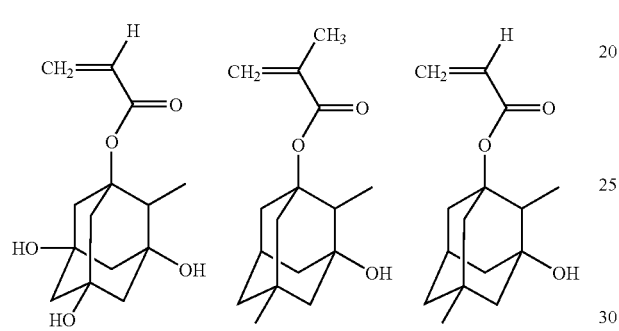
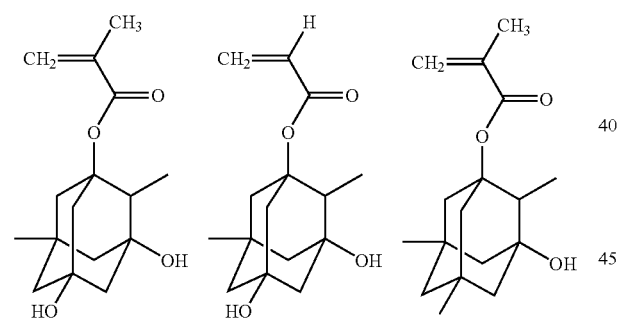
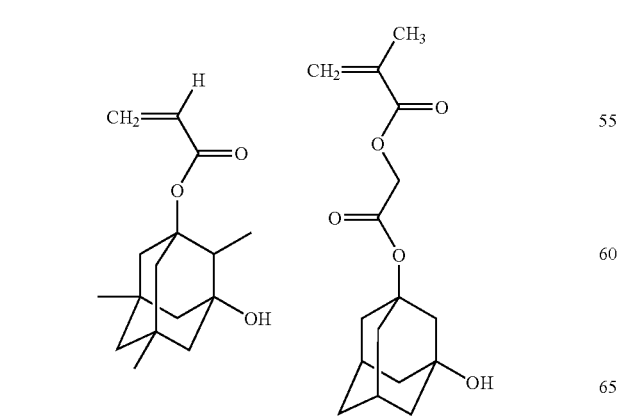
-continued
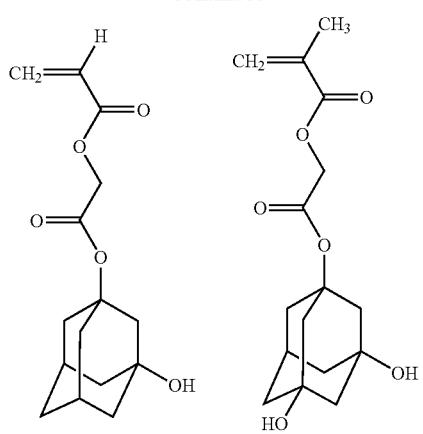
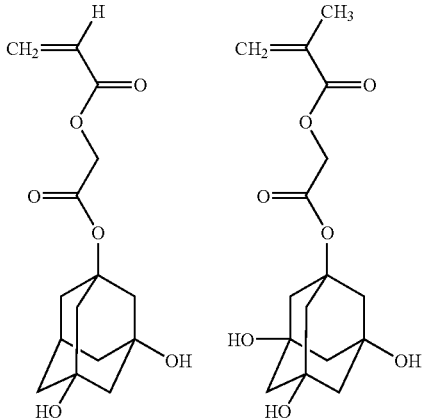
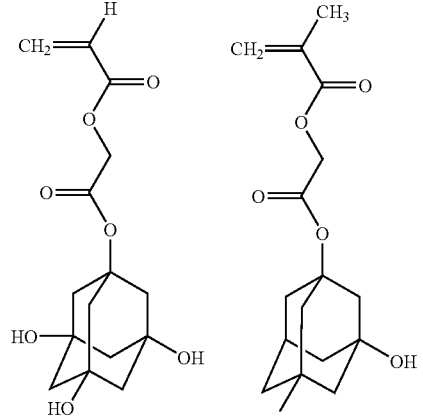
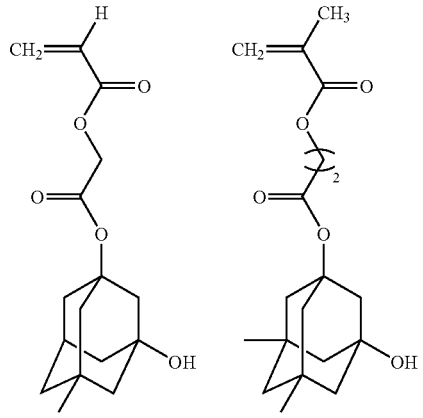

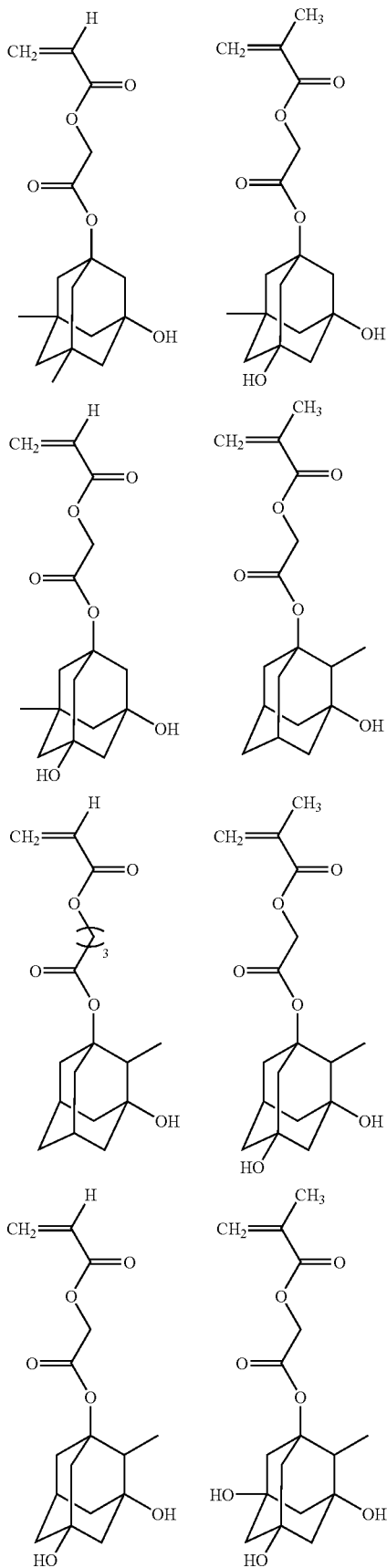

Among them, 3-hydroxy-1-adamantyl acrylate, 3-hydroxy-1-adamantyl methacrylate, 3,5-dihydroxy-1-adamantyl acrylate, 3,5-dihydroxy-1-adamantyl methacrylate, (3,5-dihydroxy-1-adamantyloxycarbonyl)methyl acrylate and (3,5-dihydroxy-1-adamantyloxycarbonyl)methyl methacrylate are preferable, 3-hydroxy-1-adamantyl acrylate, 3-hydroxy-1-adamantyl methacrylate, 3,5-dihydroxy-1-adamantyl acrylate and 3,5-dihydroxy-1-adamantyl methacrylate are more preferably, and 3-hydroxy-1-adamantyl methacrylate and 3,5-dihydroxy-1-adamantyl methacrylate are especially preferable.

The monomer giving the structural unit represented by the formula (VII) can usually be produced by a reaction of the corresponding hydroxyl-containing adamantane compound with an acrylic halide or a methacrylic halide.

When the resin (I) contains the structural unit represented by the formula (VII), the content of the structural unit represented by the formula (VII) in the resin (I) is usually 1 to 50 mol %, preferably 1 to 30 mol % and more preferably 1 to 25 mol % based on the total molar of all of the structural units.

Examples of the other structural unit having a lactone ring include structural units represented by the formulae (VIII-1) to (VIII-3):

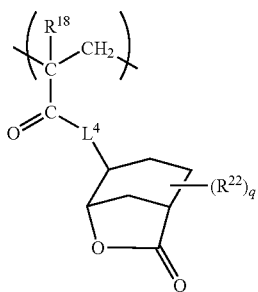

(VIII-3)

wherein $R^{18}$ represents a hydrogen atom or a methyl group, $R^{21}$ is independently in each occurrence a C1-C4 aliphatic hydrocarbon group, $L^4$ represents —O— or —O—$(CH_2)_z$—CO—O—, z represents an integer of 1 to 6, $R^{22}$ is independently in each occurrence a carboxyl group, a cyano group, or a C1-C4 aliphatic hydrocarbon group, p represents an integer of 0 to 5, and q represents an integer of 0 to 3.

$L^4$ is preferably —O— or —O—$CH_2$—CO—O—, and more preferably —O—.

$R^{21}$ is preferably a methyl group, and p is preferably 0 to 2, and more preferably 0 or 1. $R^{22}$ is preferably a methyl group, a carboxyl group or a cyano group, and q is preferably 0 to 2, and more preferably 0 or 1.

Examples of the monomer giving the structural units represented by the formulae (VIII-1) to (VIII-3) include the followings.

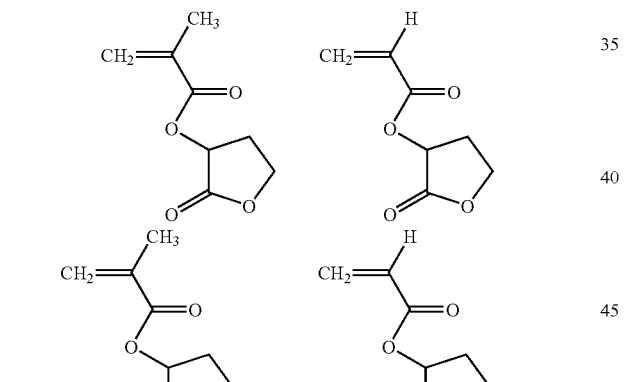
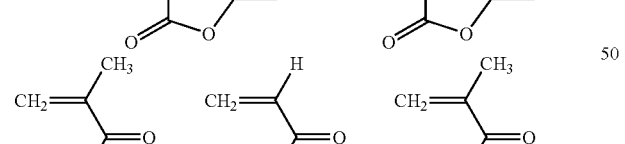
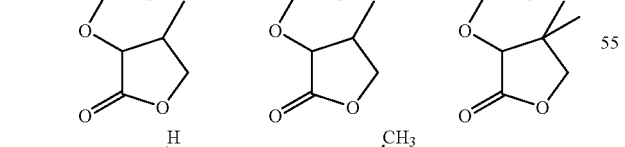
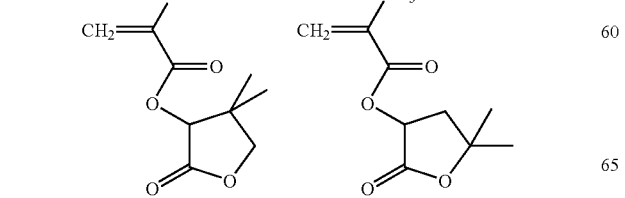

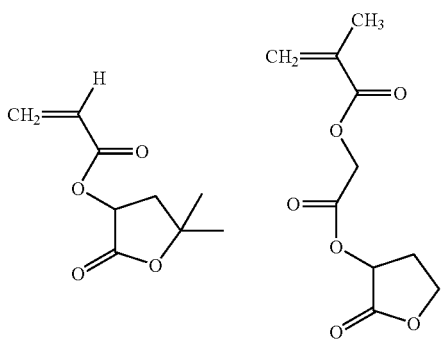
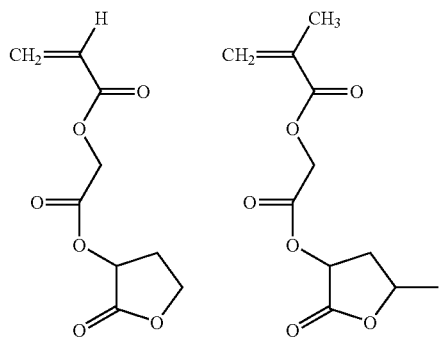
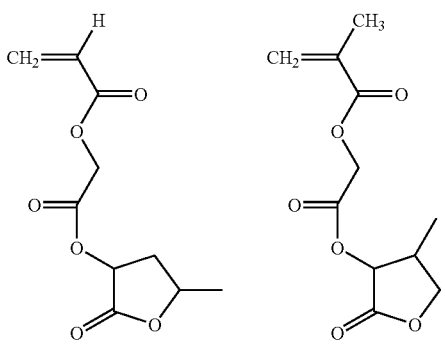
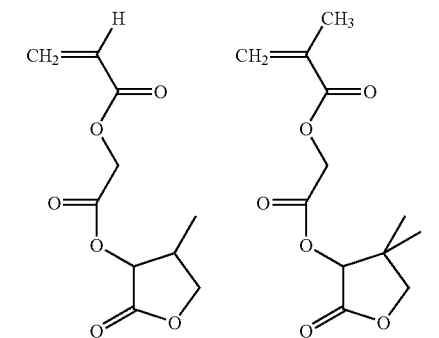
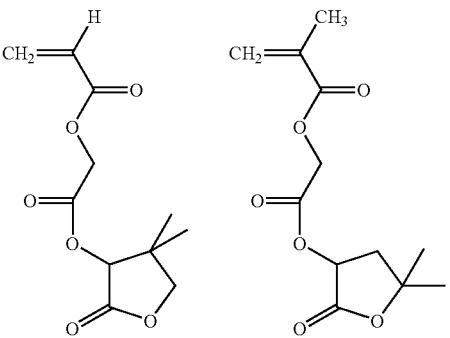

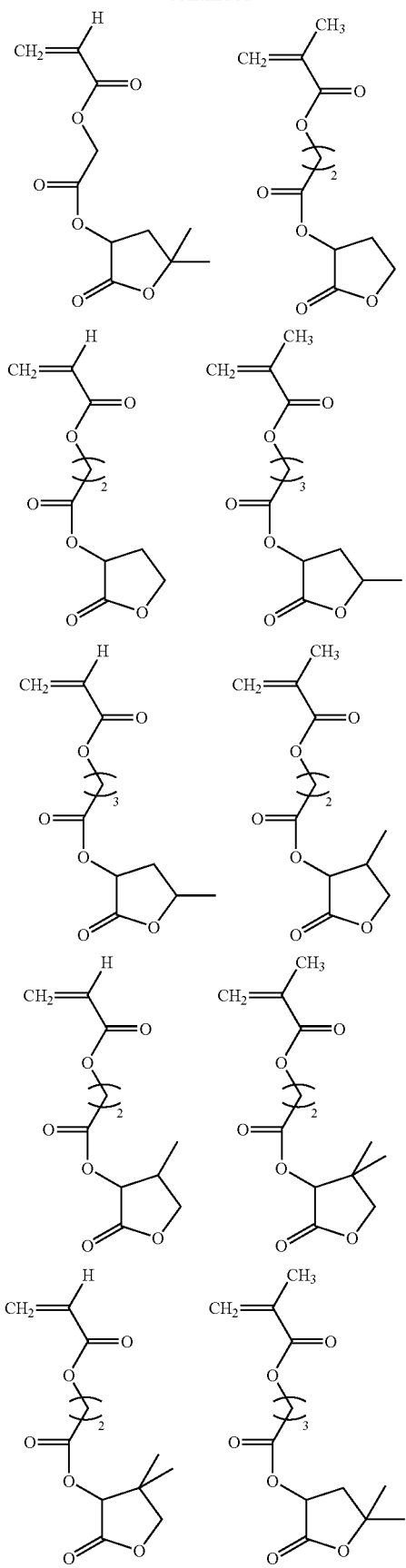
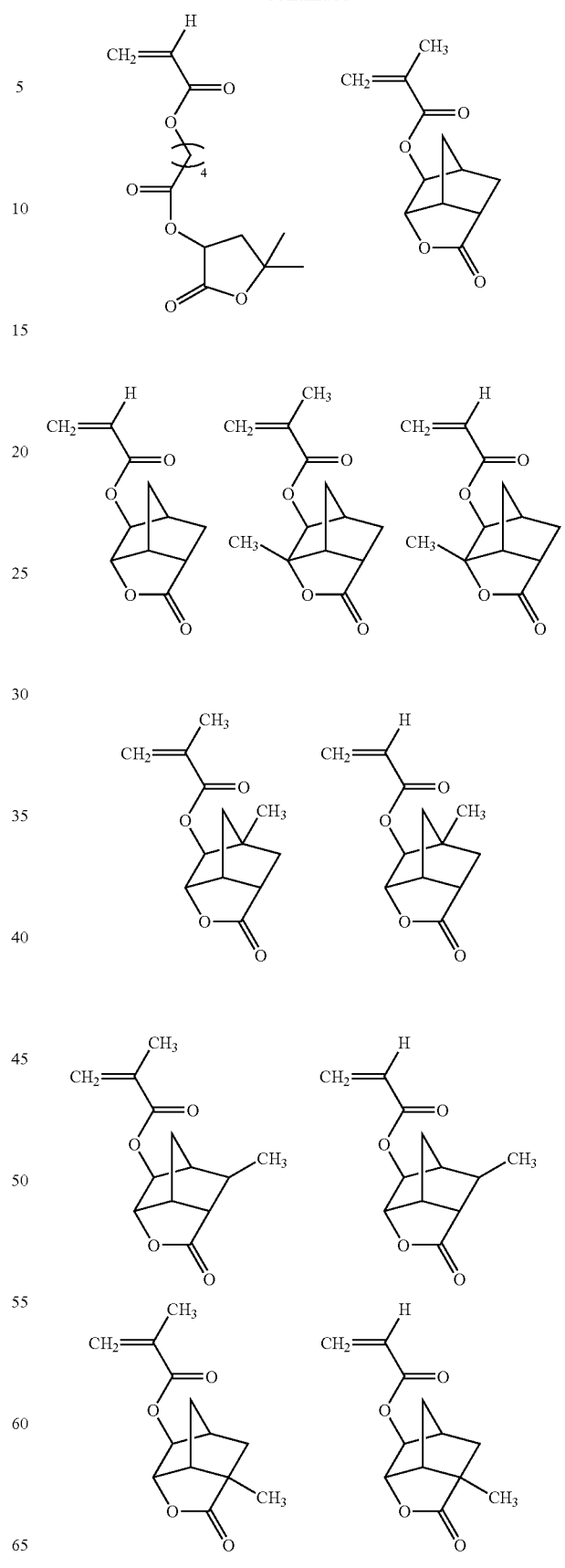

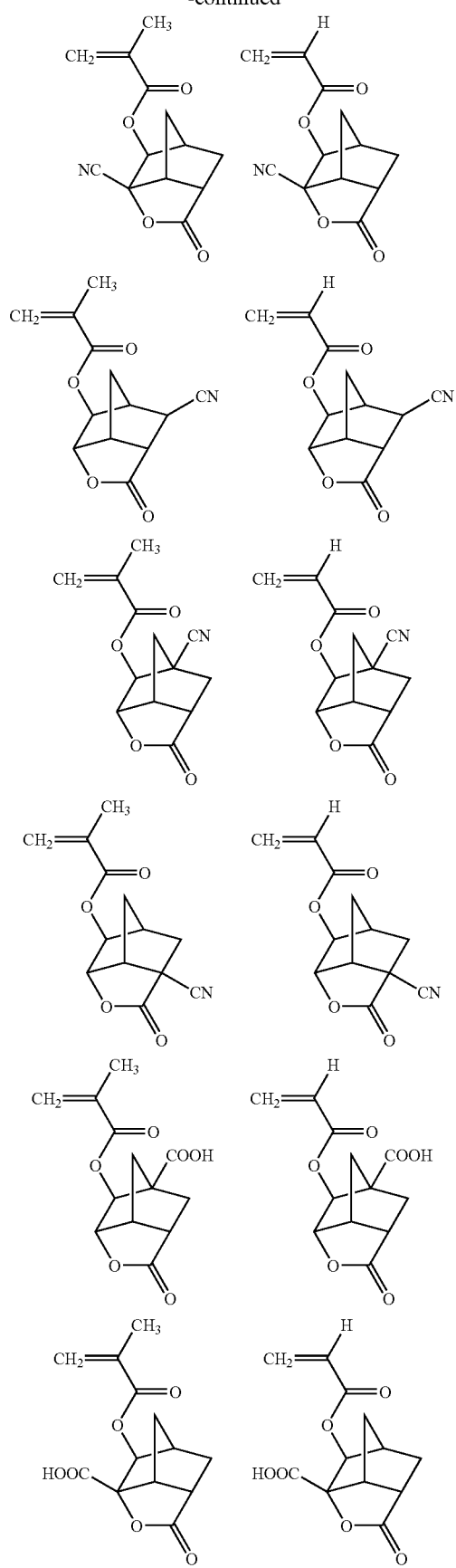
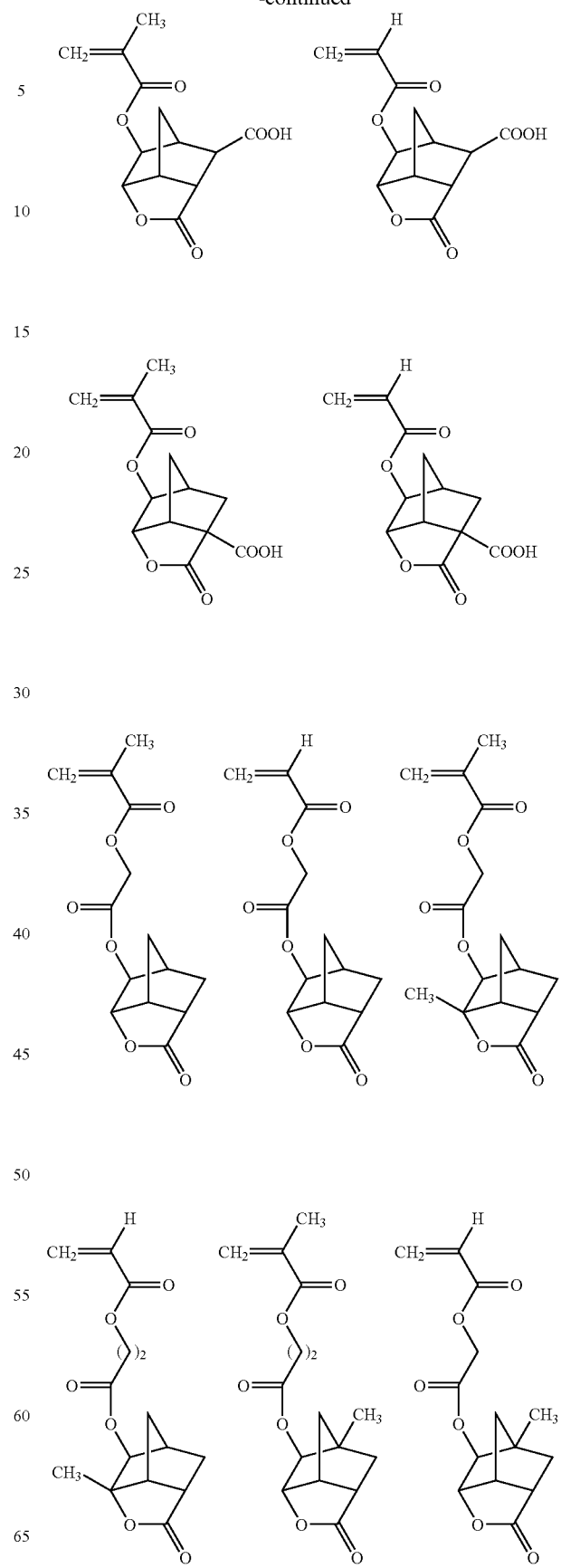

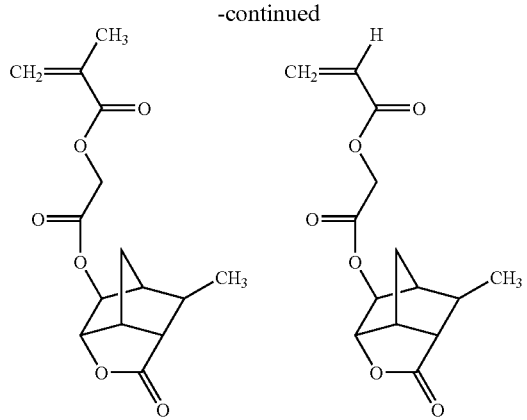
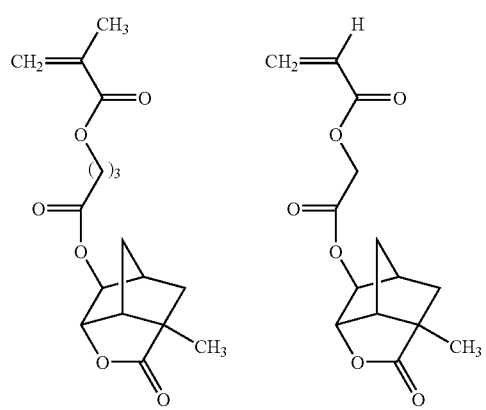
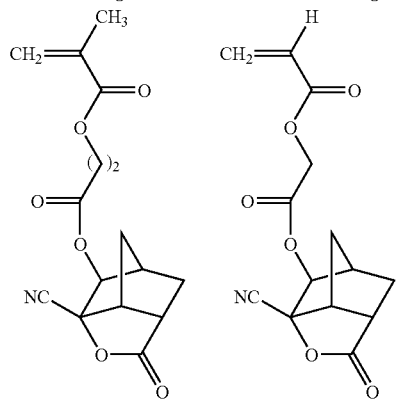
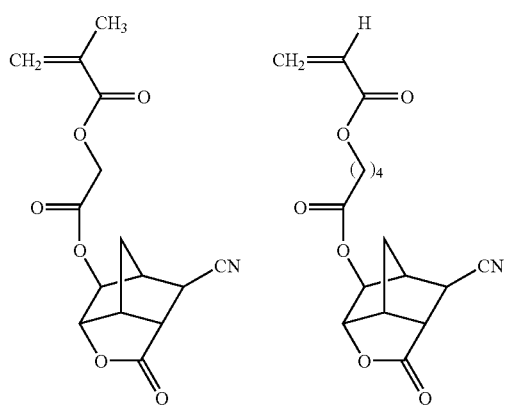
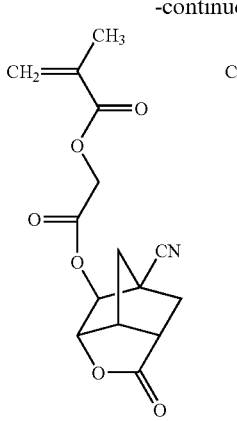
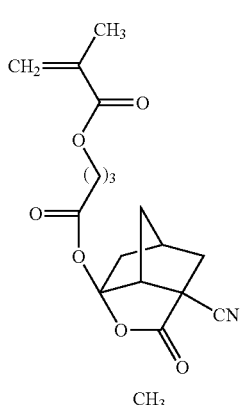
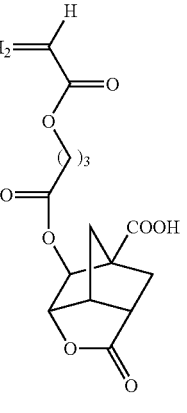
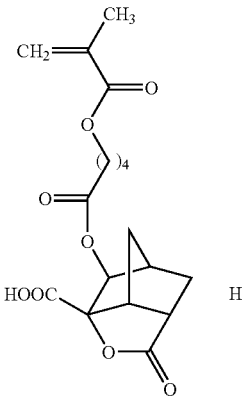

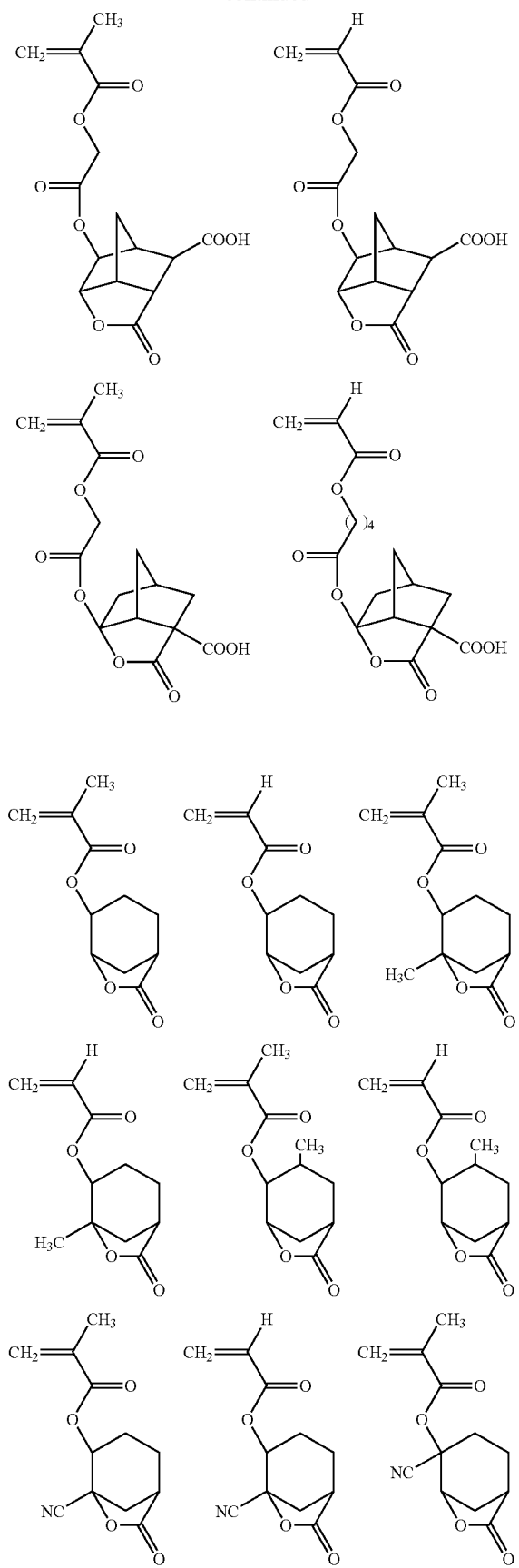
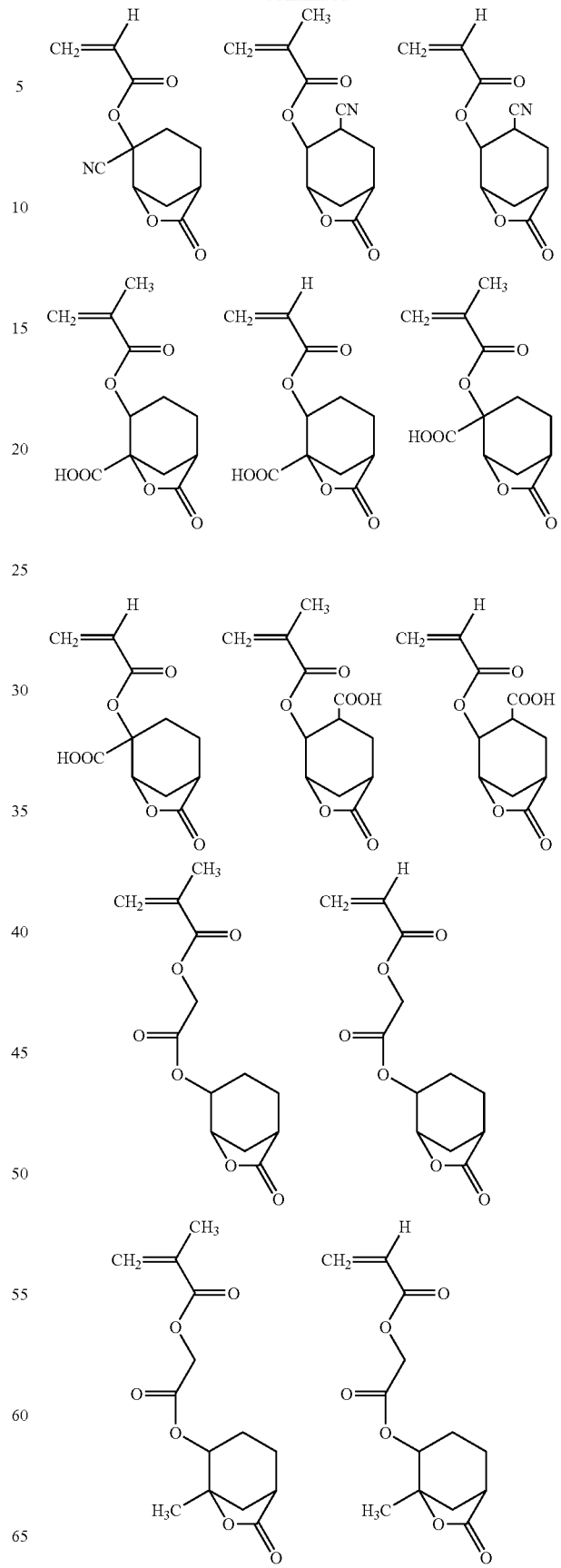

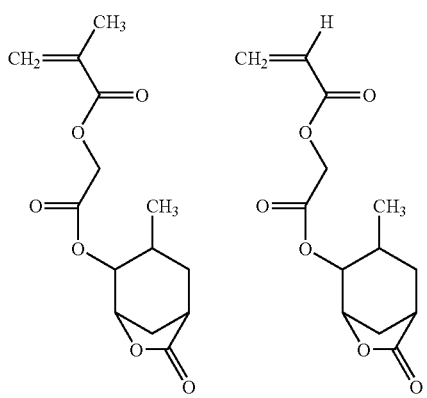
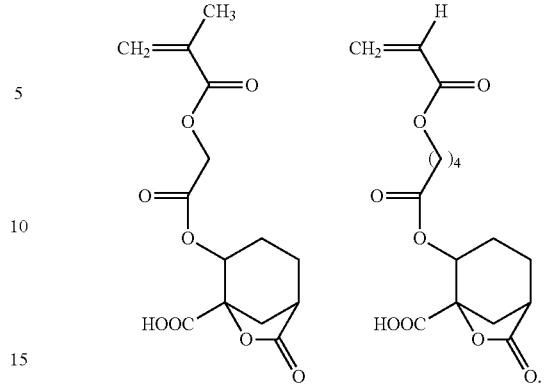
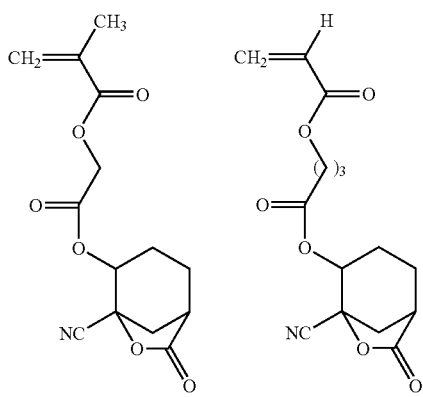
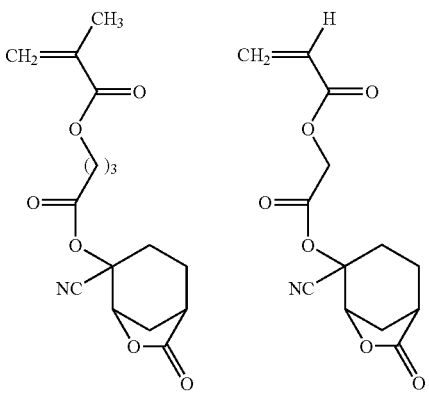
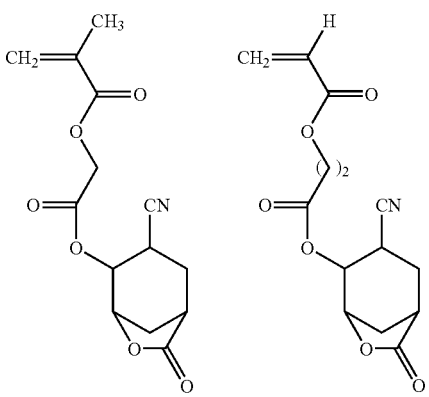

Among them, 5-oxo-4-oxatricyclo[4.2.1.0$^{3,7}$]nonan-2-yl acrylate, 5-oxo-4-oxatricyclo[4.2.1.0$^{3,7}$]nonan-2-yl methacrylate, tetrahydro-2-oxo-3-furyl acrylate, tetrahydro-2-oxo-3-furyl methacrylate, 2-(5-oxo-4-oxatricyclo[4.2.1.0$^{3,7}$]nonan-2-yloxy)-2-oxoethyl acrylate and 2-(5-oxo-4-oxatricyclo[4.2.1.0$^{3,7}$]nonan-2-yloxy)-2-oxoethyl methacrylate are preferable and 5-oxo-4-oxatricyclo[4.2.1.0$^{3,7}$]nonan-2-yl methacrylate, tetrahydro-2-oxo-3-furyl methacrylate and 2-(5-oxo-4-oxatricyclo[4.2.1.0$^{3,7}$]nonan-2-yloxy)-2-oxoethyl methacrylate are more preferable.

The monomers giving the structural units represented by the formulae (VIII-1) to (VIII-3) can usually be produced by a reaction of the corresponding hydroxyl-containing lactone compound with an acrylic halide or methacrylic halide.

When the resin (I) contains the structural unit having a lactone ring, the content of the structural unit having a lactone ring in the resin (I) is usually 1 to 50 mol %, preferably 1 to 30 mol % and more preferably 1 to 20 mol % based on the total molar of all of the structural units.

The resin (I) may have a structural unit derived from a monomer represented by the followings, which is a monomer having an acid-labile group.

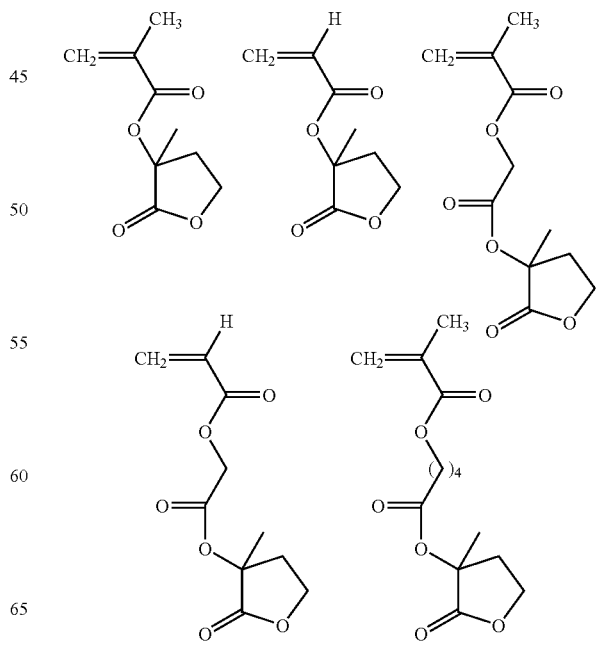

-continued

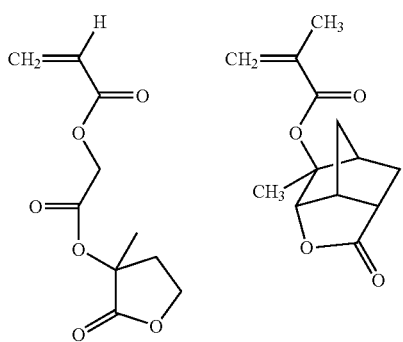

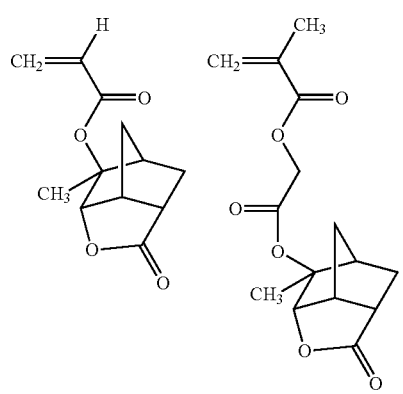

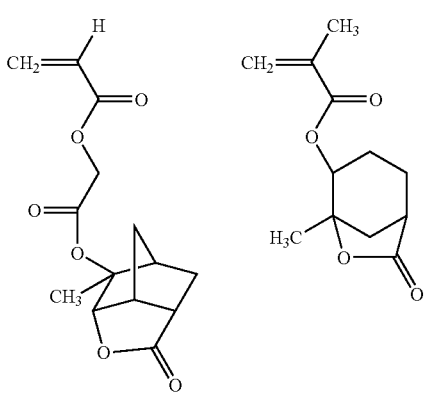

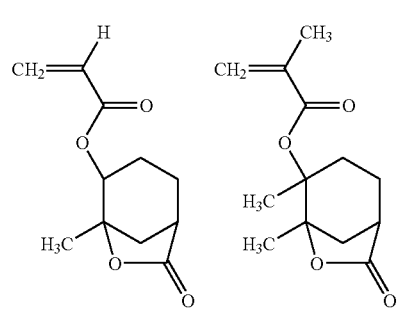

-continued

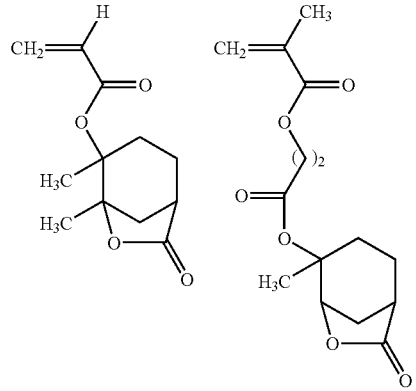

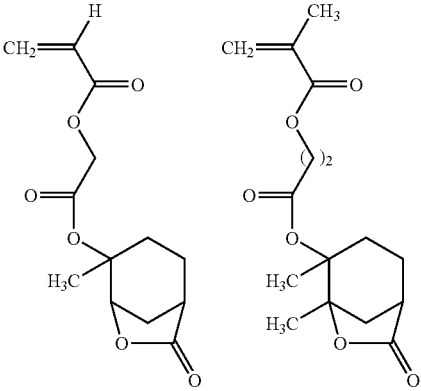

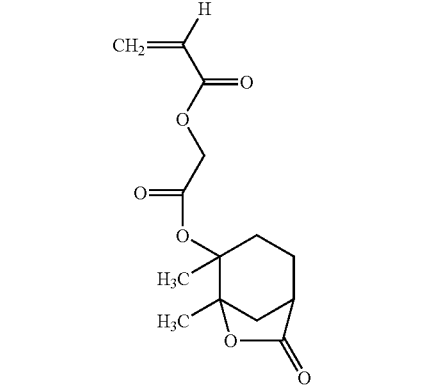

The weight-average molecular weight of the resin (I) is usually 500 to 100,000 and preferably 1,000 to 30,000.

The present chemically amplified resist composition comprises the resin (I) and a solvent.

In the present resist composition, the amount of the solvent is usually 1 to 1,000 parts by weight and preferably 50 to 500 parts by weight per 1 part by weight of the resin (I).

The solvent is sufficient to dissolve the resin (I) and the other ingredients contained in the resist composition, have an adequate drying rate, and give a uniform and smooth coat after evaporation of the solvent. Solvents generally used in the art can be used. Examples of the solvent include a glycol ether ester such as ethyl cellosolve acetate, methyl cellosolve acetate and propylene glycol monomethyl ether acetate; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone. These solvents may be used alone and two or more thereof may be mixed to use.

The resin (I) is decomposed to generate an acid by applying a radiation such as a light, an electron beam or the like on the resin (I) itself or on a resist composition containing the resin (I). The resin (I) acts not only as a resin component but also as an acid generator in the present resist composition.

While the resin (I) also acts as an acid generator in the present resist composition as described above, the present resist composition may contain the other acid generator. The acid generator can be selected from various compounds generating an acid by irradiation with radiation to the acid generator itself or a resist composition containing the acid generator. Examples of the acid generator include an onium salt, a halogenated alkyltriazine compound, a disulfone compound, a diazomethane compound having a sulfonyl group, a sulfonate compound and an imide compound having a sulfonyloxy group.

Examples of the onium salt include an onium salt in which one or more nitro groups are contained in an anion, an onium salt in which one or more ester groups are contained in an anion. Examples of the onium salt include diphenyliodonium trifluoromethanesulfonate, (4-methoxyphenyl)phenyliodonium hexafluoroantimonate, (4-methoxyphenyl)phenyliodonium trifluoromethanesulfonate, bis(4-tert-butylphenyl)iodonium tetrafluoroborate, bis(4-tert-butylphenyl)iodonium hexafluorophosphate, bis(4-tert-butylphenyl)iodonium hexafluoroantimonate, bis(4-tert-butylphenyl)iodonium trifluoromethanesulfonate, triphenylsulfonium hexafluorophosphate, triphenylsulfonium hexafluoroantimonate, triphenylsulfonium (1-adamantylmethoxy)carbonyldifluoromethanesulfonate, triphenylsulfonium (3-hydroxymethyl-1-adamantyl)methoxycarbonyldifluoromethanesulfonate, triphenylsulfonium 1-(hexahydro-2-oxo-3,5-methano-2H-cyclopenta[b]furan-6-yloxycarbonyl)difluoromethanesulfonate, triphenylsulfonium (4-oxo-1-adamantyloxy)carbonyldifluoromethanesulfonate, triphenylsulfonium (3-hydroxy-1-adamantyl)methoxycarbonyldifluoromethanesulfonate, (4-methylphenyl)diphenylsulfonium nonafluorobutanesulfonate, (4-methoxyphenyl)diphenylsulfonium hexafluoroantimonate, (4-methoxyphenyl)diphenylsulfonium trifluoromethanesulfonate, (4-methylphenyl) diphenylsulfonium trifluoromethanesulfonate, (4-methylphenyl)diphenylsulfonium heptadecafluorooctanesulfonate, (2,4,6-trimethylphenyl)diphenylsulfonium trifluoromethanesulfonate, (4-tert-butylphenyl)diphenylsulfonium trifluoromethanesulfonate, (4-phenylthiophenyl)diphenylsulfonium hexafluorophosphate, (4-phenylthiophenyl)diphenylsulfonium hexafluoroantimonate, 1-(2-naphthoylmethyl)thiolanium hexafluoroantimonate, 1-(2-naphthoylmethyl)thiolanium trifluoromethanesulfonate, (4-hydroxy-1-naphthyl)dimethylsulfonium hexafluoroantimonate and (4-hydroxy-1-naphthyl)dimethylsulfonium trifluoromethanesulfonate.

Examples of the halogenated alkyltriazine compound include 2-methyl-4,6-bis(trichloromethyl)-1,3,5-triazine, 2,4,6-tris(trichloromethyl)-1,3,5-triazine, 2-phenyl-4,6-bis(trichloromethyl)-1,3,5-triazine, 2-(4-chlorophenyl)-4,6-bis(trichloromethyl)-1,3,5-triazine, 2-(4-methoxyphenyl)-4,6-bis(trichloromethyl)-1,3,5-triazine, 2-(4-methoxy-1-naphthyl)-4,6-bis(trichloromethyl)-1,3,5-triazine, 2-(benzo[d][1,3]dioxoran-5-yl)-4,6-bis(trichloromethyl)-1,3,5-triazine, 2-(4-methoxystyryl)-4,6-bis(trichloromethyl)-1,3,5-triazine, 2-(3,4,5-trimethoxystyryl)-4,6-bis(trichloromethyl)-1,3,5-triazine, 2-(3,4-dimethoxystyryl)-4,6-bis(trichloromethyl)-1,3,5-triazine, 2-(2,4-methoxystyryl)-4,6-bis(trichloromethyl)-1,3,5-triazine, 2-(2-methoxystyryl)-4,6-bis(trichloromethyl)-1,3,5-triazine, 2-(4-butoxystyryl)-4,6-bis(trichloromethyl)-1,3,5-triazine and 2-(4-pentyloxystyryl)-4,6-bis(trichloromethyl)-1,3,5-triazine.

Examples of the sulfonate compound include 1-benzoyl-1-phenylmethyl p-toluenesulfonate (generally called "benzoin tosylate"), 2-benzoyl-2-hydroxy-2-phenylethyl p-toluenesulfonate (generally called "α-methylolbenzoin tosylate"), 1,2,3-benzene-tri-yl tris(methanesulfonate), 2,6-dinitrobenzyl p-toluenesulfonate, 2-nitrobenzyl p-toluenesulfonate and 4-nitrobenzyl p-toluenesulfonate.

Examples of the disulfone compound include diphenyl disulfone and di(p-tolyl) disulfone.

Examples of the diazomethane compound having a sulfonyl group include bis(phenylsulfonyl)diazomethane, bis(4-chlorophenylsulfonyl)diazomethane, bis(p-tolylsulfonyl)diazomethane, bis(4-tert-butylphenylsulfonyl)diazomethane, bis(2,4-xylylsulfonyl)diazomethane, bis(cyclohexylsulfonyl)diazomethane and (benzoyl)(phenylsulfonyl)diazomethane.

Examples of the imide compound having a sulfonyloxy group include N-(phenylsulfonyloxy)succinimide, N-(trifluoromethylsulfonyloxy)succinimide, N-(trifluoromethylsulfonyloxy)phthalimide, N-(trifluoromethylsulfonyloxy)-5-norbornene-2,3-dicarboxyimide, N-(trifluoromethylsulfonyloxy) naphthalimide and N-(10-camphorsulfonyloxy) naphthalimide The acid generator may be used alone or a mixture of two or more thereof may be used.

The amount of the acid generator is usually 0.01 to 1 part by weight, preferably 0.05 to 0.9 part by weight and more preferably 0.3 to 0.75 part by weight per 1 part by weight of the resin (I).

The present resist composition may contain one or more resins other than the resin (I). The resin other than the resin (I) is also preferably one being insoluble or poorly soluble in an aqueous alkali solution but becoming soluble in an aqueous alkali solution by the action of an acid. This resin preferably contains one or more structural units having an acid-labile group.

Examples of the structural units having an acid-labile group include the same as described for the resin (I) above.

The resin other than the resin (I) preferably contains at least one structural unit selected from the group consisting of the structural unit represented by the formulae (II) and (VI). The resin may contain the structural units represented by the formulae (VII) and (VIII-1) to (VIII-3).

The ratio of the resin other than the resin (I) to the resin (I) (the resin other than the resin (I)/the resin (I)) is usually 1/10 to 10/1 and preferably 1/3 to 3/1.

In the present resist composition, performance deterioration caused by inactivation of acid which occurs due to post exposure delay can be diminished by adding an organic base compound, particularly a nitrogen-containing organic base compound as a quencher.

Specific examples of the nitrogen-containing organic base compound include n-hexylamine, n-heptylamine, n-octylamine, n-nonylamine, n-decylamine, aniline, 2-methylaniline, 3-methylaniline, 4-methylaniline, 4-nitroaniline, 1-naphthylamine, 2-naphthylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptylamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, dicyclohexylmethylamine, tris[2-(2-methoxyethoxy)ethyl]amine, triisopropanolamine, N,N-dimethylaniline, 2,6-diisopropylaniline, imidazole, benzimidazole, pyridine, 4-methylpyridine, 4-methylimidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(4-pyridyloxy)ethane, 4,4'-dipyridyl sulfide, 4,4'-dipyridyl disulfide, 1,2-bis(4-pyridyl)ethylene, 2,2'-dipicolylamine, 3,3'-dipicolylamine, tetramethylammonium hydroxide, tetrabutylammonium hydroxide, tetrahexylammonium hydroxide, tetraoctylammonium hydroxide, phenyltrimethylammonium hydroxide, (3-trifluoromethylphenyl)trimethylammonium hydroxide and (2-hydroxyethyl)trimethylammonium hydroxide (so-called "choline").

When the basic compound is used as the quencher, the present resist composition preferably includes 0.001 to 10 parts by weight and more preferably includes 0.01 to 5 parts by weight of the basic compound per 100 parts by weight of the resin (I).

The present resist composition can contain, if necessary, a small amount of various additives such as a sensitizer, a dissolution inhibitor, other polymers, a surfactant, a stabilizer and a dye as long as the effect of the present invention is not prevented.

A resist film applied onto the substrate and then dried is subjected to exposure for patterning, then heat-treated to facilitate a deblocking reaction, and thereafter developed with an alkali developer. The alkali developer used may be any one of various alkaline aqueous solution used in the art. Generally, an aqueous solution of tetramethylammonium hydroxide or (2-hydroxyethyl)trimethylammonium hydroxide (commonly known as "choline") is often used.

The process for producing a resist pattern of the present invention comprises the following steps (1) to (5):

Step (1): a step of coating the chemically amplified resist composition of the present invention on the substrate to obtain a resist film, Step (2): a step of prebaking the resist film, Step (3): a step of exposing the prebaked resist film, Step (4): a step of conducting a post-exposure baking of the exposed resist film, Step (5): a step of developing the resist film with an aqueous solution to obtain a resist pattern.

These steps are usually conducted according to known process for producing a resist pattern. Especially, the resist composition of the present invention is suitable for extreme ultraviolet (EUV) lithography, X-ray lithography and electron beam lithography.

It should be construed that embodiments disclosed here are examples in all aspects and not restrictive. It is intended that the scope of the present invention is determined not by the above descriptions but by appended claims, and includes all variations of the equivalent meanings and ranges to the claims.

The present invention will be described more specifically by way of examples, which are not construed to limit the scope of the present invention. The "%" and "part (s)" used to represent the content of any component and the amount of any material used in the following examples and comparative examples are on a weight basis unless otherwise specifically noted.

Synthetic Example 1

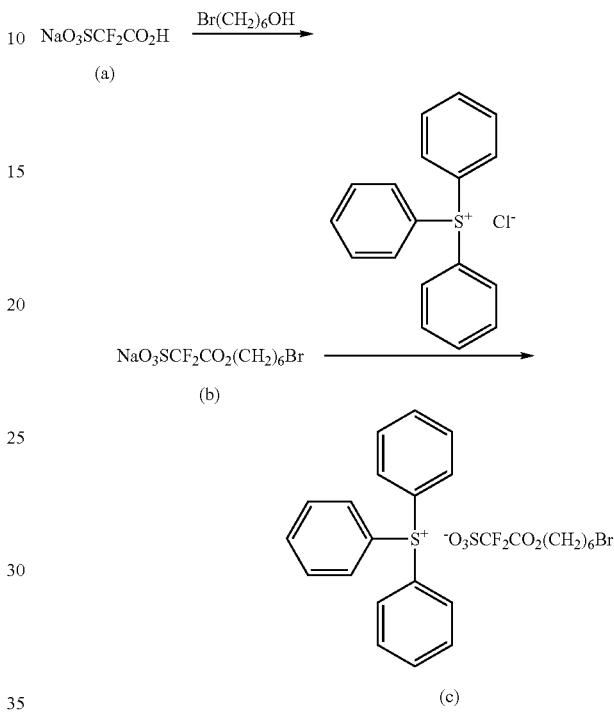

(1) To 50 g of toluene, 10 g of the compound represented by the formula (a) and 10.8 g of 6-bromohexanol were added, and then, a catalytic amount of trifluoromethanesulfonic acid was added to the resultant mixture. The obtained mixture was heated under reflux for 9 hours. The reaction mixture was cooled and the precipitate was filtrated. The obtained precipitate was washed with a little amount of toluene and dried to obtain 12.3 g of the compound represented by the formula (b). Yield: 72.0%.

$^1$H-NMR (CDCl$_3$; tetramethylsilane (TMS) as internal standard): δ (ppm) 4.35 (2H), 3.42 (t, 2H, J=6.9 Hz), 1.86 (m, 2H), 1.73 (m, 2H), 1.47 (m, 2H), 1.40 (m, 2H)

MS (ESI(-) Spectrum): M$^-$=337 (C$_8$H$_{12}$BrF$_2$O$_5$S$^-$= 336.96)

(2) Twelve point one grams of the compound represented by the formula (b) was dissolved in 200 g of chloroform. To the obtained solution, 84.1 g of 13.1% aqueous solution of triphenylsulfonium chloride was added and then, the resultant mixture was stirred at room temperature over night. The reaction mixture was separated to an organic layer and an aqueous layer. The organic layer was washed with ion-exchanged water and concentrated to obtain 17.2 g of the compound represented by the formula (c). Yield: 85.3%.

$^1$H-NMR (dimethyl sulfoxide-d$_6$; TMS as internal standard): δ (ppm) 7.77-7.68 (m, 15H), 4.25 (t, 2H, J=6.9 Hz), 3.37 (t, 2H, J=6.9 Hz), 1.81 (m, 2H), 1.70 (m, 2H), 1.45-1.36 (m, 4H)

$^{19}$F-NMR (dimethyl sulfoxide-d$_6$; fluorobenzene as internal standard): δ (ppm) -106.42

MS (ESI(−) Spectrum): M⁻=337 (C$_8$H$_{12}$BrF$_2$O$_5$S⁻= 336.96)

MS (ESI(+) Spectrum): M⁺=263 (C$_{18}$H$_{15}$S⁺=263.09)

Example 1

Hundred grams of acetone, 14.6 g of a copolymer of p-hydroxystyrene and 2-ethyl-2-adamantyl methacrylate wherein molar ratio of the structural units (Structural unit derived from p-hydroxystyrene: Structural unit derived from 2-ethyl-2-adamantyl methacrylate) was 80:20, Mw was 7,324, and Mw/Mn was 1.58, 6.0 g of the compound represented by the formula (c) and 2.1 g of potassium carbonate were mixed and the resultant mixture was heated under reflux for 2 hours. The reaction mixture was cooled and neutralized with 2% aqueous oxalic acid solution followed by extracting with chloroform. The obtained organic layer was washed with ion-exchanged water and then concentrated to obtain 7.1 g of a resin. This resin had the following structural units represented by the formulae (d), (e) and (f). This is called as Resin A1.

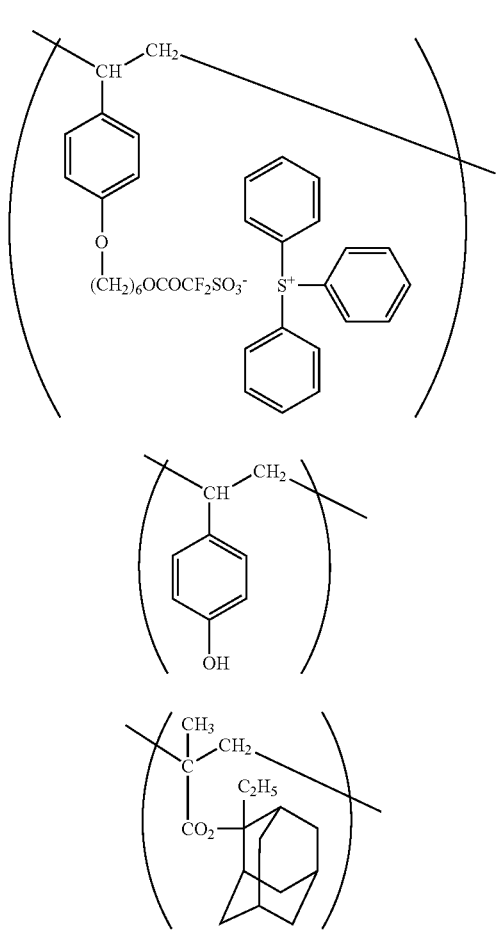

(d)

(e)

(f)

Molar ratio of the structural units in Resin A1 was measured with NMR and the result thereof was as followed: Structural unit represented by the formula (d):Structural unit represented by the formula (e):Structural unit represented by the formula (f)=15:65:20.

Synthetic Example 2

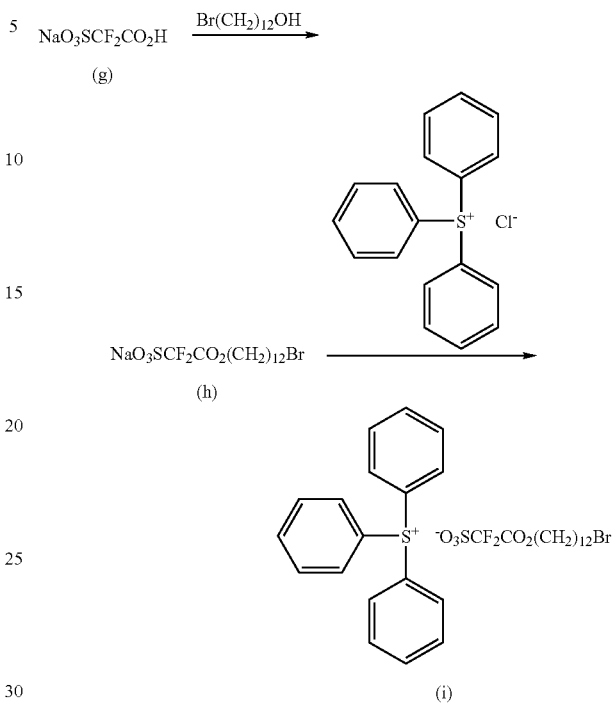

(1) To 300 g of toluene, 21 g of the compound represented by the formula (g) and 25 g of 12-bromododecanol were added, and then, a catalytic amount of p-toluenesulfonic acid was added to the resultant mixture. The obtained mixture was heated under reflux for 13 hours. The reaction mixture was cooled and the precipitate was filtrated. The obtained precipitate was washed with a little amount of toluene and dried to obtain 34.1 g of the compound represented by the formula (h). Yield: 81.2%.

$^1$H-NMR (CDCl$_3$; TMS as internal standard): δ (ppm) 4.33 (t, 2H, J=6.9 Hz), 3.40 (t, 2H, J=6.9 Hz), 1.85 (m, 2H), 1.78-1.10 (m, 18H)

MS (ESI(−) Spectrum): M⁻=421 (C$_{14}$H$_{24}$BrF$_2$O$_5$S⁻= 421.05)

(2) Thirty four point one grams of the compound represented by the formula (h) was dissolved in 200 g of chloroform. To the obtained solution, 192 g of 13.1% aqueous solution of triphenylsulfonium chloride was added and then, the resultant mixture was stirred at room temperature overnight. The reaction mixture was separated to an organic layer and an aqueous layer. The organic layer was washed with ion-exchanged water and concentrated to obtain 48.7 g of the compound represented by the formula (I). Yield: 92.7%.

$^1$H-NMR (dimethyl sulfoxide-d$_6$; TMS as internal standard): δ (ppm) 7.87-7.76 (m, 15H), 4.17 (t, 2H, J=6.9 Hz), 3.50 (t, 2H, J=6.9 Hz), 1.75 (m, 2H), 1.57 (m, 2H), 1.37-1.23 (m, 16H)

$^{19}$F-NMR (dimethyl sulfoxide-d$_6$; fluorobenzene as internal standard): δ (ppm) −105.19

MS (ESI(−) Spectrum): M⁻=421 (C$_{14}$H$_{24}$BrF$_2$O$_5$S⁻= 421.05)

MS (ESI(+) Spectrum): M⁺=263 (C$_{18}$H$_{15}$S⁺=263.09)

Example 2

Hundred grams of acetone, 15.8 g of a copolymer of p-hydroxystyrene and 2-ethyl-2-adamantyl methacrylate wherein molar ratio of the structural units (Structural unit derived from p-hydroxystyrene: Structural unit derived from 2-ethyl-2-adamantyl methacrylate) was 70:30, Mw was 8,369, and Mw/Mn was 1.99, 6.9 g of the compound represented by the formula (i) and 2.1 g of potassium carbonate were mixed and the resultant mixture was heated under reflux for 3 hours. The reaction mixture was cooled and neutralized with 2% aqueous oxalic acid solution followed by extracting with chloroform. The obtained organic layer was washed with ion-exchanged water and then concentrated to obtain 14.3 g of a resin. This resin had the following structural units represented by the formulae (j), (e) and (f). This is called as Resin A2.

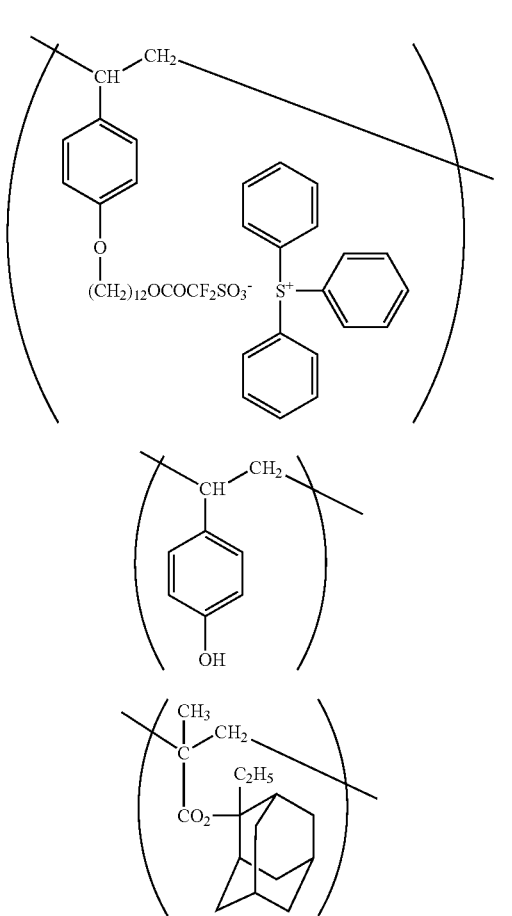

Molar ratio of the structural units in Resin A2 was measured with NMR and the result thereof was as follows: Structural unit represented by the formula (j):Structural unit represented by the formula (e):Structural unit represented by the formula (f)=10:60:30.

Example 3

Fifty grams of acetone, 9.0 g of a copolymer of p-hydroxystyrene and 2-ethyl-2-adamantyl methacrylate wherein molar ratio of the structural units (Structural unit derived from p-hydroxystyrene: Structural unit derived from 2-ethyl-2-adamantyl methacrylate) was 50:50, Mw was 8,837, and Mw/Mn was 1.49, 2.0 g of the compound represented by the formula (i), 0.7 g of potassium carbonate and 0.01 g of triethylamine were mixed and the resultant mixture was heated under reflux for 2 hours. The reaction mixture was cooled and neutralized with 2% aqueous oxalic acid solution followed by extracting with chloroform. The obtained organic layer was washed with ion-exchanged water and then concentrated to obtain 7.5 g of a resin. This resin had the above-mentioned structural units represented by the formulae (j), (e) and (f). This is called as Resin A3.

Molar ratio of the structural units in Resin A3 was measured with NMR and the result thereof was as followed: Structural unit represented by the formula (j):Structural unit represented by the formula (e):Structural unit represented by the formula (f)=5:45:50.

Synthetic Example 3

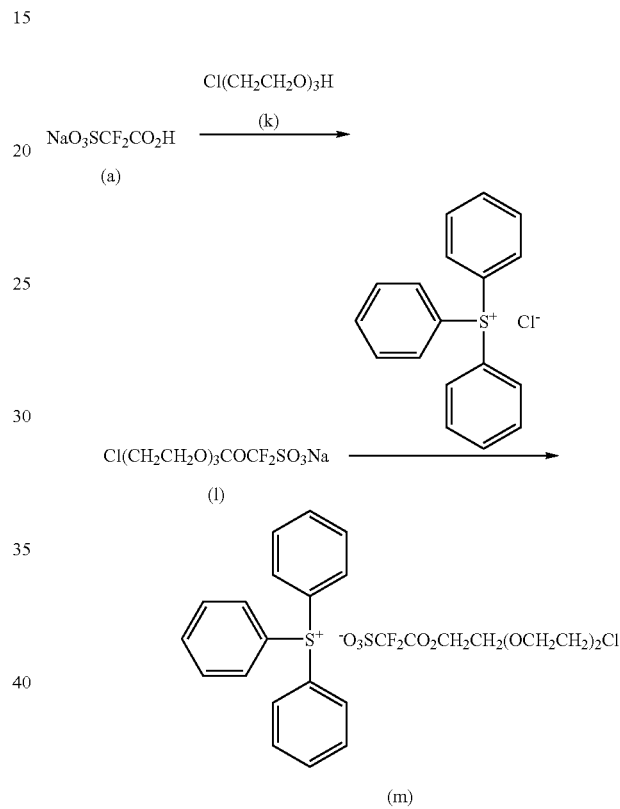

(1) To 50 g of toluene, 10 g of the compound represented by the formula (a) and 7.5 g of the compound represented by the formula (k) were added, and then, a catalytic amount of trifluoromethanesulfonic acid was added to the resultant mixture. The obtained mixture was heated under reflux for 10 hours. The reaction mixture was cooled and concentrated to obtain 17.8 g of the compound represented by the formula (l) quantitatively.

$^1$H-NMR (CDCl$_3$; TMS as internal standard): δ (ppm) 3.88-3.63 (12H)

MS (ESI(−) Spectrum): M$^-$=325 (C$_8$H$_{12}$ClF$_2$O$_7$S$^-$= 325.00)

(2) Seventeen point eight grams of the compound represented by the formula (l) was dissolved in 200 g of chloroform. To the obtained solution, 128.1 g of 13.1% aqueous solution of triphenylsulfonium chloride was added and then, the resultant mixture was stirred at room temperature overnight. The reaction mixture was separated to an organic layer and an aqueous layer. The organic layer was washed with ion-exchanged water and concentrated to obtain 18.0 g of the compound represented by the formula (m). Yield: 59.9%.

$^1$H-NMR (dimethyl sulfoxide-d0 TMS as internal standard): δ (ppm) 7.78-7.65 (m, 15H), 3.79-3.57 (12H)

$^{19}$F-NMR (dimethyl sulfoxide-d$_6$; fluorobenzene as internal standard): δ (ppm) −106.50

MS (ESI(−) Spectrum): M$^−$=325 (C$_8$H$_{12}$ClF$_2$O$_7$S$^−$= 325.00)

MS (ESI(+) Spectrum): M$^+$=263 (C$_{18}$H$_{15}$S$^+$=263.09)

Synthetic Example 4

NaO$_3$SCF$_2$CO$_2$(CH$_2$)$_{12}$Br ⟶

(h)

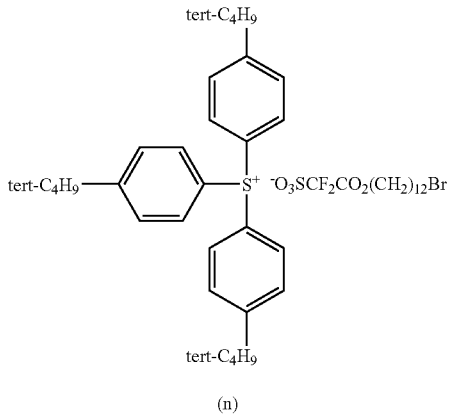

(n)

Twenty grams of the compound represented by the formula (h) was dissolved in 120 g of chloroform. To the obtained solution, 210 g of 10% aqueous solution of tris(4-tert-butylphenyl) sulfonium chloride was added and then, the resultant mixture was stirred at room temperature over night. The reaction mixture was separated to an organic layer and an aqueous layer. The organic layer was washed with ion-exchanged water and concentrated to obtain 33.4 g of the compound represented by the formula (n). Yield: 87.1%.

$^1$H-NMR (CDCl$_3$; TMS as internal standard): δ (ppm) 7.71-7.67 (m, 12H), 4.26 (t, 2H, J=6.9 Hz), 3.41 (t, 2H, J=6.9 Hz), 1.86 (m, 2H), 1.70 (m, 2H), 1.46-1.21 (m, 16H), 1.33 (s, 27H)

$^{19}$F-NMR (dimethyl sulfoxide-d$_6$; fluorobenzene as internal standard): δ (ppm) −106.03

MS (ESI(−) Spectrum): M$^−$=422, 423 (C$_{14}$H$_{24}$BrF$_2$O$_5$S$^−$= 421.05)

MS (ESI(+) Spectrum): M$^+$=431 (C$_{30}$H$_{39}$S$^+$=431.28)

Synthetic Example 5

NaO$_3$SCF$_2$CO$_2$(CH$_2$)$_{12}$Br ⟶

(h)

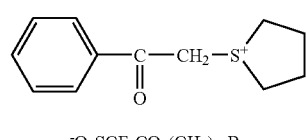

$^−$O$_3$SCF$_2$CO$_2$(CH$_2$)$_{12}$Br (o)

Fifteen grams of the compound represented by the formula (h) was dissolved in 100 g of chloroform. To the obtained solution, 9.7 g of tetrahydro-1-(2-oxo-2-phenylethyl)thiophanium bromide was added and then, the resultant mixture was stirred at room temperature over night. To the reaction mixture, 20 g of ion-exchanged water was added and the resultant mixture was separated to an organic layer and an aqueous layer. The organic layer was washed with ion-exchanged water and concentrated to obtain 12.4 g of the compound represented by the formula (o). Yield: 58.5%.

$^1$H-NMR (CDCl$_3$; TMS as internal standard): δ (ppm) 7.99 (d, 2H, J=6.9 Hz), 7.60 (t, 1H, J=7.7 Hz), 7.45 (t, 2H, J=8.4 Hz), 5.35 (s, 2H), 4.11 (t, 2H, J=6.9 Hz), 2.48-2.43 (m, 4H), 2.30-2.26 (m, 4H), 1.86 (m, 2H), 1.60 (m, 2H), 1.42 (m, 2H), 1.28-1.24 (m, 14H)

$^{19}$F-NMR (dimethyl sulfoxide-d$_6$; fluorobenzene as internal standard): δ (ppm) −106.39

MS (ESI(−) Spectrum): M$^−$=422, 423 (C$_{14}$H$_{24}$BrF$_2$O$_5$S$^−$= 421.05)

MS (ESI(+) Spectrum): M$^+$=207 (C$_{12}$H$_{15}$OS$^+$=207.08)

Synthetic Example 6

NaO$_3$SCF$_2$CO$_2$H $\xrightarrow{\text{BrCH}_2\text{CH}_2\text{OH}}$ (a)

BrCH$_2$CH$_2$OCOCF$_2$SO$_3$Na

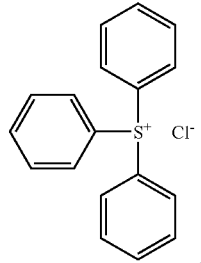

(p)

⟶

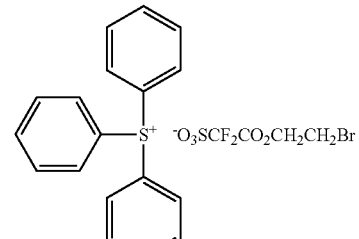

(q)

(1) To 206 mL of toluene, 27.1 g of the compound represented by the formula (a) and 36.8 g of 2-bromoethanol were added, and then, 5.24 g of trifluoromethanesulfonic acid was added to the resultant mixture. The obtained mixture was heated under reflux for 16 hours. The reaction mixture was cooled and the precipitated solids were collected by filtration. The solids were washed with a little amount of toluene and dried to obtain 31.5 g of the compound represented by the formula (p). Yield: 73.8%.

$^1$H-NMR (CDCl$_3$; TMS as internal standard): δ (ppm) 4.558 (t, 2H, J=6.1 Hz), 3.69 (t, 2H, J=6.1 Hz)

$^{13}$C-NMR (CDCl$_3$; CDCl$_3$ as internal standard): δ (ppm) 161.957 (t, J=30.3 Hz), 113.186 (t, J=285.5 Hz), 66.171, 29.752

$^{19}$F-NMR (dimethyl sulfoxide-d$_5$; fluorobenzene as internal standard): δ (ppm) −105.23

MS (ESI(−)  Spectrum): M$^-$=280.9, 282.9 (C$_4$H$_4$BrF$_2$O$_5$S$^-$=280.894)

(2) Thirty one point five grams of the compound represented by the formula (p) was mixed with 300 g of chloroform. To the obtained mixture, 258 g of 12% aqueous solution of triphenylsulfonium chloride was added and then, the resultant mixture was stirred at 25 to 26° C. for 8 hours. The reaction mixture was separated to an organic layer and an aqueous layer. The organic layer was washed with ion-exchanged water and concentrated. The solids were collected by filtration and washed with a little amount of a mixed solvent of hexane and ethyl acetate (hexane/ethyl acetate=4/1) to obtain 41.0 g of the compound represented by the formula (q). Yield: 72.8%.

$^1$H-NMR (CDCl$_3$; TMS as internal standard): δ (ppm) 7.78-7.69 (15H), 4.51 (t, 2H, J=6.1 Hz), 3.51 (t, 2H, J=6.1 Hz)

$^{13}$C-NMR (CDCl$_3$; CDCl$_3$ as internal standard): δ (ppm) 161.961 (t, J=30.3 Hz), 134.348, 131.325, 130.803, 123.983, 113.116 (t, J=286.8 Hz), 65.181, 27.026

$^{19}$F-NMR (dimethyl sulfoxide-d$_6$; fluorobenzene as internal standard): δ (ppm) −106.06

MS (ESI(−)  Spectrum): M$^-$=280.9, 282.9 (C$_4$H$_4$BrF$_2$O$_5$S$^-$= 280.894)

MS (ESI(+) Spectrum): M$^+$=263.0 (C$_{18}$H$_{15}$S$^+$=263.09)

Synthetic Example 7

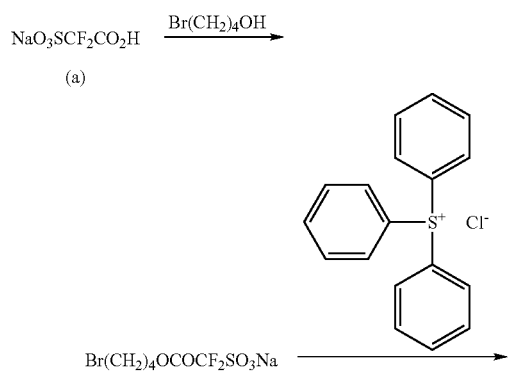

(a)

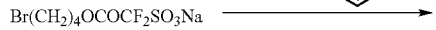

(r)

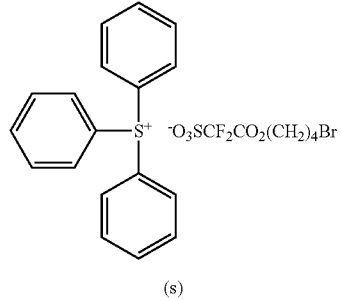

(s)

(1) To 190 mL of toluene, 26.0 g of the compound represented by the formula (a) and 50.0 g of 4-bromobutanol were added, and then, 4.55 g of trifluoromethanesulfonic acid was added to the resultant mixture. The obtained mixture was heated under reflux for 16 hours. The reaction mixture was cooled and the precipitated solids were collected by filtration. The solids were washed with a little amount of toluene and dried to obtain 32.6 g of the compound represented by the formula (r). Yield: 74.8%.

$^1$H-NMR (CDCl$_3$; TMS as internal standard): δ (ppm) 4.26 (t, 2H, J=6.1 Hz), 3.56 (t, 2H, J=6.1 Hz), 1.91 (m, 2H), 1.75 (m, 2H)

$^{13}$C-NMR (CDCl$_3$; CDCl$_3$ as internal standard): δ (ppm) 162.145 (t, J=30.3 Hz), 113.165 (t, J=272.9 Hz), 66.8051, 34.689, 28.685, 26.719

$^{19}$F-NMR (dimethyl sulfoxide-d$_6$; fluorobenzene as internal standard): δ (ppm) −105.42

MS (ESI(−)  Spectrum): M$^-$=308.9, 310.9 (C$_6$H$_8$BrF$_2$O$_5$S$^-$= 308.925)

(2) Thirty two point six grams of the compound represented by the formula (r) was mixed with 300 g of chloroform. To the obtained mixture, 244 g of 12% aqueous solution of triphenylsulfonium chloride was added and then, the resultant mixture was stirred at 25 to 26° C. for 8 hours. The reaction mixture was separated to an organic layer and an aqueous layer. The organic layer was washed with ion-exchanged water and concentrated. The solids were collected by filtration and washed with a little amount of a mixed solvent of hexane and ethyl acetate (hexane/ethyl acetate=4/1) to obtain 52.0 g of the compound represented by the formula (s). Yield: 92.6%.

$^1$H-NMR (CDCl$_3$; TMS as internal standard): δ (ppm) 7.79-7.70 (15H), 4.29 (t, 2H, J=6.2 Hz), 3.40 (t, 2H, J=6.2 Hz), 1.98 (m, 2H), 1.85 (m, 2H)

$^{13}$C-NMR (CDCl$_3$; CDCl$_3$ as internal standard): δ (ppm) 162.306 (t, J=28.9 Hz), 134.303, 131.284, 130.813, 124.004, 113.116 (t, J=286.8 Hz), 65.307, 33.238, 28.333, 26.482

$^{19}$F-NMR (dimethyl sulfoxide-d$_6$; fluorobenzene as internal standard): δ (ppm) −106.11

MS (ESI(−) Spectrum): M=308.9, 310.9 (C$_6$H$_8$BrF$_2$O$_6$S$^-$= 308.925)

MS (ESI(+) Spectrum): M$^+$=263 (C$_{18}$H$_{15}$S$^+$=263.09)

Resin Synthesis Example 1

According to the method described in JP 2003-107708 A, p-hydroxystyrene and 2-ethyl-2-adamantyl methacrylate were polymerized to obtain a resin having the structural units represented by the formulae (e) and (f). This resin is called as Resin B2.

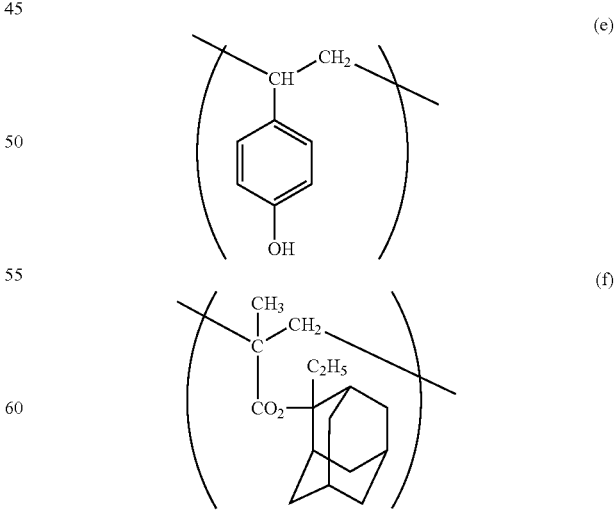

Molar ratio of the structural units in Resin B2 was as followed: Structural unit represented by the formula (e):

Structural unit represented by the formula (f)=80:20. Mw was 8,165 (equivalent to polystyrene), and Mw/Mn was 1.819.

Resin Synthesis Example 2

According to the method described in JP 2003-107708 A, p-hydroxystyrene and 2-ethyl-2-adamantyl methacrylate were polymerized to obtain a resin having the structural units represented by the formulae (e) and (f). This resin is called as Resin B1. Molar ratio of the structural units in Resin B1 was as followed: Structural unit represented by the formula (e): Structural unit represented by the formula (f)=70:30. Mw was 7,345 (equivalent to polystyrene), and Mw/Mn was 1.916.

Resin Synthesis Example 3

According to the method described in JP 2003-107708 A, p-hydroxystyrene and 2-ethyl-2-adamantyl methacrylate were polymerized to obtain a resin having the structural units represented by the formulae (e) and (f). This resin is called as Resin B3. Molar ratio of the structural units in Resin B3 was as followed: Structural unit represented by the formula (e): Structural unit represented by the formula (f)=50:50. Mw was 8,109 (equivalent to polystyrene), and Mw/Mn was 1.919.

Resin Synthesis Example 4

According to the method described in JP 2003-107708 A, p-hydroxystyrene and 2-methyl-2-adamantyloxycarbonylmethyl methacrylate were polymerized to obtain a resin having the structural units represented by the formulae (e) and (t). This resin is called as Resin B4.

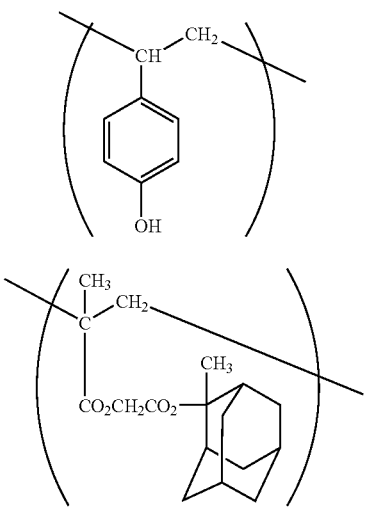

Molar ratio of the structural units in Resin B4 was as followed: Structural unit represented by the formula (e): Structural unit represented by the formula (t)=50:50. Mw was 8,369 (equivalent to polystyrene), and Mw/Mn was 1.990.

Resin Synthesis Example 5

According to the method described in JP 2003-107708 A, p-hydroxystyrene, 2-ethyl-2-adamantyl methacrylate and 3-hydroxy-1-adamantyl methacrylate were polymerized to obtain a resin having the structural units represented by the formulae (e), (f) and (u). This resin is called as Resin B5.

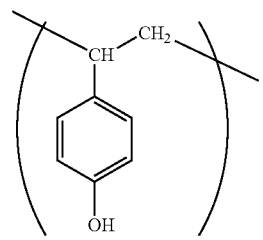

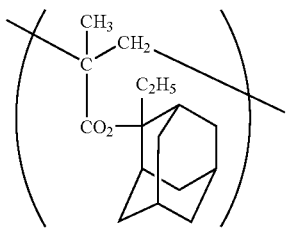

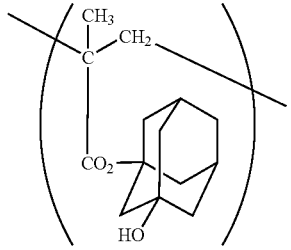

Molar ratio of the structural units in Resin B5 was as followed: Structural unit represented by the formula (e): Structural unit represented by the formula (f):Structural unit represented by the formula (u)=60:30:10. Mw was 9,011 (equivalent to polystyrene), and Mw/Mn was 1.633.

Resin Synthesis Example 6

According to the method described in JP 2003-107708 A, p-hydroxystyrene, 2-ethyl-2-adamantyl methacrylate and 2-methacryloyloxy-γ-butyrolactone were polymerized to obtain a resin having the structural units represented by the formulae (e), (f) and (v). This resin is called as Resin B6.

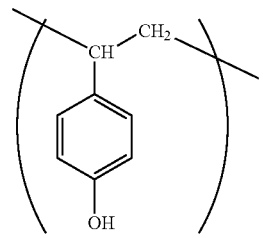

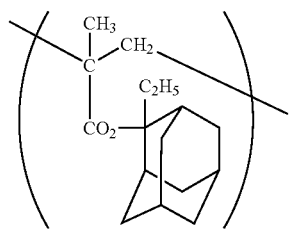

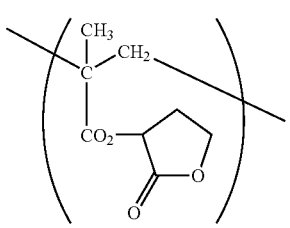
(v)

Molar ratio of the structural units in Resin BE was as followed: Structural unit represented by the formula (e):Structural unit represented by the formula (f):Structural unit represented by the formula (v)=50:30:20. Mw was 8,820 (equivalent to polystyrene), and Mw/Mn was 1.703.

Resin Synthesis Example 7

According to the method described in JP 2003-107708 A, p-hydroxystyrene, 2-ethyl-2-adamantyl methacrylate, 3-hydroxy-1-adamantyl methacrylate and 2-methacryloyloxy-γ-butyrolactone were polymerized to obtain a resin having the structural units represented by the formulae (e), (f), (u) and (v). This resin is called as Resin B7.

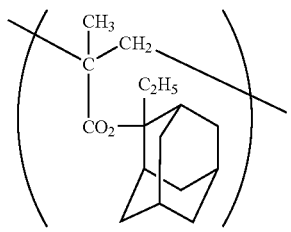
(e)

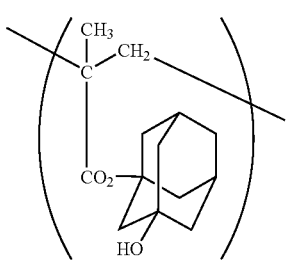
(f)

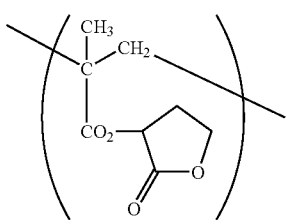
(u)

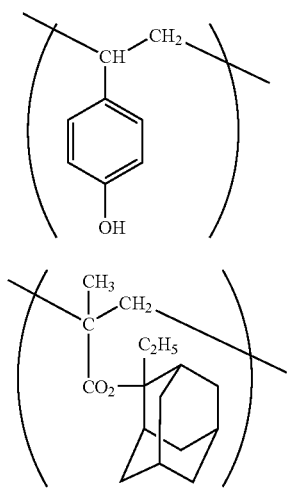
(v)

Molar ratio of the structural units in Resin B7 was as followed: Structural unit represented by the formula (e):Structural unit represented by the formula (f):Structural unit represented by the formula (v):Structural unit represented by the formula (v) was 40:30:10:20. Mw was 9,579 (equivalent to polystyrene), and Mw/Mn was 1.807.

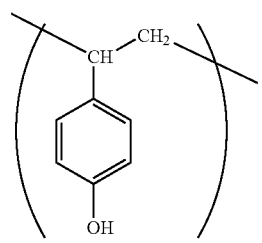
(e)

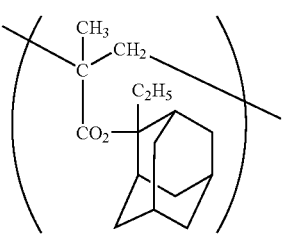
(f)

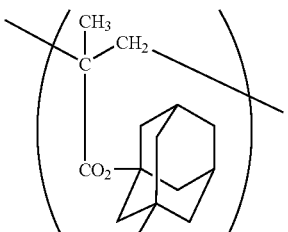
(u)

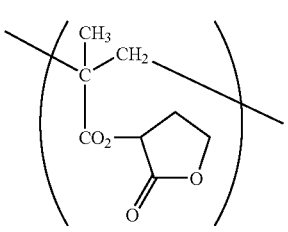
(v)

Example 4

Hundred grams of acetone, 14.8 g of resin B4, 3.0 g of the compound represented by the formula (i), 1.0 g of potassium carbonate and 0.01 g of triethylamine were mixed and the resultant mixture was heated under reflux for 2 hours. The reaction mixture was cooled and neutralized with 1% aqueous oxalic acid solution followed by extracting with chloroform. The obtained organic layer was washed with ion-exchanged water and then concentrated to obtain 14.2 g of a resin. This resin had the above-mentioned structural units represented by the formulae (j), (e) and (t). This is called as Resin A4.

Molar ratio of the structural units in Resin A4 was measured with NMR and the result thereof was as followed: Structural unit represented by the formula (j):Structural unit represented by the formula (e):Structural unit represented by the formula (t)=5:45:50.

Example 5

Fifty grams of anhydrous N,N-dimethylformamide, 4.6 g of resin B5, 1.7 g of the compound represented by the formula (q), 0.65 g of potassium carbonate and 0.01 g of pyridine were mixed and the resultant mixture was stirred at room temperature overnight. The reaction mixture was neutralized with 1% aqueous oxalic acid solution followed by extracting with chloroform. The obtained organic layer was washed with ion-exchanged water and then concentrated to obtain 3.5 g of a resin. This resin had the above-mentioned structural units represented by the formulae (e), (f) and (u) and the structural unit represented by the following formula (w). This is called as Resin A5.

(w)

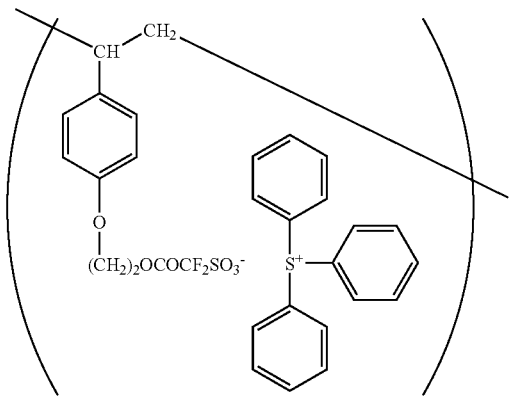

Molar ratio of the structural units in Resin A5 was measured with NMR and the result thereof was as followed: Structural unit represented by the formula (e):Structural unit represented by the formula (f):Structural unit represented by the formula (u):Structural unit represented by the formula (w) 55:30:10:5.

Example 6

Fifty grams of anhydrous acetonitrile, 1.0 g of VP2500, which is a homopolymer of p-hydroxystyrene, which was manufactured by Nippon Soda Co., Ltd. and which is called as Resin B8, 5.5 g of the compound represented by the formula (s), 4.0 g of potassium carbonate and 0.01 g of triethylamine were mixed and the resultant mixture was heated for 2 hours under reflux. The reaction mixture was cooled and neutralized with 1% aqueous oxalic acid solution followed by extracting with chloroform. The obtained organic layer was washed with ion-exchanged water and then concentrated to obtain 4.0 g of a resin. This resin had the structural unit represented by the following formula (x). This is called as Resin A6.

(x)

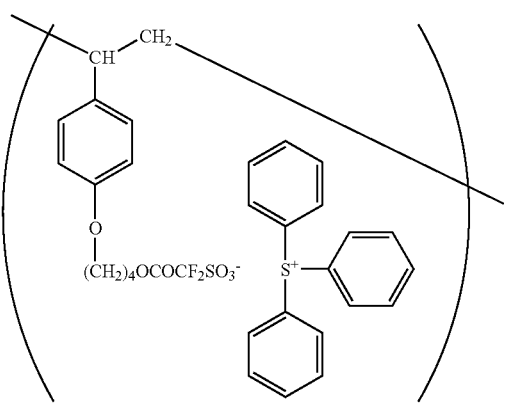

Example 7

Twenty grams of anhydrous tetrahydrofuran, 3.0 g of Resin B7, 0.8 g of the compound represented by the formula (q) and 0.3 g of triethylamine were mixed and the resultant mixture was heated for 3 hours under reflux. The reaction mixture was cooled and neutralized with 1% aqueous oxalic acid solution followed by extracting with chloroform. The obtained organic layer was washed with ion-exchanged water and then concentrated. The obtained oily matters were diluted with 100 g of hexane and the precipitates were collected by filtration. The precipitates were washed and dried to obtain 14.2 g of a resin. This resin had the above-mentioned structural units represented by the formulae (e), (f), (u), (v) and (w). This is called as Resin A7.

Molar ratio of the structural units in Resin A7 was measured with NMR and the result thereof was as followed: Structural unit represented by the formula (e):Structural unit represented by the formula (f):Structural unit represented by the formula (u):Structural unit represented by the formula (v):Structural unit represented by the formula (w) 32:30:10:20:8.

Example 8

Ten grams of anhydrous N,N-dimethyl formamide, 23.2 g of a solution prepared by mixing Resin 33 and propylene glycol monomethyl ether acetate (content of Resin B3: 31.28%), 2.4 g of the compound represented by the formula (s), 0.9 g of potassium carbonate and 0.01 g of triethylamine were mixed and the resultant mixture was stirred at 24 to 25° C. for 7.5 hours. The reaction mixture was neutralized with 1% aqueous oxalic acid solution followed by extracting with chloroform. The obtained organic layer was washed with ion-exchanged water and then concentrated. The obtained oily matters were diluted with 100 g of hexane and the precipitates were collected by filtration. The precipitates were washed with a little amount of hexane and dried to obtain 9.3 g of a resin. This resin had the above-mentioned structural units represented by the formulae (e), (f) and (x). This is called as Resin A8.

Molar ratio of the structural units in Resin A8 was measured with NMR and the result thereof was as followed: Structural unit represented by the formula (e):Structural unit represented by the formula (f):Structural unit represented by the formula (x)=45:50:5.

Example 9

Thirty grams of anhydrous N,N-dimethylformamide, 3.9 g of Resin B2, 5.0 g of the compound represented by the formula (o), 0.5 g of potassium carbonate and 0.01 g of triethylamine were mixed and the resultant mixture was stirred at 24 to 25° C. for 7 hours. The reaction mixture was neutralized with 1% aqueous oxalic acid solution followed by extracting with chloroform. The obtained organic layer was washed with ion-exchanged water and then concentrated. The obtained oily matters were diluted with 100 g of hexane and the precipitates were collected by filtration. The precipitates were washed with a little amount of hexane and dried to obtain 5.3 g of a resin. This resin had the structural units represented by the formulae (e), (f) and (y). This is called as Resin A9.

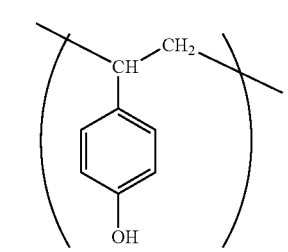
(e)

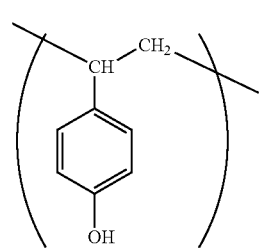
(e)

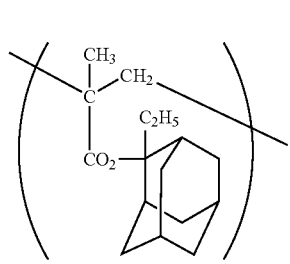
(f)

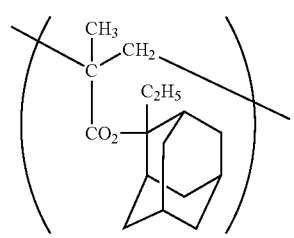
(f)

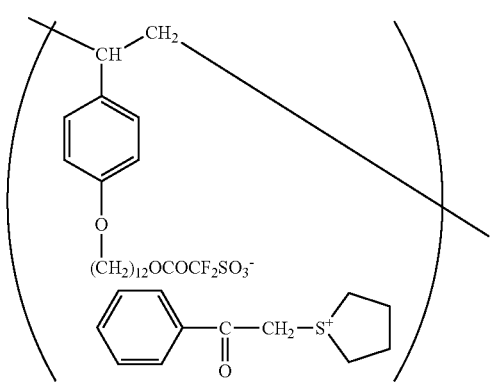
(y)

(z)

Molar ratio of the structural units in Resin A9 was measured with NMR and the result thereof was as followed: Structural unit represented by the formula (e):Structural unit represented by the formula (f):Structural unit represented by the formula (y)=50:30:20.

Example 10

Thirty grams of anhydrous N,N-dimethylformamide, 3.45 g of Resin B2, 10.0 g of the compound represented by the formula (n), 1.2 g of potassium carbonate and 0.01 g of triethylamine were mixed and the resultant mixture was stirred at 24 to 25° C. for 8 hours. The reaction mixture was neutralized with 1% aqueous oxalic acid solution followed by extracting with chloroform. The obtained organic layer was washed with ion-exchanged water and then concentrated. The obtained oily matters were diluted with 100 g of hexane and the precipitates were collected by filtration. The precipitates were washed with a little amount of hexane and dried to obtain 8.8 g of a resin. This resin had the structural units represented by the formulae (e), (f) and (z). This is called as Resin A10.

Molar ratio of the structural units in Resin A10 was measured with NMR and the result thereof was as followed: Structural unit represented by the formula (e):Structural unit represented by the formula (f):Structural unit represented by the formula (z)=35:30:35.

Example 11

Twenty grams of anhydrous N,N-dimethylformamide, 1.5 g of Resin B6, 1.1 g of the compound represented by the formula (s), 0.4 g of potassium carbonate and 0.01 g of triethylamine were mixed and the resultant mixture was stirred at 24 to 25° C. for 8 hours. The reaction mixture was neutralized with 1% aqueous oxalic acid solution followed by extracting with chloroform. The obtained organic layer was washed with ion-exchanged water and then concentrated. The obtained oily matters were diluted with 100 g of hexane and the precipitates were collected by filtration. The precipitates were washed with a little amount of hexane and dried to obtain 1.9 g of a resin. This resin had the structural units represented by the formulae (e), (f), (V) and (x). This is called as Resin A11.

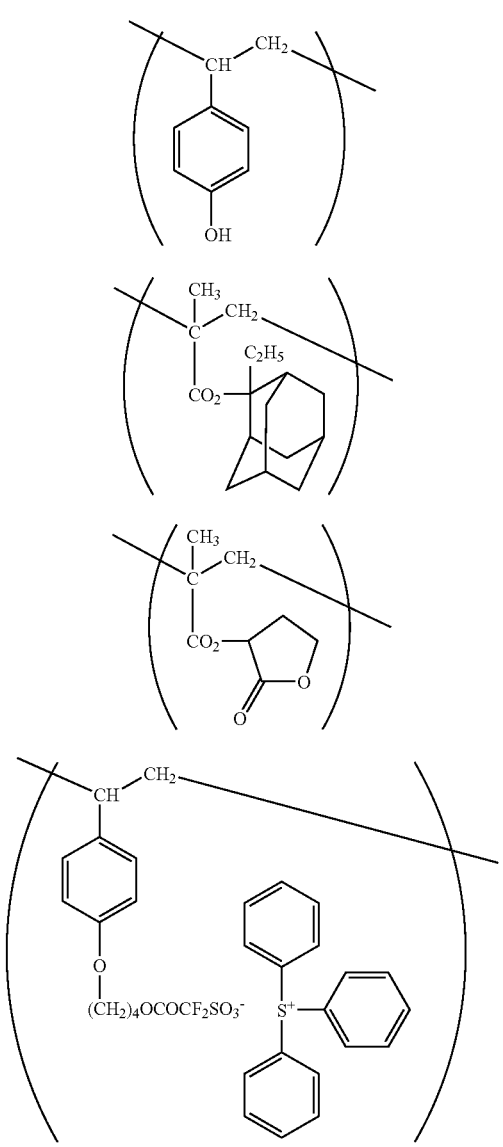

Molar ratio of the structural units in Resin A11 was measured with NMR and the result thereof was as followed: Structural unit represented by the formula (e):Structural unit represented by the formula (f):Structural unit represented by the formula (v):Structural unit represented by the formula (x)=30:30:20:20.

Examples 12 to 20

<The Resin>
Resin A1, Resin A2, Resin A3, Resin A4
Resin B1, Resin B4
<Quencher>
Q1: 2,6-diisopropylaniline
Q2: tetrabutylammonium hydroxide
<Solvent>

| S1: | propylene glycol monomethyl ether | 450 parts |
| | propylene glycol monomethyl ether acetate | 40 parts |
| | γ-butyrolactone | 5 parts |
| S2: | propylene glycol monomethyl ether | 420 parts |
| | propylene glycol monomethyl ether acetate | 60 parts |

The following components were mixed and dissolved, further, filtrated through a fluorine resin filter having pore diameter of 0.2 μm, to prepare resist composition.

The resin (kind and amount are described in Table 1)
Quencher (kind and amount are described in Table 1)
Solvent (kind is described in Table 1)

TABLE 1

| Ex. No. | Resist Composition | The resin (kind/amount (part)) | Quencher (kind/amount (part)) | Solvent |
|---|---|---|---|---|
| Ex. 12 | Composition 1 | A1/7.5 B1/2.5 | Q1/0.05 Q2/0.01 | S1 |
| Ex. 13 | Composition 2 | A1/5.0 B1/5.0 | Q1/0.05 Q2/0.01 | S1 |
| Ex. 14 | Composition 3 | A2/5.0 B1/5.0 | Q1/0.075 Q2/0.005 | S2 |
| Ex. 15 | Composition 4 | A2/3.0 B1/7.0 | Q1/0.075 Q2/0.005 | S2 |
| Ex. 16 | Composition 5 | A3/10.0 | Q1/0.075 Q2/0.005 | S2 |
| Ex. 17 | Composition 6 | A3/7.5 B1/2.5 | Q1/0.075 Q2/0.005 | S2 |
| Ex. 18 | Composition 7 | A3/5.0 B1/5.0 | Q1/0.075 Q2/0.005 | S2 |
| Ex. 19 | Composition 8 | A4/10.0 | Q1/0.075 Q2/0.005 | S2 |
| Ex. 20 | Composition 9 | A4/7.5 B4/2.5 | Q1/0.075 Q2/0.005 | S2 |

Silicon wafers were each contacted with hexamethyldisilazane at 90° C. for 60 seconds on a direct hotplate. Each of the resist compositions prepared as above was spin-coated over the wafers so that the thickness of the resulting film became 0.06 μm after drying. The silicon wafers thus coated with the respective resist compositions were each prebaked on a direct hotplate at a temperature shown in column of "PB" of Table 2 for 60 seconds. Using a writing electron beam lithography system ("HL-800D" manufactured by Hitachi, Ltd., 50 KeV), each wafer on which the respective resist film had been thus formed was exposed to a line and space pattern, while changing stepwise the exposure quantity.

After the exposure, each wafer was subjected to post-exposure baking on a hotplate at a temperature shown in column of "PEB" of Table 2 for 60 seconds and then to paddle development for 60 seconds with an aqueous solution of 2.38 wt % tetramethylammonium hydroxide.

Each of a resist pattern developed on the organic anti-reflective coating substrate after the development was observed with a scanning electron microscope, the results of which are shown in Table 2.

Effective Sensitivity (ES): It was expressed as the amount of exposure that the line pattern and the space pattern become 1:1 after exposure through 0.08 μm line and space pattern mask and development.

Resolution: It is expressed as the minimum size of space pattern which gave the space pattern split by the line pattern at the exposure amount of the effective sensitivity.

TABLE 2

| Ex. No. | Resist Composition | PB (° C.) | PEB (° C.) | ES (µC) | Resolution (nm) |
|---|---|---|---|---|---|
| Ex. 12 | Composition 1 | 110 | 110 | 5.4 | 70 |
| Ex. 13 | Composition 2 | 110 | 105 | 20 | 60 |
| Ex. 14 | Composition 3 | 100 | 100 | 18 | 60 |
| Ex. 15 | Composition 4 | 100 | 100 | 44 | 60 |
| Ex. 16 | Composition 5 | 100 | 100 | 12 | 60 |
| Ex. 17 | Composition 6 | 100 | 100 | 46 | 60 |
| Ex. 18 | Composition 7 | 100 | 100 | 84 | 50 |
| Ex. 19 | Composition 8 | 100 | 100 | 22 | 60 |
| Ex. 20 | Composition 9 | 100 | 100 | 34 | 60 |

Examples 21 to 27

\<The Resin\>
Resin A5, Resin A7, Resin A8
Resin B1
\<Acid Generator\>
P1: triphenylsulfonium (4-oxo-1-adamantyloxy)carbonyldifluoromethanesulfonate
\<Quencher\>
Q1: 2,6-diisopropylaniline
Q3: tris[2-(2-methoxyethoxy)ethyl]amine
\<Solvent\>

| | |
|---|---|
| S3: propylene glycol monomethyl ether | 450 parts |
| propylene glycol monomethyl ether acetate | 150 parts |
| γ-butyrolactone | 5 parts |

The following components were mixed and dissolved, further, filtrated through a fluorine resin filter having pore diameter of 0.2 µm, to prepare resist composition.
The resin (kind and amount are described in Table 3)
Acid generator (kind and amount are described in Table 3)
Quencher (kind and amount are described in Table 3)
Solvent (kind is described in Table 3)

TABLE 3

| Ex. No. | Resist Composition | The resin (kind/amount (part)) | Acid generator (kind/amount (part)) | Quencher (kind/amount (part)) | Solvent |
|---|---|---|---|---|---|
| Ex. 21 | Composition 10 | A5/10.0 | None | None | S3 |
| Ex. 22 | Composition 11 | A7/10.0 | None | Q1/0.075 | S3 |
| Ex. 23 | Composition 12 | A8/10.0 | None | Q1/0.075 | S3 |
| Ex. 24 | Composition 13 | A8/10.0 | P1/0.75 | Q1/0.075 | S3 |
| Ex. 25 | Composition 14 | A8/10.0 | P1/0.75 | Q1/0.05 Q3/0.05 | S3 |
| Ex. 26 | Composition 15 | A5/5.0 A8/5.0 | None | Q1/0.03 | S3 |
| Ex. 27 | Composition 16 | A5/5.0 B1/5.0 | P1/0.75 | Q1/0.03 | S3 |

Silicon wafers were each coated with "DUV-42", which is an organic anti-reflective coating composition available from Nissan Chemical Industries, Ltd., and then baked under the conditions: 215° C., 60 seconds, to form a 600 Å-thick organic anti-reflective coating. Each of the resist compositions prepared as above was spin-coated over the anti-reflective coating so that the thickness of the resulting film became 0.06 µm after drying. The silicon wafers thus coated with the respective resist compositions were each prebaked on a direct hotplate at 100° C. for 60 seconds. Using a KrF excimer stepper ("NSR-2205EX12B" manufactured by CANON INC., NA=0.55), each wafer on which the respective resist film had been thus formed was exposed to a line and space pattern, while changing stepwise the exposure quantity.

After the exposure, each wafer was subjected to post-exposure baking on a hotplate at 100° C. for 60 seconds and then to paddle development for 60 seconds with an aqueous solution of 2.38 wt % tetramethylammonium hydroxide.

Each of a resist pattern developed on the organic anti-reflective coating substrate after the development was observed with a scanning electron microscope, the results of which are shown in Table 4.

Effective Sensitivity (ES): It was expressed as the amount of exposure that the line pattern and the space pattern become 1:1 after exposure through 0.2 µm line and space pattern mask and development.

Resolution: It is expressed as the minimum size of space pattern which gave the space pattern split by the line pattern at the exposure amount of the effective sensitivity.

TABLE 4

| Ex. No. | Resist Composition | ES (mJ/cm$^2$) | Resolution (nm) |
|---|---|---|---|
| Ex. 21 | Composition 10 | 49 | 160 |
| Ex. 22 | Composition 11 | 34 | 160 |
| Ex. 23 | Composition 12 | 28 | 170 |
| Ex. 24 | Composition 13 | 17 | 170 |
| Ex. 25 | Composition 14 | 15 | 170 |
| Ex. 26 | Composition 15 | 23 | 170 |
| Ex. 27 | Composition 16 | 25 | 170 |

Example 28

A resist composition, which is called as Composition 17, can be obtained according to the same manner as that described in Example 12 except that Resin A4 is used in place of Resin A1. A resist pattern can be obtained according to the same manner as that described in Example 12 except that Composition 17 is used in place of Composition 1.

Example 29

A resist composition, which is called as Composition 18, can be obtained according to the same manner as that described in Example 12 except that Resin A6 is used in place of Resin A1. A resist pattern can be obtained according to the same manner as that described in Example 12 except that Composition 18 is used in place of Composition 1.

Example 30

A resist composition, which is called as Composition 19, can be obtained according to the same manner as that described in Example 12 except that Resin A9 is used in place of Resin A1. A resist pattern can be obtained according to the same manner as that described in Example 12 except that Composition 19 is used in place of Composition 1.

Example 31

A resist composition, which is called as Composition 20, can be obtained according to the same manner as that described in Example 12 except that Resin A10 is used in place of Resin A1. A resist pattern can be obtained according to the same manner as that described in Example 12 except that Composition 20 is used in place of Composition 1.

Example 32

A resist composition, which is called as Composition 21, can be obtained according to the same manner as that described in Example 12 except that Resin A11 is used in place of Resin A1. A resist pattern can be obtained according to the same manner as that described in Example 12 except that Composition 21 is used in place of Composition 1.

The present resin is a novel resin and a composition comprising the same provides good resist pattern in sensitivity and resolution, and is especially suitable for KrF eximer laser lithography, extreme ultraviolet (EUV) lithography, X-ray lithography and electron beam lithography.

What is claimed is:

1. A resin comprising a structural unit represented by the formula (I):

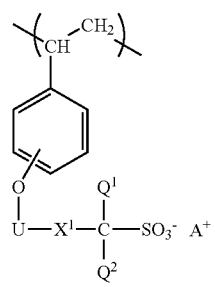

(I)

wherein $Q^1$ and $Q^2$ each independently represent a fluorine atom or a C1-C6 perfluoroalkyl group, U represents a C1-C20 divalent hydrocarbon group in which one or more —$CH_2$— may be replaced by —O—, —NH—, —S—, —$NR^c$—, —CO— or —CO—O—, $R^c$ represents a C1-C6 alkyl group, $X^1$ represents —O—CO—, —CO—O—, —CO—$OCH_2$—, —$CH_2$—O—CO—, —O—$CH_2$—, —$CH_2$—O—, —$NR^d$—CO— or —CO—$NR^d$—, $R^d$ represents a hydrogen atom or a C1-C6 alkyl group, and $A^+$ represents an organic counter ion.

2. The resin according to claim 1, wherein the structural unit represented by the formula (I) is a structural unit represented by the formula (I'):

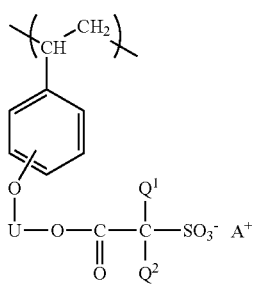

(I')

wherein $Q^1$, $Q^2$, U and $A^+$ are the same meanings as defined in claim 1.

3. The resin according to claim 1, wherein $Q^1$ and $Q^2$ are fluorine atoms.

4. The resin according to claim 1, wherein $A^+$ is a cation represented by the formula (IIIa):

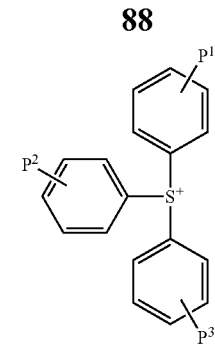

(IIIa)

wherein $P^1$, $P^2$ and $P^3$ each independently represent a hydrogen atom, a halogen atom, a hydroxyl group, a cyano group, a C1-C12 alkyl group or a C1-C12 alkoxy group, a cation represented by the formula (IIIb):

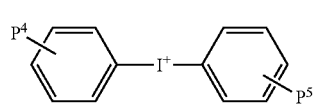

(IIIb)

wherein $P^4$ and $P^5$ each independently represent a hydrogen atom, a halogen atom, a hydroxyl group, a cyano group, a C1-C12 alkyl group or a C1-C12 alkoxy group, or a cation represented by the formula (IIIc):

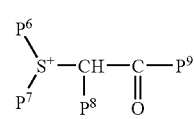

(IIIc)

wherein $P^6$ and $P^7$ each independently represent a C1-C12 alkyl group or a C3-C12 cycloalkyl group, or $P^6$ and $P^7$ are bonded to form a C3-C12 divalent acyclic hydrocarbon group which forms a ring together with the adjacent $S^+$, $P^8$ represents a hydrogen atom, $P^9$ represents a C1-C12 alkyl group, a C3-C12 cycloalkyl group or a C6-C10 aromatic group which may have one or more substituents, or $P^8$ and $P^9$ are bonded to form a C3-C12 divalent acyclic hydrocarbon group which forms a 2-oxocycloalkyl group together with the adjacent —CHCO—, and one or more —$CH_2$— in the C3-C12 divalent acyclic hydrocarbon group may be replaced by —CO—, —O— or —S—.

5. The resin according to claim 1, wherein the resin contains a structural unit represented by the formula (II):

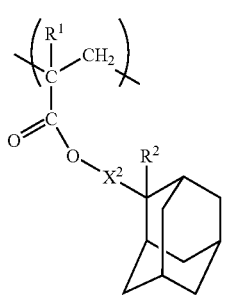

(II)

wherein $R^1$ represents a hydrogen atom or a methyl group, $R^2$ represents a C1-C6 alkyl group, $X^2$ represents a single bond or —$(CH_2)_k$—CO—O—, and k represents an integer of 1 to 6, in addition to the structural unit represented by the formula (I).

6. The resin according to claim 5, wherein the structural unit represented by the formula (II) is a structural unit represented by the formula (II'):

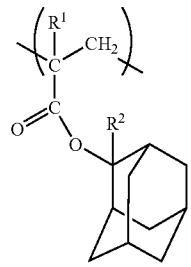
(II')

wherein $R^1$ and $R^2$ are the same meanings as defined in claim 5.

7. The resin according to claim 1, wherein the resin contains a structural unit represented by the formula (VI):

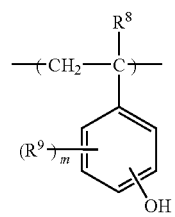
(VI)

wherein $R^8$ represents a hydrogen atom or a C1-C6 alkyl group which may have one or more halogen atoms, $R^9$ is independently in each occurrence a halogen atom, a hydroxyl group, a cyano group, a C1-C12 alkyl group, a C1-C12 hydroxyl-substituted alkyl group, a C1-C12 alkoxy group, a C6-C12 aryl group, a C7-C12 aralkyl group, a glycidyloxy group, a C2-C4 acyl group, a C2-C4 acyloxy group, an acryloyloxy group or a methacryloyloxy group, m represents an integer of 0 to 4, in addition to the structural unit represented by the formula (I).

8. The resin according to claim 1, wherein the resin contains a structural unit represented by the formula (VII):

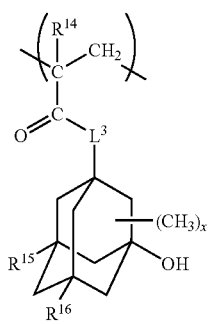
(VII)

wherein $R^{14}$ represents a hydrogen atom or a methyl group, $R^{15}$ and $R^{16}$ each independently represents a hydrogen atom, a methyl group or a hydroxyl group, $L^3$ represents —O— or —O—$(CH_2)_y$—CO—O—, y represents an integer of 1 to 6, and x represents an integer of 0 to 10, in addition to the structural unit represented by the formula (I).

9. The resin according to claim 1, wherein the resin contains a structural unit represented by the formula (VIII-1), (VIII-2) or (VIII-3):

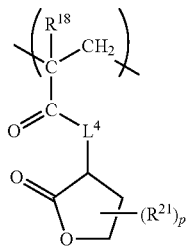
(VIII-1)

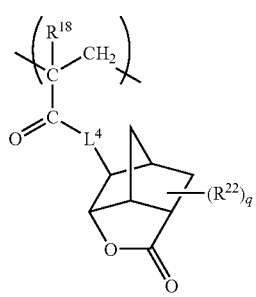
(VIII-2)

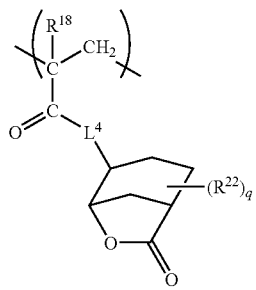
(VIII-3)

wherein $R^{18}$ represents a hydrogen atom or a methyl group, $R^{21}$ is independently in each occurrence a C1-C4 aliphatic hydrocarbon group, $L^4$ represents —O— or —O—$(CH_2)_z$—CO—O—, z represents an integer of 1 to 6, $R^{22}$ is independently in each occurrence a carboxyl group, a cyano group, or a C1-C4 aliphatic hydrocarbon group, p represents an integer of 0 to 5, and q represents an integer of 0 to 3, in addition to the structural unit represented by the formula (I).

10. A chemically amplified resist composition comprising the resin according to claim 1 and a solvent.

11. The chemically amplified resist composition according to claim 10, wherein the composition further contains an acid generator.

12. The chemically amplified resist composition according to claim 10, wherein the composition further contains a the resin comprising a structural unit having an acid-labile group and being insoluble or poorly soluble in an aqueous alkali solution but becoming soluble in an aqueous alkali solution by the action of an acid.

13. A process for producing a resist pattern comprising the following steps (1) to (5):
Step (1): a step of coating a chemically amplified resist composition according to claim 10 on the substrate to obtain a resist film,
Step (2): a step of prebaking the resist film,
Step (3): a step of exposing the prebaked resist film,
Step (4): a step of conducting a post-exposure baking of the exposed resist film,
Step (5): a step of developing the resist film with an aqueous solution to obtain a resist pattern.

14. A process for producing a resin comprising a structural unit represented by the formula (I):

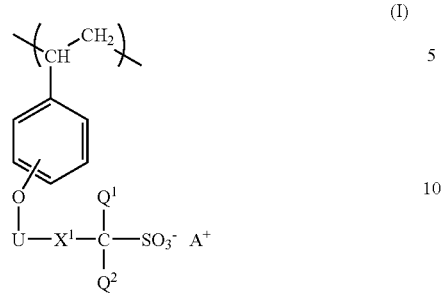 (I)

wherein $Q^1$ and $Q^2$ each independently represent a fluorine atom or a C1-C6 perfluoroalkyl group, U represents a C1-C20 divalent hydrocarbon group in which one or more —CH$_2$— may be replaced by —O—, —NH—, —S—, —NR$^c$—, —CO— or —CO—O—, R$^c$ represents a C1-C6 alkyl group, X$^1$ represents —O—CO—, —CO—O—, —CO—OCH$_2$—, —O—CH$_2$— or —NR$^d$—CO—, R$^d$ represents a hydrogen atom or a C1-C6 alkyl group, and A$^+$ represents an organic counter ion, which comprises reacting a the resin comprising a structural unit represented by the formula (IV):

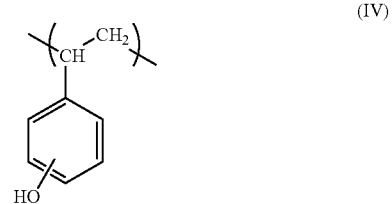 (IV)

with a salt represented by the formula (V):

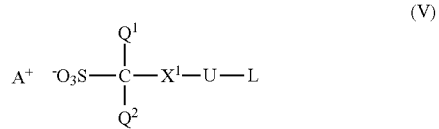 (V)

wherein $Q^1$, $Q^2$, $X^1$, U and A$^+$ are the same meanings as defined above, and L represents a halogen atom, a C1-C12 alkylsulfonyloxy group, a C6-C12 arylsulfonyloxy group or a C5-C12 heteroarylsulfonyloxy group.

* * * * *